United States Patent
Romero et al.

(10) Patent No.: US 11,594,862 B2
(45) Date of Patent: Feb. 28, 2023

(54) FIBER DELIVERED LASER INDUCED WHITE LIGHT SYSTEM

(71) Applicant: KYOCERA SLD Laser, Inc., Goleta, CA (US)

(72) Inventors: Oscar Romero, Tucson, AZ (US); Jim Harrison, Tucson, AZ (US); Eric Goutain, Fremont, CA (US); James W. Raring, Santa Barbara, CA (US); Paul Rudy, Manhattan Beach, CA (US); Daming Liu, Tucson, AZ (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

(21) Appl. No.: 17/563,986

(22) Filed: Dec. 28, 2021

(65) Prior Publication Data
US 2022/0123528 A1    Apr. 21, 2022

Related U.S. Application Data

(63) Continuation of application No. 16/230,158, filed on Dec. 21, 2018, now Pat. No. 11,239,637.

(51) Int. Cl.
F21S 41/176 (2018.01)
F21S 41/16 (2018.01)
(Continued)

(52) U.S. Cl.
CPC ............ H01S 5/4012 (2013.01); F21S 41/16 (2018.01); F21S 41/176 (2018.01); F21S 41/24 (2018.01);
(Continued)

(58) Field of Classification Search
CPC ..... F21Y 2115/30; F21S 41/16; F21S 41/176; F21S 41/24; F21S 43/237; F21S 43/251;
(Continued)

(56) References Cited

U.S. PATENT DOCUMENTS

| 1,655,371 A | 1/1928 | Keay |
| 3,829,675 A | 8/1974 | Mariani |

(Continued)

FOREIGN PATENT DOCUMENTS

| CN | 1171692 A | 1/1998 |
| CN | 1452254 A | 10/2003 |

(Continued)

OTHER PUBLICATIONS

"Collimate", Definition of Collimate by Merriam-Webster, Available Online At: https://www.merriamwebster.com/dictionary/collimate, Feb. 10, 2021, 4 pages.

(Continued)

*Primary Examiner* — William J Carter
(74) *Attorney, Agent, or Firm* — Kilpatrick Townsend & Stockton LLP

(57) ABSTRACT

The present disclosure provides an apparatus for generating fiber delivered laser-induced white light. The apparatus includes a package case enclosing a board member with an electrical connector through a cover member and a laser module configured to the board member inside the package case. The laser module comprises a support member, at least one laser diode device configured to emit a laser light of a first wavelength, a set of optics to guide the laser light towards an output port. Additionally, the apparatus includes a fiber assembly configured to receive the laser light from the output port for further delivering to a light head member disposed in a remote destination. A phosphor material disposed in the light head member receives the laser light exited from the fiber assembly to induce a phosphor emission of a second wavelength for producing a white light emission substantially reflected therefrom for various applications.

14 Claims, 20 Drawing Sheets

(51) Int. Cl.

| | | |
|---|---|---|
| *F21S 41/24* | (2018.01) | |
| *F21Y 115/30* | (2016.01) | |
| *H01S 5/40* | (2006.01) | |
| *H01S 5/042* | (2006.01) | |
| *H01S 5/323* | (2006.01) | |
| *H01S 5/02251* | (2021.01) | |
| *H01S 5/02253* | (2021.01) | |
| *H01S 5/02326* | (2021.01) | |
| *H01S 5/00* | (2006.01) | |

(52) U.S. Cl.
CPC ........ *H01S 5/0087* (2021.01); *H01S 5/02251* (2021.01); *H01S 5/02253* (2021.01); *H01S 5/02326* (2021.01); *H01S 5/042* (2013.01); *H01S 5/32341* (2013.01); *H01S 5/4025* (2013.01); *F21Y 2115/30* (2016.08)

(58) Field of Classification Search
CPC . G02B 6/0006; G02B 6/0008; G02B 23/2469
See application file for complete search history.

(56) References Cited

U.S. PATENT DOCUMENTS

| | | | |
|---|---|---|---|
| 4,152,752 A | 5/1979 | Niemi | |
| 4,234,907 A | 11/1980 | Daniel | |
| 4,318,058 A | 3/1982 | Mito et al. | |
| 4,341,592 A | 7/1982 | Shortes et al. | |
| 4,523,806 A | 6/1985 | Kojima et al. | |
| 4,535,394 A | 8/1985 | Dugre | |
| 4,747,648 A * | 5/1988 | Gilliland, III | G02B 6/08 385/115 |
| 4,763,975 A | 8/1988 | Scifres et al. | |
| 4,772,093 A | 9/1988 | Abele et al. | |
| 4,777,571 A | 10/1988 | Morgan | |
| 4,860,687 A | 8/1989 | Frijlink | |
| 4,878,161 A | 10/1989 | Nakata | |
| 4,911,102 A | 3/1990 | Manabe et al. | |
| 4,915,745 A | 4/1990 | Pollock et al. | |
| 5,184,882 A | 2/1993 | Davenport et al. | |
| 5,208,307 A | 5/1993 | Doi et al. | |
| 5,297,227 A | 3/1994 | Brown et al. | |
| 5,301,090 A * | 4/1994 | Hed | G02B 6/001 362/558 |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Iida et al. | |
| 5,535,230 A | 7/1996 | Abe | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,724,464 A | 3/1998 | Kozuka | |
| 5,760,484 A | 6/1998 | Lee et al. | |
| 5,821,555 A | 10/1998 | Saito et al. | |
| 5,888,907 A | 3/1999 | Tomoyasu et al. | |
| 5,890,796 A | 4/1999 | Marinelli et al. | |
| 5,901,267 A | 5/1999 | Lee | |
| 5,926,493 A | 7/1999 | O'Brien et al. | |
| 5,951,923 A | 9/1999 | Horie et al. | |
| 5,982,969 A | 11/1999 | Sugiyama et al. | |
| 6,065,882 A | 5/2000 | Roller et al. | |
| 6,069,394 A | 5/2000 | Hashimoto et al. | |
| 6,072,197 A | 6/2000 | Horino et al. | |
| 6,072,924 A | 6/2000 | Sato et al. | |
| 6,129,900 A | 10/2000 | Satoh et al. | |
| 6,147,953 A | 11/2000 | Duncan | |
| 6,150,943 A | 11/2000 | Lehman et al. | |
| 6,153,010 A | 11/2000 | Kiyoku et al. | |
| 6,188,495 B1 | 2/2001 | Inoue et al. | |
| 6,195,381 B1 | 2/2001 | Botez et al. | |
| 6,234,640 B1 | 5/2001 | Belfer | |
| 6,239,454 B1 | 5/2001 | Glew et al. | |
| 6,273,948 B1 | 8/2001 | Porowski et al. | |
| 6,283,597 B1 | 9/2001 | Jorke | |
| 6,296,383 B1 | 10/2001 | Henningsen | |
| 6,303,405 B1 | 10/2001 | Yoshida et al. | |
| 6,335,923 B2 | 1/2002 | Kubo et al. | |
| 6,379,985 B1 | 4/2002 | Cervantes et al. | |
| 6,398,867 B1 | 6/2002 | D'Evelyn et al. | |
| 6,406,540 B1 | 6/2002 | Harris et al. | |
| 6,451,157 B1 | 9/2002 | Hubacek | |
| 6,489,636 B1 | 12/2002 | Goetz et al. | |
| 6,547,249 B2 | 4/2003 | Collins, III et al. | |
| 6,567,574 B1 | 5/2003 | Ma et al. | |
| 6,586,762 B2 | 7/2003 | Kozaki | |
| 6,596,079 B1 | 7/2003 | Vaudo et al. | |
| 6,631,150 B1 | 10/2003 | Najda | |
| 6,635,904 B2 | 10/2003 | Goetz et al. | |
| 6,639,925 B2 | 10/2003 | Niwa et al. | |
| 6,656,615 B2 | 12/2003 | Dwilinski et al. | |
| 6,680,959 B2 | 1/2004 | Tanabe et al. | |
| 6,681,064 B2 | 1/2004 | Naniwae | |
| 6,686,608 B1 | 2/2004 | Takahira | |
| 6,734,461 B1 | 5/2004 | Shiomi et al. | |
| 6,755,932 B2 | 6/2004 | Masuda et al. | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,809,781 B2 | 10/2004 | Setlur et al. | |
| 6,814,811 B2 | 11/2004 | Ose | |
| 6,833,564 B2 | 12/2004 | Shen et al. | |
| 6,854,869 B1 | 2/2005 | Fernandez | |
| 6,858,081 B2 | 2/2005 | Biwa et al. | |
| 6,858,882 B2 | 2/2005 | Tsuda et al. | |
| 6,861,130 B2 | 3/2005 | D'Evelyn et al. | |
| 6,920,166 B2 | 7/2005 | Akasaka et al. | |
| 6,969,348 B2 | 11/2005 | Araii | |
| 7,001,577 B2 | 2/2006 | Zimmerman et al. | |
| 7,009,199 B2 | 3/2006 | Hall | |
| 7,019,325 B2 | 3/2006 | Li et al. | |
| 7,026,756 B2 | 4/2006 | Shimizu et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,078,731 B2 | 7/2006 | D'Evelyn et al. | |
| 7,098,487 B2 | 8/2006 | D'Evelyn et al. | |
| 7,112,829 B2 | 9/2006 | Picard et al. | |
| 7,119,372 B2 | 10/2006 | Stokes et al. | |
| 7,119,487 B2 | 10/2006 | Ikeda | |
| 7,125,453 B2 | 10/2006 | D'Evelyn et al. | |
| 7,128,849 B2 | 10/2006 | Setlur et al. | |
| 7,135,348 B2 | 11/2006 | Okuyama et al. | |
| 7,141,829 B2 | 11/2006 | Takahashi | |
| 7,160,531 B1 | 1/2007 | Jacques et al. | |
| 7,170,095 B2 | 1/2007 | Vaudo et al. | |
| 7,175,704 B2 | 2/2007 | D'Evelyn et al. | |
| 7,177,069 B2 | 2/2007 | Spaeth et al. | |
| 7,198,671 B2 | 4/2007 | Ueda | |
| 7,200,127 B1 | 4/2007 | Lee et al. | |
| 7,206,133 B2 * | 4/2007 | Cassarly | G02B 27/0081 359/13 |
| 7,220,324 B2 | 5/2007 | Baker et al. | |
| 7,252,712 B2 | 8/2007 | Dwilinski et al. | |
| 7,303,630 B2 | 12/2007 | Motoki et al. | |
| 7,312,156 B2 | 12/2007 | Granneman et al. | |
| 7,316,746 B2 | 1/2008 | D'Evelyn et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,368,015 B2 | 5/2008 | D'Evelyn et al. | |
| 7,381,391 B2 | 6/2008 | Spencer et al. | |
| 7,390,359 B2 | 6/2008 | Miyanaga et al. | |
| 7,420,261 B2 | 9/2008 | Dwilinski et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |

(56) References Cited

U.S. PATENT DOCUMENTS

| | | |
|---|---|---|
| 7,569,206 B2 | 8/2009 | Spencer et al. |
| 7,598,104 B2 | 10/2009 | Teng et al. |
| 7,625,446 B2 | 12/2009 | D'Evelyn et al. |
| 7,642,122 B2 | 1/2010 | Tysoe et al. |
| 7,691,658 B2 | 4/2010 | Kaeding et al. |
| 7,702,354 B2 | 4/2010 | Kawasaki |
| 7,704,324 B2 | 4/2010 | D'Evelyn et al. |
| 7,705,276 B2 | 4/2010 | Giddings et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,759,710 B1 | 7/2010 | Chiu et al. |
| 7,806,078 B2 | 10/2010 | Yoshida |
| 7,842,958 B1 | 11/2010 | Sekine et al. |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 7,976,630 B2 | 7/2011 | Poblenz et al. |
| 8,017,932 B2 | 9/2011 | Okamoto et al. |
| 8,021,481 B2 | 9/2011 | D'Evelyn |
| 8,044,412 B2 | 10/2011 | Murphy et al. |
| 8,048,225 B2 | 11/2011 | Poblenz et al. |
| 8,097,081 B2 | 1/2012 | D'Evelyn |
| 8,124,996 B2 | 2/2012 | Raring et al. |
| 8,126,024 B1 | 2/2012 | Raring |
| 8,143,148 B1 | 3/2012 | Raring et al. |
| 8,148,801 B2 | 4/2012 | D'Evelyn |
| 8,242,522 B2 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,278,656 B2 | 10/2012 | Mattmann et al. |
| 8,284,810 B1 | 10/2012 | Sharma et al. |
| 8,294,179 B1 | 10/2012 | Raring |
| 8,303,710 B2 | 11/2012 | D'Evelyn |
| 8,306,081 B1 | 11/2012 | Schmidt et al. |
| 8,314,429 B1 | 11/2012 | Raring et al. |
| 8,323,405 B2 | 12/2012 | D'Evelyn |
| 8,329,511 B2 | 12/2012 | D'Evelyn |
| 8,350,273 B2 | 1/2013 | Vielemeyer |
| 8,351,478 B2 | 1/2013 | Raring et al. |
| 8,354,679 B1 | 1/2013 | D'Evelyn et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,451,876 B1 | 5/2013 | Raring et al. |
| 8,461,071 B2 | 6/2013 | D'Evelyn |
| 8,465,588 B2 | 6/2013 | Poblenz et al. |
| 8,494,017 B2 | 7/2013 | Sharma et al. |
| 8,509,275 B1 | 8/2013 | Raring et al. |
| 8,510,979 B1 | 8/2013 | Mortimer |
| 8,582,038 B1 | 11/2013 | Raring et al. |
| 8,591,062 B2 | 11/2013 | Hussell et al. |
| 8,593,980 B2 | 11/2013 | Bae et al. |
| 8,634,442 B1 | 1/2014 | Raring et al. |
| D704,881 S | 5/2014 | Johnson |
| 8,717,505 B1 | 5/2014 | Raring et al. |
| 8,728,842 B2 | 5/2014 | Raring et al. |
| 8,729,559 B2 | 5/2014 | Krames et al. |
| 8,730,410 B1 | 5/2014 | Raring et al. |
| 8,749,719 B2 | 6/2014 | Raring et al. |
| 8,767,787 B1 | 7/2014 | Raring et al. |
| 8,773,598 B2 | 7/2014 | Raring et al. |
| 8,805,134 B1 | 8/2014 | Raring |
| 8,837,546 B1 | 9/2014 | Raring et al. |
| 8,847,249 B2 | 9/2014 | Raring et al. |
| 8,869,672 B2 | 10/2014 | Smith |
| 8,878,230 B2 | 11/2014 | D'Evelyn |
| 8,908,731 B1 | 12/2014 | Raring et al. |
| 8,975,615 B2 | 3/2015 | Felker et al. |
| 8,979,999 B2 | 3/2015 | D'Evelyn |
| 9,013,638 B2 | 4/2015 | Raring et al. |
| 9,014,229 B1 | 4/2015 | Raring et al. |
| 9,019,437 B2 | 4/2015 | Raring et al. |
| 9,048,170 B2 | 6/2015 | Pfister et al. |
| 9,071,772 B2 | 6/2015 | Raring et al. |
| 9,100,590 B2 | 8/2015 | Raring et al. |
| 9,239,427 B1 | 1/2016 | Raring |
| 9,246,311 B1 | 1/2016 | Raring et al. |
| 9,250,044 B1 | 2/2016 | Raring et al. |
| 9,362,715 B2 | 6/2016 | Sztein et al. |
| 9,531,164 B2 | 12/2016 | Raring et al. |
| 9,543,738 B2 | 1/2017 | Raring et al. |
| 9,714,749 B1 | 7/2017 | Salter et al. |
| 9,800,017 B1 | 10/2017 | Raring et al. |
| 9,829,778 B2 | 11/2017 | Raring et al. |
| 9,829,780 B2 | 11/2017 | Raring et al. |
| 10,084,281 B1 | 9/2018 | Raring et al. |
| 10,108,079 B2 | 10/2018 | Raring et al. |
| 10,205,300 B1 | 2/2019 | Raring et al. |
| 10,297,977 B1 | 5/2019 | Raring et al. |
| 10,551,542 B1 | 2/2020 | Tan et al. |
| 10,732,340 B2 * | 8/2020 | Schubert .............. G02B 6/0028 |
| 10,879,673 B2 | 12/2020 | Raring et al. |
| 10,904,506 B1 | 1/2021 | Raring et al. |
| 10,938,182 B2 | 3/2021 | Raring et al. |
| 11,016,378 B2 | 5/2021 | Raring et al. |
| 11,088,507 B1 | 8/2021 | Raring et al. |
| 11,101,618 B1 | 8/2021 | Raring et al. |
| 11,239,637 B2 | 2/2022 | Romero et al. |
| 2001/0011935 A1 | 8/2001 | Lee et al. |
| 2001/0026991 A1 | 10/2001 | Ichikawa et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0050517 A1 | 5/2002 | Oliva |
| 2002/0085603 A1 | 7/2002 | Okumura |
| 2002/0105986 A1 | 8/2002 | Yamasaki |
| 2002/0159741 A1 | 10/2002 | Graves et al. |
| 2002/0171092 A1 | 11/2002 | Goetz et al. |
| 2002/0189532 A1 | 12/2002 | Motoki et al. |
| 2002/0196414 A1 | 12/2002 | Manni et al. |
| 2002/0196953 A1 | 12/2002 | Burke |
| 2003/0000453 A1 | 1/2003 | Unno et al. |
| 2003/0001238 A1 | 1/2003 | Ban |
| 2003/0012243 A1 | 1/2003 | Okumura |
| 2003/0016750 A1 | 1/2003 | Cok |
| 2003/0020087 A1 | 1/2003 | Goto et al. |
| 2003/0027014 A1 | 2/2003 | Johnson et al. |
| 2003/0063476 A1 | 4/2003 | English et al. |
| 2003/0094893 A1 | 5/2003 | Ellens et al. |
| 2003/0129810 A1 | 7/2003 | Barth et al. |
| 2003/0140845 A1 | 7/2003 | D'Evelyn et al. |
| 2003/0140846 A1 | 7/2003 | Biwa et al. |
| 2003/0145784 A1 | 8/2003 | Thompson et al. |
| 2003/0147259 A1 | 8/2003 | Kraft |
| 2003/0147261 A1 | 8/2003 | Babbitt et al. |
| 2003/0178617 A1 | 9/2003 | Appenzeller et al. |
| 2003/0183155 A1 | 10/2003 | D'Evelyn et al. |
| 2003/0200931 A1 | 10/2003 | Goodwin |
| 2003/0209191 A1 | 11/2003 | Purdy |
| 2003/0216011 A1 | 11/2003 | Nakamura et al. |
| 2003/0232512 A1 | 12/2003 | Dickinson et al. |
| 2004/0000266 A1 | 1/2004 | D'Evelyn et al. |
| 2004/0012027 A1 | 1/2004 | Keller et al. |
| 2004/0023427 A1 | 2/2004 | Chua et al. |
| 2004/0025787 A1 | 2/2004 | Selbrede et al. |
| 2004/0031978 A1 | 2/2004 | D'Evelyn et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0105481 A1 | 6/2004 | Ishida et al. |
| 2004/0112866 A1 | 6/2004 | Maleville et al. |
| 2004/0113141 A1 | 6/2004 | Isuda et al. |
| 2004/0137265 A1 | 7/2004 | Shimada et al. |
| 2004/0146264 A1 | 7/2004 | Auner et al. |

(56) References Cited

U.S. PATENT DOCUMENTS

| | | |
|---|---|---|
| 2004/0149998 A1 | 8/2004 | Henson et al. |
| 2004/0151222 A1 | 8/2004 | Sekine |
| 2004/0179777 A1 | 9/2004 | Buelow, II et al. |
| 2004/0196877 A1 | 10/2004 | Kawakami et al. |
| 2004/0213016 A1 | 10/2004 | Rice |
| 2004/0213317 A1 | 10/2004 | Hashimoto et al. |
| 2004/0222357 A1 | 11/2004 | King et al. |
| 2004/0233950 A1 | 11/2004 | Furukawa et al. |
| 2004/0245535 A1 | 12/2004 | D'Evelyn et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2004/0263074 A1 | 12/2004 | Baroky et al. |
| 2005/0040384 A1 | 2/2005 | Tanaka et al. |
| 2005/0072986 A1 | 4/2005 | Sasaoka |
| 2005/0098095 A1 | 5/2005 | D'Evelyn et al. |
| 2005/0105572 A1 | 5/2005 | Simoun-Ou et al. |
| 2005/0128469 A1 | 6/2005 | Hall et al. |
| 2005/0152820 A1 | 7/2005 | D'Evelyn et al. |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0205215 A1 | 9/2005 | Giddings et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0231973 A1 | 10/2005 | Cassarly et al. |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0032428 A1 | 2/2006 | Dwilinski et al. |
| 2006/0033009 A1 | 2/2006 | Kobayashi et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0056855 A1 | 3/2006 | Nakagawa et al. |
| 2006/0060131 A1 | 3/2006 | Atanackovic |
| 2006/0060833 A1 | 3/2006 | Bruckner et al. |
| 2006/0066319 A1 | 3/2006 | Dallenbach et al. |
| 2006/0077795 A1 | 4/2006 | Kitahara et al. |
| 2006/0078009 A1 | 4/2006 | Katayama et al. |
| 2006/0078022 A1 | 4/2006 | Kozaki et al. |
| 2006/0078024 A1 | 4/2006 | Matsumura et al. |
| 2006/0079082 A1 | 4/2006 | Bruhns et al. |
| 2006/0086319 A1 | 4/2006 | Kasai et al. |
| 2006/0087864 A1 | 4/2006 | Peng et al. |
| 2006/0096521 A1 | 5/2006 | D'Evelyn et al. |
| 2006/0110926 A1 | 5/2006 | Hu et al. |
| 2006/0113553 A1 | 6/2006 | Srivastava et al. |
| 2006/0118799 A1 | 6/2006 | D'Evelyn et al. |
| 2006/0124051 A1 | 6/2006 | Yoshioka et al. |
| 2006/0126688 A1 | 6/2006 | Kneissl |
| 2006/0138431 A1 | 6/2006 | Dwilinski et al. |
| 2006/0139926 A1 | 6/2006 | Morioka et al. |
| 2006/0144334 A1 | 7/2006 | Yim et al. |
| 2006/0175624 A1 | 8/2006 | Sharma et al. |
| 2006/0177362 A1 | 8/2006 | D'Evelyn et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0207497 A1 | 9/2006 | D'Evelyn et al. |
| 2006/0213429 A1 | 9/2006 | Motoki et al. |
| 2006/0215127 A1 | 9/2006 | Peterson |
| 2006/0216416 A1 | 9/2006 | Sumakeris et al. |
| 2006/0221021 A1 | 10/2006 | Hajjar et al. |
| 2006/0256482 A1 | 11/2006 | Araki et al. |
| 2006/0256559 A1 | 11/2006 | Bitar |
| 2006/0262243 A1 | 11/2006 | Lester et al. |
| 2006/0279662 A1 | 12/2006 | Kapellner et al. |
| 2006/0288928 A1 | 12/2006 | Eom et al. |
| 2007/0012940 A1 | 1/2007 | Suh et al. |
| 2007/0019408 A1 | 1/2007 | McGuire, Jr. et al. |
| 2007/0029571 A1 | 2/2007 | Hanaoka et al. |
| 2007/0036186 A1 | 2/2007 | Corzine et al. |
| 2007/0039226 A1 | 2/2007 | Stokes |
| 2007/0057337 A1 | 3/2007 | Kano et al. |
| 2007/0081857 A1 | 4/2007 | Yoon |
| 2007/0086916 A1 | 4/2007 | LeBoeuf et al. |
| 2007/0091634 A1 | 4/2007 | Sakurada |
| 2007/0093073 A1 | 4/2007 | Farrell, Jr. et al. |
| 2007/0101932 A1 | 5/2007 | Schowalter et al. |
| 2007/0105351 A1 | 5/2007 | Motoki et al. |
| 2007/0109463 A1 | 5/2007 | Hutchins |
| 2007/0109504 A1 | 5/2007 | Miyazawa |
| 2007/0110112 A1 | 5/2007 | Sugiura |
| 2007/0120141 A1 | 5/2007 | Moustakas et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0153866 A1 | 7/2007 | Shchegrov et al. |
| 2007/0158785 A1 | 7/2007 | D'Evelyn et al. |
| 2007/0163490 A1 | 7/2007 | Habel et al. |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0184637 A1 | 8/2007 | Haskell et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0210324 A1 | 9/2007 | Kawaguchi et al. |
| 2007/0215033 A1 | 9/2007 | Imaeda et al. |
| 2007/0215887 A1 | 9/2007 | D'Evelyn et al. |
| 2007/0217462 A1 | 9/2007 | Yamasaki |
| 2007/0218703 A1 | 9/2007 | Kaeding et al. |
| 2007/0228262 A1 | 10/2007 | Cantin et al. |
| 2007/0242716 A1 | 10/2007 | Samal et al. |
| 2007/0252164 A1 | 11/2007 | Zhong et al. |
| 2007/0252918 A1 | 11/2007 | Furuya et al. |
| 2007/0259464 A1 | 11/2007 | Bour et al. |
| 2007/0272933 A1 | 11/2007 | Kim et al. |
| 2007/0274359 A1 | 11/2007 | Takeuchi et al. |
| 2007/0280320 A1 | 12/2007 | Feezell et al. |
| 2008/0006831 A1 | 1/2008 | Ng |
| 2008/0025360 A1 | 1/2008 | Eichler et al. |
| 2008/0029152 A1 | 2/2008 | Milshtein et al. |
| 2008/0049440 A1 | 2/2008 | Gaydoul |
| 2008/0054280 A1 | 3/2008 | Reginelli et al. |
| 2008/0068845 A1 | 3/2008 | Aida et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0089089 A1 | 4/2008 | Hama et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0142779 A1 | 6/2008 | Yang |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0156254 A1 | 7/2008 | Dwilinski et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0192458 A1 | 8/2008 | Li |
| 2008/0193363 A1 | 8/2008 | Tsuji |
| 2008/0198881 A1 | 8/2008 | Farrell et al. |
| 2008/0205477 A1 | 8/2008 | Hama et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0251020 A1 | 10/2008 | Franken et al. |
| 2008/0252778 A1 | 10/2008 | Dunki-Jacobs |
| 2008/0259431 A1 | 10/2008 | Weichmann et al. |
| 2008/0262316 A1 | 10/2008 | Ajima et al. |
| 2008/0283851 A1 | 11/2008 | Akita |
| 2008/0285609 A1 | 11/2008 | Ohta et al. |

(56) References Cited

U.S. PATENT DOCUMENTS

| | | |
|---|---|---|
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0310182 A1 | 12/2008 | Meinl |
| 2008/0315179 A1 | 12/2008 | Kim et al. |
| 2009/0003400 A1 | 1/2009 | Nagahama et al. |
| 2009/0021723 A1 | 1/2009 | De Lega |
| 2009/0058532 A1 | 3/2009 | Kikkawa et al. |
| 2009/0061857 A1 | 3/2009 | Kazmi |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0086170 A1 | 4/2009 | El-Ghoroury et al. |
| 2009/0086475 A1 | 4/2009 | Caruso et al. |
| 2009/0092536 A1 | 4/2009 | Kawabata et al. |
| 2009/0095973 A1 | 4/2009 | Tanaka et al. |
| 2009/0103581 A1 | 4/2009 | Bessho |
| 2009/0141242 A1 | 6/2009 | Silverstein et al. |
| 2009/0141765 A1 | 6/2009 | Kohda et al. |
| 2009/0153752 A1 | 6/2009 | Silverstein |
| 2009/0157229 A1 | 6/2009 | Rulkens et al. |
| 2009/0159869 A1 | 6/2009 | Ponce et al. |
| 2009/0166668 A1 | 7/2009 | Shakuda |
| 2009/0170224 A1 | 7/2009 | Urashima |
| 2009/0173957 A1 | 7/2009 | Brunner et al. |
| 2009/0218593 A1 | 9/2009 | Kamikawa et al. |
| 2009/0229519 A1 | 9/2009 | Saitoh |
| 2009/0238227 A1 | 9/2009 | Kubota et al. |
| 2009/0250686 A1 | 10/2009 | Sato et al. |
| 2009/0252191 A1 | 10/2009 | Kubota et al. |
| 2009/0267100 A1 | 10/2009 | Miyake et al. |
| 2009/0273005 A1 | 11/2009 | Lin |
| 2009/0296018 A1 | 12/2009 | Harle et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0320745 A1 | 12/2009 | D'Evelyn et al. |
| 2009/0321771 A1 | 12/2009 | Hattori et al. |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0006546 A1 | 1/2010 | Young et al. |
| 2010/0006873 A1 | 1/2010 | Raring et al. |
| 2010/0006875 A1 | 1/2010 | Naum et al. |
| 2010/0007852 A1 | 1/2010 | Bietry et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032464 A1 | 2/2010 | Gleason, Jr. |
| 2010/0044718 A1 | 2/2010 | Hanser et al. |
| 2010/0046234 A1 | 2/2010 | Abu-Ageel |
| 2010/0075175 A1 | 3/2010 | Poblenz et al. |
| 2010/0080001 A1 | 4/2010 | Kunoh et al. |
| 2010/0091515 A1 | 4/2010 | Goto et al. |
| 2010/0096615 A1 | 4/2010 | Okamoto et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0140630 A1 | 6/2010 | Hamaguchi et al. |
| 2010/0140745 A1 | 6/2010 | Khan et al. |
| 2010/0147210 A1 | 6/2010 | D'Evelyn |
| 2010/0149222 A1 | 6/2010 | Welford et al. |
| 2010/0150193 A1 | 6/2010 | Bhat et al. |
| 2010/0151194 A1 | 6/2010 | D'Evelyn |
| 2010/0165306 A1 | 7/2010 | McGettigan et al. |
| 2010/0187550 A1 | 7/2010 | Reed et al. |
| 2010/0189155 A1 | 7/2010 | Tanaka et al. |
| 2010/0189981 A1 | 7/2010 | Poblenz et al. |
| 2010/0195687 A1 | 8/2010 | Okamoto et al. |
| 2010/0220262 A1 | 9/2010 | DeMille et al. |
| 2010/0246159 A1 | 9/2010 | Wada |
| 2010/0246628 A1 | 9/2010 | Hattori et al. |
| 2010/0276663 A1 | 11/2010 | Enya et al. |
| 2010/0290498 A1 | 11/2010 | Hata et al. |
| 2010/0295054 A1 | 11/2010 | Okamoto et al. |
| 2010/0295438 A1 | 11/2010 | Ott et al. |
| 2010/0302464 A1 | 12/2010 | Raring et al. |
| 2010/0304874 A1 | 12/2010 | Abatemarco |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0001431 A1 | 1/2011 | Brukilacchio |
| 2011/0031508 A1 | 2/2011 | Hamaguchi et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0062415 A1 | 3/2011 | Ohta et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0064103 A1 | 3/2011 | Ohta et al. |
| 2011/0073888 A1 | 3/2011 | Ueno et al. |
| 2011/0075694 A1 | 3/2011 | Yoshizumi et al. |
| 2011/0100291 A1 | 5/2011 | D'Evelyn |
| 2011/0103418 A1 | 5/2011 | Hardy et al. |
| 2011/0122627 A1 | 5/2011 | Hikmet et al. |
| 2011/0122646 A1 | 5/2011 | Bickham et al. |
| 2011/0122927 A1 | 5/2011 | Wang |
| 2011/0129669 A1 | 6/2011 | Fujito et al. |
| 2011/0133489 A1 | 6/2011 | Hemeury et al. |
| 2011/0148280 A1 | 6/2011 | Kishimoto et al. |
| 2011/0150020 A1 | 6/2011 | Haase et al. |
| 2011/0164637 A1 | 7/2011 | Yoshizumi et al. |
| 2011/0164646 A1 | 7/2011 | Maeda et al. |
| 2011/0170569 A1 | 7/2011 | Tyagi et al. |
| 2011/0180781 A1 | 7/2011 | Raring et al. |
| 2011/0182056 A1 | 7/2011 | Trottier et al. |
| 2011/0183498 A1 | 7/2011 | D'Evelyn |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0204408 A1 | 8/2011 | McKenzie et al. |
| 2011/0215700 A1 | 9/2011 | Tong et al. |
| 2011/0216795 A1 | 9/2011 | Hsu et al. |
| 2011/0220912 A1 | 9/2011 | D'Evelyn |
| 2011/0220926 A1 | 9/2011 | Kim |
| 2011/0247556 A1 | 10/2011 | Raring et al. |
| 2011/0256693 A1 | 10/2011 | D'Evelyn et al. |
| 2011/0261849 A1 | 10/2011 | Shinagawa et al. |
| 2011/0262773 A1 | 10/2011 | Poblenz et al. |
| 2011/0273889 A1 | 11/2011 | Boomgaarden et al. |
| 2011/0280032 A1 | 11/2011 | Kishimoto |
| 2011/0281422 A1 | 11/2011 | Wang et al. |
| 2011/0286200 A1 | 11/2011 | Iimura et al. |
| 2011/0286484 A1 | 11/2011 | Raring et al. |
| 2011/0305000 A1 | 12/2011 | Bukesov et al. |
| 2012/0000415 A1 | 1/2012 | D'Evelyn et al. |
| 2012/0039072 A1 | 2/2012 | Lell et al. |
| 2012/0051377 A1 | 3/2012 | Liang et al. |
| 2012/0073494 A1 | 3/2012 | D'Evelyn |
| 2012/0091465 A1 | 4/2012 | Krames et al. |
| 2012/0104359 A1 | 5/2012 | Felker et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0170602 A1 | 7/2012 | Hikmet et al. |
| 2012/0178198 A1 | 7/2012 | Raring et al. |
| 2012/0187371 A1 | 7/2012 | Raring et al. |
| 2012/0199952 A1 | 8/2012 | D'Evelyn et al. |
| 2012/0205825 A1 | 8/2012 | Nagafuji et al. |
| 2012/0224374 A1 | 9/2012 | Aliberti |
| 2012/0224384 A1 | 9/2012 | Takahira et al. |
| 2012/0243203 A1 | 9/2012 | Koike et al. |

(56) References Cited

U.S. PATENT DOCUMENTS

| | | |
|---|---|---|
| 2012/0248483 A1 | 10/2012 | Beppu et al. |
| 2012/0314398 A1 | 12/2012 | Raring et al. |
| 2013/0001627 A1 | 1/2013 | Kinoshita et al. |
| 2013/0003400 A1 | 1/2013 | Kijima et al. |
| 2013/0003403 A1 | 1/2013 | Takahira et al. |
| 2013/0010456 A1 | 1/2013 | Ishii et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0088888 A1 | 4/2013 | Fewkes et al. |
| 2013/0119401 A1 | 5/2013 | D'Evelyn et al. |
| 2013/0155418 A1 | 6/2013 | Shaw et al. |
| 2013/0176705 A1 | 7/2013 | Ohta |
| 2013/0194821 A1 | 8/2013 | Maxik et al. |
| 2013/0201670 A1 | 8/2013 | Pickard et al. |
| 2013/0207148 A1 | 8/2013 | Kraeuter et al. |
| 2013/0208442 A1 | 8/2013 | Reiherzer |
| 2013/0229820 A1 | 9/2013 | Jutila et al. |
| 2013/0234111 A1 | 9/2013 | Pfister et al. |
| 2013/0301288 A1 | 11/2013 | Kishimoto et al. |
| 2013/0314613 A1 | 11/2013 | Raring et al. |
| 2013/0314614 A1 | 11/2013 | Raring et al. |
| 2013/0314937 A1 | 11/2013 | Takahashi et al. |
| 2013/0329397 A1 | 12/2013 | Shimizu et al. |
| 2014/0050244 A1 | 2/2014 | Ohno et al. |
| 2014/0063837 A1 | 3/2014 | Rowlette, Jr. |
| 2014/0078764 A1 | 3/2014 | Aizawa |
| 2014/0079088 A1 | 3/2014 | Joseph |
| 2014/0168942 A1 | 6/2014 | Kishimoto et al. |
| 2014/0226079 A1 | 8/2014 | Raring et al. |
| 2014/0247619 A1 | 9/2014 | Bennett et al. |
| 2014/0253697 A1 | 9/2014 | Raring et al. |
| 2014/0267937 A1 | 9/2014 | Raring et al. |
| 2014/0268815 A1 | 9/2014 | Li et al. |
| 2014/0293139 A1 | 10/2014 | Raring et al. |
| 2014/0376246 A1 | 12/2014 | Yatsuda et al. |
| 2015/0023376 A1 | 1/2015 | Yamanaka et al. |
| 2015/0055915 A1 | 2/2015 | Logunov et al. |
| 2015/0131306 A1 | 5/2015 | Genier et al. |
| 2015/0138511 A1 | 5/2015 | Domm |
| 2015/0222091 A1 | 8/2015 | Futami et al. |
| 2015/0229107 A1 | 8/2015 | McLaurin et al. |
| 2015/0286122 A1 | 10/2015 | Raring et al. |
| 2015/0323143 A1 | 11/2015 | Raring et al. |
| 2015/0346411 A1 | 12/2015 | Bauco et al. |
| 2015/0377430 A1 | 12/2015 | Bhakta |
| 2016/0061514 A1 | 3/2016 | Seo et al. |
| 2016/0077415 A1 | 3/2016 | Motoya et al. |
| 2016/0088804 A1 | 3/2016 | Ooi et al. |
| 2016/0131331 A1 | 5/2016 | Parker et al. |
| 2016/0131334 A1 | 5/2016 | Rousseau et al. |
| 2016/0236613 A1 | 8/2016 | Trier |
| 2016/0245471 A1 | 8/2016 | Nakazato et al. |
| 2016/0268770 A1 | 9/2016 | Tazawa et al. |
| 2016/0290584 A1 | 10/2016 | Nomura et al. |
| 2016/0327721 A1 | 11/2016 | Bauco et al. |
| 2017/0051883 A1 | 2/2017 | Raring et al. |
| 2017/0051884 A1 | 2/2017 | Raring et al. |
| 2017/0051885 A1 | 2/2017 | Hirasawa et al. |
| 2017/0059763 A1 | 3/2017 | Lucrecio et al. |
| 2017/0071037 A1 | 3/2017 | Wu et al. |
| 2017/0072841 A1 | 3/2017 | Schabacker et al. |
| 2017/0093123 A1 | 3/2017 | Takizawa et al. |
| 2017/0153319 A1 | 6/2017 | Villeneuve et al. |
| 2017/0314848 A1 | 11/2017 | Ammerman et al. |
| 2018/0017220 A1 | 1/2018 | Kitano |
| 2018/0026421 A1 | 1/2018 | Seidenfaden et al. |
| 2018/0059525 A1 | 3/2018 | Raring et al. |
| 2018/0083422 A1 | 3/2018 | Castiglia et al. |
| 2018/0266658 A1 | 9/2018 | Rousseau et al. |
| 2018/0316160 A1 | 11/2018 | Raring et al. |
| 2019/0025687 A1 | 1/2019 | Raring et al. |
| 2019/0235182 A1 | 8/2019 | Cheng |
| 2019/0242535 A1 | 8/2019 | Hikmet et al. |
| 2019/0305503 A1 | 10/2019 | Osawa et al. |
| 2019/0323663 A1 | 10/2019 | Rudy et al. |
| 2020/0200348 A1 | 6/2020 | Romero et al. |
| 2020/0200363 A1 | 6/2020 | Harrison et al. |
| 2020/0225566 A1 | 7/2020 | Raring et al. |
| 2020/0232618 A1 | 7/2020 | Rudy et al. |
| 2020/0233292 A1 | 7/2020 | Rudy et al. |
| 2021/0151956 A1 | 5/2021 | Raring et al. |
| 2021/0226410 A1 | 7/2021 | Raring et al. |

FOREIGN PATENT DOCUMENTS

| | | |
|---|---|---|
| CN | 1538534 A | 10/2004 |
| CN | 1655371 A | 8/2005 |
| CN | 1668947 A | 9/2005 |
| CN | 1702836 A | 11/2005 |
| CN | 1781195 A | 5/2006 |
| CN | 1953197 A | 4/2007 |
| CN | 1965590 A | 5/2007 |
| CN | 101009347 A | 8/2007 |
| CN | 101079463 A | 11/2007 |
| CN | 101099245 A | 1/2008 |
| CN | 101138091 A | 3/2008 |
| CN | 101171692 A | 4/2008 |
| CN | 101278232 A | 10/2008 |
| CN | 101308896 A | 11/2008 |
| CN | 102144294 A | 8/2011 |
| CN | 102144924 A | 8/2011 |
| CN | 102449550 A | 5/2012 |
| CN | 102804432 A | 11/2012 |
| CN | 103797597 A | 5/2014 |
| CN | 104566108 A | 4/2015 |
| CN | 104798203 A | 7/2015 |
| CN | 102449550 B | 6/2016 |
| CN | 105824179 | 8/2016 |
| CN | 105824179 B | 1/2018 |
| CN | 108139054 A | 6/2018 |
| DE | 11 2010 002177 | 10/2012 |
| EP | 1571715 A1 | 9/2005 |
| EP | 1 995 834 A1 | 11/2008 |
| EP | 3338023 A1 | 6/2018 |
| IN | 9733/DELNP/2011 | 1/2013 |
| IN | 310119 | 3/2019 |
| JP | 03-287770 A | 12/1991 |
| JP | 07-162081 A | 6/1995 |
| JP | 1042316 | 2/1998 |
| JP | 2001-230497 A | 8/2001 |
| JP | 2002-009402 A | 1/2002 |
| JP | 2002-185082 A | 6/2002 |
| JP | 2004-503923 A | 2/2004 |
| JP | 2004-071885 A | 3/2004 |
| JP | 2004-152841 A | 5/2004 |
| JP | 2004-186527 A | 7/2004 |
| JP | 2004-304111 A | 10/2004 |
| JP | 2005-289797 A | 10/2005 |
| JP | 2006-091285 A | 4/2006 |
| JP | 2006-120923 A | 5/2006 |
| JP | 2007-068398 A | 3/2007 |
| JP | 2007-173467 A | 7/2007 |
| JP | 2007-529910 A | 10/2007 |
| JP | 2008-003125 A | 1/2008 |
| JP | 2008-130591 A | 6/2008 |
| JP | 2008-193057 A | 8/2008 |
| JP | 2008-198952 A | 8/2008 |
| JP | 2008-533723 A | 8/2008 |
| JP | 2008-288527 A | 11/2008 |
| JP | 2008-543089 A | 11/2008 |
| JP | 2008-311640 A | 12/2008 |
| JP | 2009-021506 A | 1/2009 |
| JP | 2009-158893 A | 7/2009 |
| JP | 2009-170708 A | 7/2009 |
| JP | 2009-227685 A | 10/2009 |
| JP | 2010-067952 A | 3/2010 |
| JP | 2010-093236 A | 4/2010 |
| JP | 2010-103487 A | 5/2010 |
| JP | 2010-109147 A | 5/2010 |
| JP | 2010-109331 A | 5/2010 |
| JP | 2010-109332 A | 5/2010 |
| JP | 2010-225917 A | 10/2010 |

(56) References Cited

FOREIGN PATENT DOCUMENTS

| | | | |
|---|---|---|---|
| JP | 2010-238784 A | 10/2010 |
| JP | 2010-251686 A | 11/2010 |
| JP | 2011-077326 A | 4/2011 |
| JP | 2012-054272 A | 3/2012 |
| JP | 2012-512508 A | 5/2012 |
| JP | 2013-187145 A | 9/2013 |
| JP | 2015-001709 A | 1/2015 |
| JP | 2015-022954 A | 2/2015 |
| JP | 2018-085500 A | 5/2018 |
| JP | 2018-525836 A | 9/2018 |
| KR | 10-2018-0044327 A | 5/2018 |
| WO | 2004/084275 A2 | 9/2004 |
| WO | 2006/057463 A1 | 1/2006 |
| WO | 2006/015133 A2 | 2/2006 |
| WO | 2006/099138 A2 | 9/2006 |
| WO | 2007/004495 A1 | 1/2007 |
| WO | 2007/009035 A2 | 1/2007 |
| WO | 2007/119723 A1 | 10/2007 |
| WO | 2008/041521 A1 | 4/2008 |
| WO | 2008/109296 A1 | 9/2008 |
| WO | 2008/143276 A1 | 11/2008 |
| WO | 2008/147415 A1 | 12/2008 |
| WO | 2009/124317 A2 | 10/2009 |
| WO | 2010/068916 A1 | 6/2010 |
| WO | 2010/069282 A2 | 6/2010 |
| WO | 2010/120819 A1 | 10/2010 |
| WO | 2010/138923 A1 | 12/2010 |
| WO | 2011/149977 A1 | 12/2011 |
| WO | 2012/016033 A1 | 2/2012 |
| WO | 2012/053245 A1 | 4/2012 |
| WO | 2014/087047 A1 | 6/2014 |
| WO | 2015/090556 A1 | 6/2015 |
| WO | 2017/031446 A1 | 2/2017 |
| WO | 2018/078404 A1 | 5/2018 |
| WO | 2019/086176 A1 | 5/2019 |

OTHER PUBLICATIONS

"Data Table for: Non-Ferrous Metals: Other Metals", Molybdenum, Available Online at: http://www.matbase.com/material/non-ferrous-metals/other/molybdenum/properties, Mar. 28, 2011, 1 page.

U.S. Appl. No. 12/133,364, "Final Office Action", dated Jun. 1, 2011, 7 pages.

U.S. Appl. No. 12/133,364, "Non-Final Office Action", dated Nov. 26, 2010, 6 pages.

U.S. Appl. No. 12/133,364, "Notice of Allowance", dated Oct. 11, 2011, 5 pages.

U.S. Appl. No. 12/133,365, "Final Office Action", dated Oct. 18, 2011, 22 pages.

U.S. Appl. No. 12/133,365, "Non-Final Office Action", dated Jun. 9, 2011, 17 pages.

U.S. Appl. No. 12/133,365, "Non-Final Office Action", dated May 13, 2013, 23 pages.

U.S. Appl. No. 12/334,418, "Final Office Action", dated Oct. 19, 2011, 24 pages.

U.S. Appl. No. 12/334,418, "Non-Final Office Action", dated Apr. 5, 2011, 20 pages.

U.S. Appl. No. 12/478,736, "Final Office Action", dated Feb. 7, 2012, 6 pages.

U.S. Appl. No. 12/478,736, "Non-Final Office Action", dated Sep. 27, 2011, 11 pages.

U.S. Appl. No. 12/478,736, "Notice of Allowance", dated Apr. 23, 2012, 8 pages.

U.S. Appl. No. 12/481,543, "Non-Final Office Action", dated Jun. 27, 2011, 10 pages.

U.S. Appl. No. 12/482,440, "Final Office Action", dated Aug. 12, 2011, 7 pages.

U.S. Appl. No. 12/482,440, "Non-Final Office Action", dated Feb. 23, 2011, 6 pages.

U.S. Appl. No. 12/484,095, "Final Office Action", dated Jul. 8, 2011, 12 pages.

U.S. Appl. No. 12/484,095, "Non-Final Office Action", dated Nov. 10, 2010, 9 pages.

U.S. Appl. No. 12/484,924, "Final Office Action", dated Oct. 31, 2011, 11 pages.

U.S. Appl. No. 12/484,924, "Non-Final Office Action", dated Apr. 14, 2011, 12 pages.

U.S. Appl. No. 12/484,924, "Non-Final Office Action", dated Dec. 18, 2013, 15 pages.

U.S. Appl. No. 12/484,924, "Notice of Allowance", dated May 29, 2014, 9 pages.

U.S. Appl. No. 12/491,169, "Final Office Action", dated May 11, 2011, 10 pages.

U.S. Appl. No. 12/491,169, "Non-Final Office Action", dated Oct. 22, 2010, 10 pages.

U.S. Appl. No. 12/497,289, "Non-Final Office Action", dated Feb. 2, 2012, 7 pages.

U.S. Appl. No. 12/497,289, "Notice of Allowance", dated May 22, 2012, 7 pages.

U.S. Appl. No. 12/497,969, "Final Office Action", dated Jul. 5, 2012, 18 pages.

U.S. Appl. No. 12/497,969, "Non-Final Office Action", dated Feb. 2, 2012, 20 pages.

U.S. Appl. No. 12/497,969, "Non-Final Office Action", dated May 16, 2013, 22 pages.

U.S. Appl. No. 12/502,058, "Final Office Action", dated Aug. 19, 2011, 13 pages.

U.S. Appl. No. 12/502,058, "Non-Final Office Action", dated Dec. 8, 2010, 15 pages.

U.S. Appl. No. 12/502,058, "Notice of Allowance", dated Apr. 16, 2012, 10 pages.

U.S. Appl. No. 12/502,058, "Notice of Allowance", dated Jul. 19, 2012, 8 pages.

U.S. Appl. No. 12/534,829, "Non-Final Office Action", dated Apr. 19, 2011, 9 pages.

U.S. Appl. No. 12/534,829, "Notice of Allowability", dated Dec. 21, 2011, 4 pages.

U.S. Appl. No. 12/534,829, "Notice of Allowance", dated Dec. 5, 2011, 7 pages.

U.S. Appl. No. 12/534,829, "Notice of Allowance", dated Oct. 28, 2011, 8 pages.

U.S. Appl. No. 12/534,838, "Final Office Action", dated Jan. 13, 2012, 12 pages.

U.S. Appl. No. 12/534,838, "Non-Final Office Action", dated May 3, 2011, 12 pages.

U.S. Appl. No. 12/534,838, "Non-Final Office Action", dated Mar. 20, 2012, 13 pages.

U.S. Appl. No. 12/534,838, "Notice of Allowance", dated Jun. 8, 2012, 8 pages.

U.S. Appl. No. 12/534,843, "Non-Final Office Action", dated Sep. 10, 2012, 10 pages.

U.S. Appl. No. 12/534,843, "Notice of Allowance", dated Jan. 24, 2013, 9 pages.

U.S. Appl. No. 12/534,844, "Final Office Action", dated Feb. 4, 2011, 9 pages.

U.S. Appl. No. 12/534,844, "Non-Final Office Action", dated Apr. 25, 2014, 7 Pages.

U.S. Appl. No. 12/534,844, "Non-Final Office Action", dated Sep. 16, 2010, 8 pages.

U.S. Appl. No. 12/534,844, "Notice of Allowance", dated Nov. 17, 2014, 5 pages.

U.S. Appl. No. 12/534,849, "Notice of Allowance", dated Jul. 31, 2012, 12 pages.

U.S. Appl. No. 12/534,857, "Non-Final Office Action", dated Sep. 1, 2010, 13 pages.

U.S. Appl. No. 12/534,857, "Notice of Allowance", dated May 27, 2011, 5 pages.

U.S. Appl. No. 12/546,458, "Non-Final Office Action", dated Jul. 20, 2011, 5 pages.

U.S. Appl. No. 12/546,458, "Notice of Allowance", dated Nov. 28, 2011, 5 pages.

U.S. Appl. No. 12/556,558, "Non-Final Office Action", dated Sep. 16, 2010, 8 pages.

(56) References Cited

OTHER PUBLICATIONS

U.S. Appl. No. 12/556,558 , "Notice of Allowance", dated Mar. 22, 2011, 5 pages.
U.S. Appl. No. 12/556,562 , "Final Office Action", dated Mar. 21, 2011, 5 pages.
U.S. Appl. No. 12/556,562 , "Non-Final Office Action", dated Sep. 15, 2010, 7 pages.
U.S. Appl. No. 12/556,562 , "Notice of Allowance", dated Jul. 27, 2011, 5 pages.
U.S. Appl. No. 12/569,337 , "Non-Final Office Action", dated May 9, 2012, 19 pages.
U.S. Appl. No. 12/569,337 , "Notice of Allowance", dated Nov. 15, 2012, 5 pages.
U.S. Appl. No. 12/573,820 , "Final Office Action", dated Oct. 11, 2011, 23 pages.
U.S. Appl. No. 12/573,820 , "Non-Final Office Action", dated Mar. 2, 2011, 19 pages.
U.S. Appl. No. 12/573,820 , "Non-Final Office Action", dated Oct. 9, 2013, 29 pages.
U.S. Appl. No. 12/634,665 , "Final Office Action", dated Oct. 1, 2012, 10 pages.
U.S. Appl. No. 12/634,665 , "Non-Final Office Action", dated Apr. 25, 2012, 11 pages.
U.S. Appl. No. 12/634,665 , "Notice of Allowance", dated Feb. 15, 2013, 9 pages.
U.S. Appl. No. 12/636,683 , "Non-Final Office Action", dated Jun. 12, 2013, 15 pages.
U.S. Appl. No. 12/724,983 , "Non-Final Office Action", dated Mar. 5, 2012, 21 pages.
U.S. Appl. No. 12/727,148 , "Final Office Action", dated Nov. 21, 2013, 10 pages.
U.S. Appl. No. 12/727,148 , "Non-Final Office Action", dated Sep. 11, 2014, 12 Pages.
U.S. Appl. No. 12/727,148 , "Non-Final Office Action", dated May 15, 2013, 27 pages.
U.S. Appl. No. 12/749,466 , "Final Office Action", dated Feb. 3, 2012, 16 pages.
U.S. Appl. No. 12/749,466 , "Non-Final Office Action", dated Jul. 3, 2012, 18 pages.
U.S. Appl. No. 12/749,466 , "Non-Final Office Action", dated Jun. 29, 2011, 20 pages.
U.S. Appl. No. 12/749,466 , "Notice of Allowance", dated Jan. 2, 2013, 8 pages.
U.S. Appl. No. 12/749,476 , "Final Office Action", dated Nov. 8, 2011, 11 pages.
U.S. Appl. No. 12/749,476 , "Non-Final Office Action", dated Apr. 11, 2011, 15 pages.
U.S. Appl. No. 12/749,476 , "Notice of Allowance", dated Jun. 26, 2012, 8 pages.
U.S. Appl. No. 12/749,476 , "Notice of Allowance", dated May 4, 2012, 8 pages.
U.S. Appl. No. 12/759,273 , "Final Office Action", dated Jun. 26, 2012, 10 pages.
U.S. Appl. No. 12/759,273 , "Final Office Action", dated Mar. 29, 2016, 12 pages.
U.S. Appl. No. 12/759,273 , "Final Office Action", dated Oct. 24, 2014, 16 pages.
U.S. Appl. No. 12/759,273 , "Final Office Action", dated Jun. 8, 2015, 17 pages.
U.S. Appl. No. 12/759,273 , "Non-Final Office Action", dated Nov. 21, 2011, 10 pages.
U.S. Appl. No. 12/759,273 , "Non-Final Office Action", dated Apr. 3, 2014, 16 pages.
U.S. Appl. No. 12/759,273 , "Non-Final Office Action", dated Jan. 29, 2015, 16 pages.
U.S. Appl. No. 12/759,273 , "Non-Final Office Action", dated Sep. 23, 2015, 18 pages.
U.S. Appl. No. 12/759,273 , "Notice of Allowance", dated Aug. 19, 2016, 8 pages.
U.S. Appl. No. 12/762,269 , "Non-Final Office Action", dated Oct. 12, 2011, 12 pages.
U.S. Appl. No. 12/762,269 , "Notice of Allowance", dated Apr. 23, 2012, 8 pages.
U.S. Appl. No. 12/762,271 , "Final Office Action", dated Jun. 6, 2012, 13 pages.
U.S. Appl. No. 12/762,271 , "Non-Final Office Action", dated Dec. 23, 2011, 12 pages.
U.S. Appl. No. 12/762,271 , "Notice of Allowance", dated Aug. 8, 2012, 9 pages.
U.S. Appl. No. 12/762,278 , "Notice of Allowance", dated Nov. 7, 2011, 11 pages.
U.S. Appl. No. 12/778,718 , "Non-Final Office Action", dated Nov. 25, 2011, 12 pages.
U.S. Appl. No. 12/778,718 , "Notice of Allowance", dated Apr. 3, 2012, 14 pages.
U.S. Appl. No. 12/778,718 , "Notice of Allowance", dated Jun. 13, 2012, 7 pages.
U.S. Appl. No. 12/785,404 , "Non-Final Office Action", dated Mar. 6, 2012, 10 pages.
U.S. Appl. No. 12/785,404 , "Notice of Allowance", dated Jul. 16, 2012, 5 pages.
U.S. Appl. No. 12/787,343 , "Non-Final Office Action", dated Dec. 17, 2012, 6 pages.
U.S. Appl. No. 12/787,343 , "Notice of Allowance", dated Jun. 10, 2013, 10 pages.
U.S. Appl. No. 12/789,303 , "Non-Final Office Action", dated Sep. 24, 2012, 20 pages.
U.S. Appl. No. 12/789,303 , "Notice of Allowance", dated Dec. 21, 2012, 5 pages.
U.S. Appl. No. 12/859,153 , "Final Office Action", dated Feb. 26, 2013, 24 pages.
U.S. Appl. No. 12/859,153 , "Non-Final Office Action", dated Sep. 25, 2012, 22 pages.
U.S. Appl. No. 12/859,153 , "Non-Final Office Action", dated Jun. 21, 2013, 24 pages.
U.S. Appl. No. 12/868,441 , "Final Office Action", dated Dec. 18, 2012, 34 pages.
U.S. Appl. No. 12/868,441 , "Non-Final Office Action", dated Apr. 30, 2012, 12 pages.
U.S. Appl. No. 12/868,441 , "Notice of Allowance", dated Sep. 18, 2013, 13 pages.
U.S. Appl. No. 12/873,820 , "Final Office Action", dated Apr. 11, 2013, 7 pages.
U.S. Appl. No. 12/873,820 , "Non-Final Office Action", dated Oct. 4, 2012, 10 pages.
U.S. Appl. No. 12/873,820 , "Notice of Allowance", dated Jul. 26, 2013, 6 pages.
U.S. Appl. No. 12/880,803 , "Non-Final Office Action", dated Feb. 22, 2012, 9 pages.
U.S. Appl. No. 12/880,803 , "Notice of Allowance", dated Jul. 18, 2012, 5 pages.
U.S. Appl. No. 12/880,889 , "Final Office Action", dated Sep. 19, 2012, 26 pages.
U.S. Appl. No. 12/880,889 , "Non-Final Office Action", dated Feb. 27, 2012, 13 pages.
U.S. Appl. No. 12/880,889 , "Non-Final Office Action", dated Oct. 1, 2013, 19 pages.
U.S. Appl. No. 12/883,093 , "Final Office Action", dated Aug. 3, 2012, 13 pages.
U.S. Appl. No. 12/883,093 , "Non-Final Office Action", dated Mar. 13, 2012, 11 pages.
U.S. Appl. No. 12/883,093 , "Notice of Allowance", dated Nov. 21, 2012, 12 pages.
U.S. Appl. No. 12/883,652 , "Final Office Action", dated Oct. 26, 2015, 11 pages.
U.S. Appl. No. 12/883,652 , "Final Office Action", dated Jan. 11, 2013, 12 pages.
U.S. Appl. No. 12/883,652 , "Final Office Action", dated Dec. 19, 2014, 16 pages.
U.S. Appl. No. 12/883,652 , "Non-Final Office Action", dated Apr. 5, 2016, 12 pages.

(56) References Cited

OTHER PUBLICATIONS

U.S. Appl. No. 12/883,652 , "Non-Final Office Action", dated May 14, 2014, 14 pages.
U.S. Appl. No. 12/883,652 , "Non-Final Office Action", dated Jun. 3, 2015, 16 pages.
U.S. Appl. No. 12/883,652 , "Non-Final Office Action", dated Apr. 17, 2012, 8 pages.
U.S. Appl. No. 12/883,652 , "Notice of Allowance", dated Aug. 30, 2016, 7 pages.
U.S. Appl. No. 12/884,993 , "Final Office Action", dated Aug. 2, 2012, 15 pages.
U.S. Appl. No. 12/884,993 , "Non-Final Office Action", dated Mar. 16, 2012, 14 pages.
U.S. Appl. No. 12/884,993 , "Notice of Allowance", dated Nov. 26, 2012, 11 pages.
U.S. Appl. No. 12/891,668 , "Final Office Action", dated Jan. 10, 2013, 31 pages.
U.S. Appl. No. 12/891,668 , "Non-Final Office Action", dated Sep. 25, 2012, 21 pages.
U.S. Appl. No. 12/891,668 , "Notice of Allowance", dated Mar. 20, 2013, 14 pages.
U.S. Appl. No. 12/942,817 , "Final Office action", dated Oct. 22, 2014, 12 Pages.
U.S. Appl. No. 12/942,817 , "Final Office Action", dated Jan. 2, 2014, 15 pages.
U.S. Appl. No. 12/942,817 , "Non-Final Office Action", dated Jul. 31, 2014, 11 pages.
U.S. Appl. No. 12/942,817 , "Non-Final Office Action", dated Feb. 20, 2013, 12 pages.
U.S. Appl. No. 12/942,817 , "Notice of Allowance", dated Jan. 30, 2015, 8 pages.
U.S. Appl. No. 12/995,946 , "Final Office Action", dated Aug. 2, 2013, 16 pages.
U.S. Appl. No. 12/995,946 , "Non-Final Office Action", dated Mar. 28, 2012, 18 pages.
U.S. Appl. No. 12/995,946 , "Non-Final Office Action", dated Jan. 29, 2013, 25 pages.
U.S. Appl. No. 13/014,622 , "Final Office Action", dated Apr. 30, 2012, 14 pages.
U.S. Appl. No. 13/014,622 , "Final Office Action", dated May 11, 2015, 14 pages.
U.S. Appl. No. 13/014,622 , "Non-Final Office Action", dated Nov. 28, 2011, 14 pages.
U.S. Appl. No. 13/014,622 , "Non-Final Office Action", dated Jun. 20, 2014, 15 pages.
U.S. Appl. No. 13/041,199 , "Final Office Action", dated Mar. 12, 2013, 10 pages.
U.S. Appl. No. 13/041,199 , "Non-Final Office Action", dated Apr. 29, 2014, 13 pages.
U.S. Appl. No. 13/041,199 , "Non-Final Office Action", dated Nov. 30, 2012, 14 pages.
U.S. Appl. No. 13/041,199 , "Notice of Allowance", dated Sep. 9, 2014, 8 pages.
U.S. Appl. No. 13/046,565 , "Final Office Action", dated Feb. 2, 2012, 17 pages.
U.S. Appl. No. 13/046,565 , "Final Office Action", dated Jul. 19, 2012, 24 pages.
U.S. Appl. No. 13/046,565 , "Non-Final Office Action", dated Nov. 7, 2011, 17 pages.
U.S. Appl. No. 13/046,565 , "Non-Final Office Action", dated Apr. 13, 2012, 40 pages.
U.S. Appl. No. 13/108,645 , "Notice of Allowance", dated Jan. 28, 2013, 9 pages.
U.S. Appl. No. 13/114,806 , "Final Office Action", dated Mar. 10, 2016, 14 pages.
U.S. Appl. No. 13/114,806 , "Final Office Action", dated May 8, 2015, 20 pages.
U.S. Appl. No. 13/114,806 , "Final Office Action", dated Aug. 26, 2013, 22 pages.
U.S. Appl. No. 13/114,806 , "Final Office Action", dated Aug. 27, 2014, 22 pages.
U.S. Appl. No. 13/114,806 , "Non-Final Office Action", dated Oct. 5, 2015, 15 pages.
U.S. Appl. No. 13/114,806 , "Non-Final Office Action", dated Jan. 14, 2015, 21 pages.
U.S. Appl. No. 13/114,806 , "Non-Final Office Action", dated Apr. 12, 2013, 22 pages.
U.S. Appl. No. 13/114,806 , "Non-Final Office Action", dated Feb. 13, 2014, 23 pages.
U.S. Appl. No. 13/175,739 , "Non-Final Office Action", dated Dec. 7, 2012, 6 pages.
U.S. Appl. No. 13/175,739 , "Notice of Allowance", dated Mar. 21, 2013, 6 pages.
U.S. Appl. No. 13/226,249 , "Non-Final Office Action", dated Oct. 10, 2012, 7 pages.
U.S. Appl. No. 13/226,249 , "Notice of Allowance", dated Feb. 21, 2013, 5 pages.
U.S. Appl. No. 13/272,981 , "Final Office Action", dated Aug. 15, 2013, 13 Pages.
U.S. Appl. No. 13/272,981 , "Non-Final Office Action", dated Mar. 20, 2013, 19 pages.
U.S. Appl. No. 13/272,981 , "Notice of Allowance", dated Mar. 13, 2014, 10 pages.
U.S. Appl. No. 13/291,922 , "Final Office Action", dated Jun. 19, 2014, 13 pages.
U.S. Appl. No. 13/291,922 , "Final Office Action", dated Jun. 18, 2013, 9 pages.
U.S. Appl. No. 13/291,922 , "Non-Final Office Action", dated Feb. 20, 2013, 10 pages.
U.S. Appl. No. 13/291,922 , "Non-Final Office Action", dated Dec. 20, 2013, 12 pages.
U.S. Appl. No. 13/291,922 , "Notice of Allowance", dated Nov. 7, 2014, 9 pages.
U.S. Appl. No. 13/346,507 , "Non-Final Office Action", dated Dec. 21, 2012, 9 pages.
U.S. Appl. No. 13/346,507 , "Notice of Allowance", dated Apr. 22, 2013, 8 pages.
U.S. Appl. No. 13/354,639 , "Non-Final Office Action", dated Nov. 7, 2012, 12 pages.
U.S. Appl. No. 13/354,639 , "Notice of Allowance", dated Dec. 14, 2012, 8 pages.
U.S. Appl. No. 13/425,304 , "Notice of Allowance", dated Aug. 22, 2012, 9 pages.
U.S. Appl. No. 13/425,354 , "Final Office Action", dated Aug. 2, 2013, 16 pages.
U.S. Appl. No. 13/425,354 , "Non-Final Office Action", dated Feb. 14, 2013, 13 pages.
U.S. Appl. No. 13/425,354 , "Notice of Allowance", dated Feb. 7, 2014, 8 pages.
U.S. Appl. No. 13/546,943 , "Final Office Action", dated Feb. 28, 2014, 17 pages.
U.S. Appl. No. 13/546,943 , "Non-Final Office Action", dated Nov. 20, 2013, 16 pages.
U.S. Appl. No. 13/546,943 , "Notice of Allowance", dated Apr. 21, 2014, 8 pages.
U.S. Appl. No. 13/548,312 , "Final Office Action", dated Mar. 13, 2014, 5 pages.
U.S. Appl. No. 13/548,312 , "Notice of Allowance", dated Jun. 23, 2014, 7 pages.
U.S. Appl. No. 13/548,635 , "Non-Final Office Action", dated Jun. 14, 2013, 6 pages.
U.S. Appl. No. 13/548,635 , "Notice of Allowance", dated Sep. 16, 2013, 6 pages.
U.S. Appl. No. 13/548,931 , "Notice of Allowance", dated Jun. 3, 2013, 11 pages.
U.S. Appl. No. 13/606,894 , "Non-Final Office Action", dated Feb. 5, 2013, 8 pages.
U.S. Appl. No. 13/606,894 , "Notice of Allowance", dated May 24, 2013, 9 pages.
U.S. Appl. No. 13/678,101 , "Notice of Allowance", dated Jan. 24, 2014, 10 pages.

(56) References Cited

OTHER PUBLICATIONS

U.S. Appl. No. 13/678,122, "Notice of Allowance", dated Mar. 4, 2014, 18 pages.
U.S. Appl. No. 13/739,961, "Notice of Allowance", dated Dec. 10, 2013, 13 pages.
U.S. Appl. No. 13/752,158, "Final Office Action", dated Apr. 1, 2014, 15 pages.
U.S. Appl. No. 13/752,158, "Non-Final Office Action", dated Oct. 7, 2013, 14 pages.
U.S. Appl. No. 13/752,158, "Notice of Allowance", dated Sep. 16, 2014, 9 Pages.
U.S. Appl. No. 13/752,178, "Notice of Allowance", dated Apr. 2, 2014, 9 pages.
U.S. Appl. No. 13/853,694, "Notice of Allowance", dated Sep. 3, 2013, 8 pages.
U.S. Appl. No. 13/937,981, "Notice of Allowance", dated Nov. 27, 2013, 11 pages.
U.S. Appl. No. 13/937,981, "Notice of Allowance", dated Mar. 28, 2014, 9 pages.
U.S. Appl. No. 13/938,048, "Final Office Action", dated Jul. 27, 2015, 5 pages.
U.S. Appl. No. 13/938,048, "Non-Final Office Action", dated Apr. 9, 2015, 10 pages.
U.S. Appl. No. 13/938,048, "Notice of Allowance", dated Sep. 30, 2015, 5 pages.
U.S. Appl. No. 14/035,045, "Notice of Allowance", dated Jan. 13, 2014, 9 pages.
U.S. Appl. No. 14/176,403, "Non-Final Office Action", dated Sep. 11, 2015, 13 pages.
U.S. Appl. No. 14/176,403, "Notice of Allowance", dated Feb. 12, 2016, 8 pages.
U.S. Appl. No. 14/199,672, "Non-Final Office Action", dated Oct. 8, 2014, 7 pages.
U.S. Appl. No. 14/199,672, "Notice of Allowance", dated Feb. 2, 2015, 5 pages.
U.S. Appl. No. 14/249,242, "Notice of Allowance", dated Mar. 10, 2015, 16 pages.
U.S. Appl. No. 14/262,208, "Non-Final Office Action", dated Dec. 22, 2014, 10 pages.
U.S. Appl. No. 14/262,208, "Notice of Allowance", dated Apr. 23, 2015, 5 pages.
U.S. Appl. No. 14/307,214, "Notice of Allowance", dated Feb. 27, 2015, 10 pages.
U.S. Appl. No. 14/330,956, "Non-Final Office Action", dated May 19, 2015, 8 pages.
U.S. Appl. No. 14/330,956, "Notice of Allowance", dated Sep. 15, 2015, 5 pages.
U.S. Appl. No. 14/509,596, "Notice of Allowance", dated Jan. 22, 2015, 9 pages.
U.S. Appl. No. 14/534,636, "Non-Final Office Action", dated Jun. 3, 2015, 9 pages.
U.S. Appl. No. 14/534,636, "Notice of Allowance", dated Sep. 15, 2015, 11 pages.
U.S. Appl. No. 14/743,971, "Final Office Action", dated Nov. 30, 2016, 23 pages.
U.S. Appl. No. 14/743,971, "Non-Final Office Action", dated May 12, 2017, 20 pages.
U.S. Appl. No. 14/743,971, "Non-Final Office Action", dated Apr. 21, 2016, 23 pages.
U.S. Appl. No. 14/743,971, "Notice of Allowance", dated Jul. 28, 2017, 5 pages.
U.S. Appl. No. 14/802,960, "Final Office Action", dated Nov. 30, 2016, 23 pages.
U.S. Appl. No. 14/802,960, "Non-Final Office Action", dated May 8, 2017, 19 pages.
U.S. Appl. No. 14/802,960, "Non-Final Office Action", dated Apr. 15, 2016, 23 pages.
U.S. Appl. No. 14/802,960, "Notice of Allowance", dated Jul. 31, 2017, 5 pages.
U.S. Appl. No. 14/822,845, "Final Office Action", dated May 4, 2017, 15 pages.
U.S. Appl. No. 14/822,845, "Non-Final Office Action", dated Jan. 6, 2017, 17 pages.
U.S. Appl. No. 14/822,845, "Notice of Allowance", dated Jun. 21, 2017, 7 pages.
U.S. Appl. No. 14/829,927, "Final Office Action", dated Jul. 26, 2018, 39 pages.
U.S. Appl. No. 14/829,927, "Non-Final Office Action", dated Mar. 21, 2019, 26 pages.
U.S. Appl. No. 14/829,927, "Non-Final Office Action", dated May 12, 2020, 28 pages.
U.S. Appl. No. 14/829,927, "Non-Final Office Action", dated Sep. 26, 2017, 44 pages.
U.S. Appl. No. 14/829,927, "Notice of Allowance", dated Oct. 28, 2020, 16 pages.
U.S. Appl. No. 14/829,927, "Supplemental Notice of Allowability", dated Feb. 2, 2021, 2 pages.
U.S. Appl. No. 14/984,108, "Final Office Action", dated Jan. 18, 2018, 12 pages.
U.S. Appl. No. 14/984,108, "Non-Final Office Action", dated Sep. 6, 2017, 10 pages.
U.S. Appl. No. 14/984,108, "Notice of Allowance", dated Oct. 1, 2018, 5 pages.
U.S. Appl. No. 15/160,873, "Final Office Action", dated Apr. 16, 2020, 37 pages.
U.S. Appl. No. 15/160,873, "Final Office Action", dated Nov. 19, 2018, 37 pages.
U.S. Appl. No. 15/160,873, "Final Office Action", dated Dec. 22, 2020, 45 pages.
U.S. Appl. No. 15/160,873, "Non-Final Office Action", dated Apr. 4, 2019, 31 pages.
U.S. Appl. No. 15/160,873, "Non-Final Office Action", dated Oct. 18, 2019, 33 pages.
U.S. Appl. No. 15/160,873, "Non-Final Office Action", dated Jul. 7, 2020, 39 pages.
U.S. Appl. No. 15/160,873, "Non-Final Office Action", dated Apr. 5, 2018, 45 pages.
U.S. Appl. No. 15/160,873, "Notice of Allowance", dated Dec. 13, 2021, 9 pages.
U.S. Appl. No. 15/710,715, "Notice of Allowance", dated May 25, 2018, 17 pages.
U.S. Appl. No. 15/796,568, "First Action Interview Pilot Program Pre-Interview Communication", dated Apr. 17, 2018, 5 pages.
U.S. Appl. No. 15/796,568, "Notice of Allowance", dated Jun. 22, 2018, 6 pages.
U.S. Appl. No. 16/000,802, "Notice of Allowance", dated Dec. 19, 2018, 14 pages.
U.S. Appl. No. 16/014,010, "Non-Final Office Action", dated Apr. 30, 2020, 43 pages.
U.S. Appl. No. 16/014,010, "Notice of Allowance", dated Aug. 18, 2020, 15 pages.
U.S. Appl. No. 16/014,010, "Supplemental Notice of Allowability", dated Nov. 27, 2020, 2 pages.
U.S. Appl. No. 16/140,357, "Final Office Action", dated Oct. 15, 2019, 20 pages.
U.S. Appl. No. 16/140,357, "First Action Interview Pilot Program Pre-Interview Communication", dated Aug. 1, 2019, 5 pages.
U.S. Appl. No. 16/140,357, "Non-Final Office Action", dated Sep. 25, 2020, 25 pages.
U.S. Appl. No. 16/140,357, "Notice of Allowance", dated Jan. 22, 2021, 8 pages.
U.S. Appl. No. 16/140,357, "Supplemental Notice of Allowability", dated Apr. 27, 2021, 2 pages.
U.S. Appl. No. 16/140,357, "Supplemental Notice of Allowability", dated Apr. 6, 2021, 2 pages.
U.S. Appl. No. 16/230,158, "Notice of Allowance", dated Sep. 21, 2021, 12 pages.
U.S. Appl. No. 16/252,570, "Final Office Action", dated Aug. 27, 2020, 68 pages.
U.S. Appl. No. 16/252,570, "Final Office Action", dated Feb. 2, 2022, 77 pages.

(56) References Cited

OTHER PUBLICATIONS

U.S. Appl. No. 16/252,570, "Non-Final Office Action", dated Aug. 17, 2021, 64 pages.
U.S. Appl. No. 16/252,570, "Non-Final Office Action", dated Apr. 30, 2020, 73 pages.
U.S. Appl. No. 16/252,570, "Non-Final Office Action", dated Feb. 23, 2021, 73 pages.
U.S. Appl. No. 16/353,657, "Corrected Notice of Allowability", dated Jul. 12, 2021, 2 pages.
U.S. Appl. No. 16/353,657, "Corrected Notice of Allowability", dated May 6, 2021, 3 pages.
U.S. Appl. No. 16/353,657, "Non-Final Office Action", dated May 19, 2020, 12 pages.
U.S. Appl. No. 16/353,657, "Non-Final Office Action", dated Nov. 18, 2020, 17 pages.
U.S. Appl. No. 16/353,657, "Notice of Allowance", dated Apr. 8, 2021, 7 pages.
U.S. Appl. No. 16/380,217, "Final Office Action", dated Feb. 2, 2022, 57 pages.
U.S. Appl. No. 16/380,217, "Final Office Action", dated Aug. 27, 2020, 58 pages.
U.S. Appl. No. 16/380,217, "Non-Final Office Action", dated Aug. 17, 2021, 53 pages.
U.S. Appl. No. 16/380,217, "Non-Final Office Action", dated May 13, 2020, 56 pages.
U.S. Appl. No. 16/380,217, "Non-Final Office Action", dated Feb. 17, 2021, 66 pages.
U.S. Appl. No. 16/449,126, "Final Office Action", dated Aug. 21, 2020, 22 pages.
U.S. Appl. No. 16/449,126, "Final Office Action", dated Jun. 8, 2021, 28 pages.
U.S. Appl. No. 16/449,126, "Non-Final Office Action", dated Dec. 31, 2019, 19 pages.
U.S. Appl. No. 16/449,126, "Non-Final Office Action", dated Dec. 21, 2020, 28 pages.
U.S. Appl. No. 16/449,126, "Notice of Allowance", dated Nov. 10, 2021, 10 pages.
U.S. Appl. No. 16/449,126, "Supplemental Notice of Allowability", dated Feb. 25, 2022, 2 pages.
U.S. Appl. No. 16/449,126, "Supplemental Notice of Allowance", dated Jan. 12, 2022, 2 pages.
U.S. Appl. No. 16/597,791, "Final Office Action", dated Apr. 13, 2021, 49 pages.
U.S. Appl. No. 16/597,791, "Non-Final Office Action", dated Nov. 24, 2020, 35 pages.
U.S. Appl. No. 16/597,791, "Non-Final Office Action", dated Aug. 9, 2021, 42 pages.
U.S. Appl. No. 16/597,795, "Final Office Action", dated Apr. 13, 2021, 39 pages.
U.S. Appl. No. 16/597,795, "Non-Final Office Action", dated Dec. 7, 2020, 47 pages.
U.S. Appl. No. 16/597,795, "Non-Final Office Action", dated Aug. 9, 2021, 50 pages.
U.S. Appl. No. 16/796,272, "Corrected Notice of Allowability", dated Dec. 11, 2020, 2 pages.
U.S. Appl. No. 16/796,272, "Non-Final Office Action", dated Jun. 22, 2020, 21 pages.
U.S. Appl. No. 16/796,272, "Notice of Allowance", dated Sep. 25, 2020, 10 pages.
U.S. Appl. No. 16/796,368, "Corrected Notice of Allowability", dated Jul. 19, 2021, 2 pages.
U.S. Appl. No. 16/796,368, "Non-Final Office Action", dated Nov. 18, 2020, 17 pages.
U.S. Appl. No. 16/796,368, "Non-Final Office Action", dated Jun. 22, 2020, 19 pages.
U.S. Appl. No. 16/796,368, "Notice of Allowance", dated Apr. 13, 2021, 7 pages.
U.S. Appl. No. 16/835,897, "Final Office Action", dated May 5, 2021, 34 pages.
U.S. Appl. No. 16/835,897, "Non-Final Office Action", dated Jan. 1, 2021, 32 pages.
Abare et al., "Cleaved and Etched Facet Nitride Laser Diodes", Institute of Electrical and Electronics Engineers Journal of Selected Topics in Quantum Electronics, vol. 4, No. 3, May-Jun. 1998, pp. 505-509.
Adesida et al., "Characteristics of Chemically Assisted Ion Beam Etching of Gallium Nitride", Applied Physics Letters, vol. 65, No. 7, Aug. 15, 1994, pp. 889-891.
Altoukhov et al., "High Reflectivity Airgap Distributed Bragg Reflectors Realized by Wet Etching of AlInN Sacrificial Layers", Applied Physics Letters, vol. 95, 2009, pp. 191102-1-191102-3.
Aoki et al., "InGaAs/InGaAsP MQW Electroabsorption Modulator Integrated with a DFB Laser Fabricated by Band-Gap Energy Control Selective Area MOCVD", Institute of Electrical and Electronics Engineers Journal of Quantum Electronics, vol. 29, No. 6, Jun. 1993, pp. 2088-2096.
Asano et al., "100-mW Kink-Free Blue-Violet Laser Diodes with Low Aspect Ratio", Institute of Electrical and Electronics Engineers Journal of Quantum Electronics, vol. 39, No. 1, Jan. 2003, pp. 135-140.
Bernardini et al., "Spontaneous Polarization and Piezoelectric Constants of III-V Nitrides", Physical Review B, vol. 56, No. 16, Oct. 15, 1997, pp. R10024-R10027.
Callahan et al., "Synthesis and Growth of Gallium Nitride by the Chemical Vapor Reaction Process (CVRP)", MRS Internet Journal Nitride Semiconductor Research, vol. 4, No. 10, 1999, pp. 1-6.
Caneau et al., "Studies on the Selective OMVPE of (Ga,In)/(As,P)", Journal of Crystal Growth, vol. 124, Nov. 1, 1992, pp. 243-248.
Chen et al., "Growth and Optical Properties of Highly Uniform and Periodic InGaN Nanostructures", Advanced Materials, vol. 19, No. 13, Dec. 2007, pp. 1707-1710.
Choi et al., "2.5λ Microcavity InGaN Light-Emitting Diodes Fabricated by a Selective Dry-Etch Thinning Process", Applied Physics Letters, vol. 91, No. 6, 2007, pp. 061120-1-061120-3.
D'Evelyn et al., "Bulk GaN Crystal Growth by the High-Pressure Ammonothermal Method", Journal of Crystal Growth, vol. 300, No. 1, Jan. 26, 2007, pp. 11-16.
Dorsaz et al., "Selective Oxidation of AlInN Layers for Current Confinement III-Nitride Devices", Applied Physics Letters, vol. 87, 2005, pp. 072102-1-072102-3.
Ehrentraut et al., "The Ammonothermal Crystal Growth of Gallium Nitride—A Technique on the Up Rise", Proceedings IEEE, vol. 98, No. 7, 2010, pp. 1316-1323.
EP16837921.2, "Extended European Search Report", dated May 16, 2019, 14 pages.
EP16837921.2, extended EP Examination report, dated Feb. 2, 2021, 8 pages.
Fang et al., "Deep Centers in Semi-insulating Fe-doped Native GaN Substrates Grown by Hydride Vapour Phase Epitaxy", Physica Status Solidi, vol. 5, No. 6, 2008, pp. 1508-1511.
Feezell et al., "Development of Nonpolar and Semipolar InGaN/GaN Visible Light-Emitting Diodes", Materials Research Society Bulletin, vol. 34, No. 5, May 2009, pp. 318-323.
Founta et al., "Anisotropic Morphology of Nonpolar a-Plane GaN Quantum Dots and Quantum Wells", Journal of Applied Physics, vol. 102, No. 7, Oct. 2, 2007, pp. 074304-1-074304-6.
Franssila, "Tools for CVD and Epitaxy", Introduction to Microfabrication, 2004, pp. 329-336.
Fujii et al., "Increase in the Extraction Efficiency of GaN-Based Light-Emitting Diodes Via Surface Roughening", Applied Physics Letters, vol. 84, No. 6, Feb. 9, 2004, pp. 855-857.
Fujito et al., "Development of Bulk GaN Crystals and Nonpolar/Semipolar Substrates by HVPE", MRS Bulletin, vol. 34, No. 5, May 2009, pp. 313-317.
Fukuda et al., "Prospects for the Ammonothermal Growth of Large GaN Crystal", Journal of Crystal Growth vol. 305, Jul. 2007, pp. 304-310.
Funato et al., "Blue, Green, and Amber InGaN/GaN Light-Emitting Diodes on Semipolar {1122} GaN Bulk Substrates", Journal of Japanese Applied Physics, vol. 45, No. 26, Jun. 30, 2006, pp. L659-L662.

(56) References Cited

OTHER PUBLICATIONS

Funato et al., "Monolithic Polychromatic Light-Emitting Diodes Based on InGaN Microfacet Quantum Wells Toward Tailor-Made Solid-State Lighting", Applied Physics Express, vol. 1, No. 1, Jan. 17, 2008, pp. 011106-1-011106-3.
Gardner et al., "Blue-Emitting InGaN—GaN Double-Heterostructure Light-Emitting Diodes Reaching Maximum Quantum Efficiency Above 200 A/cm2", Applied Physics Letters, vol. 91, No. 24, Dec. 12, 2007, pp. 243506-1-243506-3.
Gladkov et al., "Effect of Fe Doping on Optical Properties of Freestanding Semi-Insulating HVPE GaN:Fe", Journal of Crystal Growth, vol. 312, 2010, pp. 1205-1209.
Grzegory et al., "High Pressure Growth of Bulk GaN from Solutions in Gallium", Journal of Physics Condensed Matter, vol. 13, 2001, pp. 6875-6892.
Hiramatsu et al., "Selective Area Growth and Epitaxial Lateral Overgrowth of GaN by Metalorganic Vapor Phase Epitaxy and Hydride Vapor Phase Epitaxy", Materials Science and Engineering B, vol. 59, Nos. 1-3, May 6, 1999, pp. 104-111.
Iso et al., "High Brightness Blue InGaN/GaN Light Emitting Diode on Nonpolar m-Plane Bulk GaN Substrate", Japanese Journal of Applied Physics, vol. 46, No. 40, 2007, pp. L960-L962.
Iso et al., "High Brightness Blue InGaN/GaN Light Emitting Diode on Nonpolar m-Plane Bulk GaN Substrate", Japanese Journal of Applied Physics, vol. 46, No. 40, Oct. 12, 2007, pp. L960-L962.
Kendall et al., "Energy Savings Potential of Solid State Lighting in General Lighting Applications", Report for the Department of Energy, Apr. 2001, 35 pages.
Khan et al., "Cleaved Cavity Optically Pumped InGaN—GaN Laser Grown on Spinel Substrates", Applied Physics Letters, vol. 69, No. 16, Oct. 14, 1996, pp. 2418-2420.
Kim et al., "Improved Electroluminescence on Nonpolar m-Plane InGaN/GaN Qantum Wells LEDs", Physica Status Solidi, vol. 1, No. 3, Apr. 12, 2007, pp. 125-127.
Kuramoto et al., "Novel Ridge-Type InGaN Multiple-Quantum-Well Laser Diodes Fabricated by Selective Area Re-Growth on n-GaN Substrates", Journal of Japanese Applied Physics, vol. 40, Sep. 2001, pp. L925-L927.
Lide et al., "Thermal Conductivity of Ceramics and Other Insulating Materials", CRC Handbook of Chemistry and Physics, 91st Edition, 2010-2011, pp. 12-203-12-204.
Lin et al., "Influence of Separate Confinement Heterostructure Layer on Carrier Distribution in InGaAsP Laser Diodes with Nonidentical Multiple Quantum Wells", Japanese Journal of Applied Physics, vol. 43, No. 10, Oct. 8, 2004, pp. 7032-7035.
Masui et al., "Electrical Characteristics of Nonpolar InGaN-Based Light-Emitting Diodes Evaluated at Low Temperature", Japanese Journal of Applied Physics, vol. 46, No. 11, Nov. 6, 2007, pp. 7309-7310.
Michiue et al., "Recent Development of Nitride LEDs and LDs", Proceedings of Society of Photo-Optical Instrumentation Engineers, vol. 7216, Feb. 16, 2009, pp. 72161Z-1-72161Z-6.
Moutanabbir et al., "Bulk GaN Ion Cleaving", Journal of Electronic Materials, vol. 39, No. 5, Nov. 5, 2010, pp. 482-488.
Nakamura et al., "InGaN/GaN/AlGaN-Based Laser Diodes with Modulation-Doped Strained-Layer Superlattices Grown on an Epitaxially Laterally Overgrown GaN Substrate", Applied Physics Letters, vol. 72, No. 2, Jan. 12, 1998, pp. 211-213.
Nam et al., "Lateral Epitaxial Overgrowth of GaN Films on SiO2 Areas Via Metalorganic Vapor Phase Epitaxy", Journal of Electronic Materials, vol. 27, No. 4, Apr. 1, 1998, pp. 233-237.
Okamoto et al., "Continuous-Wave Operation of m-Plane InGaN Multiple Quantum Well Laser Diodes", The Japan Society of Applied Physics, vol. 46, No. 9, Feb. 23, 2007, pp. L187-L189.
Okamoto et al., "High-Efficiency Continuous-Wave Operation of Blue-Green Laser Diodes Based on Nonpolar m-Plane Gallium Nitride", Applied Physics Express, vol. 1, No. 7, Jul. 2008, pp. 072201-1-072201-3.
Okamoto et al., "Pure Blue Laser Diodes Based on Nonpolar m-Plane Gallium Nitride with InGaN Waveguiding Layers", Journal of Japanese Applied Physics, vol. 46, No. 35, Sep. 7, 2007, pp. L820-L822.
Okubo, "Nichia Develops Blue-Green Semiconductor Laser w/488nm Wavelength", Available Online at: http://techon.nikkeibp.co.jp/english/NEWS_EN/20080122/146009/, Jan. 6, 2010, 3 pages.
Oshima et al., "Thermal and Optical Properties of Bulk GaN Crystals Fabricated Through Hydride Vapor Phase Epitaxy With Void-Assisted Separation", Journal of Applied Physics, vol. 98, No. 10, 2005, pp. 103509-1-103509-4.
Park, "Crystal Orientation Effects on Electronic Properties of Wurtzite InGaN/GaN Quantum Wells", Journal of Applied Physics, vol. 91, No. 12, Jun. 15, 2002, pp. 9904-9908.
Pattison et al., "Gallium Nitride Based Microcavity Light Emitting Diodes With 2? Effective Cavity Thickness", Applied Physics Letters, vol. 90, No. 3, 2007, pp. 031111-1-031111-3.
PCT/US2009/046786, "International Search Report and Written Opinion", dated May 13, 2010, 8 pages.
PCT/US2009/047107, "International Search Report and Written Opinion", dated Sep. 29, 2009, 10 pages.
PCT/US2009/052611, "International Search Report and Written Opinion", dated Sep. 29, 2009, 11 pages.
PCT/US2009/067745, "International Search Report and Written Opinion", dated Feb. 5, 2010, 9 pages.
PCT/US2010/030939, "International Search Report and Written Opinion", dated Jun. 16, 2010, 10 pages.
PCT/US2010/036739, "International Preliminary Report on Patentability", dated Dec. 8, 2011, 7 pages.
PCT/US2010/036739, "International Search Report and Written Opinion", dated Nov. 8, 2010, 10 pages.
PCT/US2010/036739, "Invitation to Pay Additional Fees and, Where Applicable, Protest Fee", dated Jul. 22, 2010, 2 pages.
PCT/US2010/049172, "International Search Report and Written Opinion", dated Nov. 17, 2010, 8 pages.
PCT/US2011/037792, "International Preliminary Report on Patentability", dated Dec. 6, 2012, 8 pages.
PCT/US2011/037792, "International Search Report and Written Opinion", dated Sep. 8, 2011, 9 pages.
PCT/US2011/060030, "International Search Report and Written Opinion", dated Mar. 21, 2012, 8 pages.
PCT/US2015/014567, "International Search Report and Written Opinion", dated Jul. 8, 2015, 19 pages.
PCT/US2016/047834, "International Preliminary Report on Patentability", dated Mar. 1, 2018, 12 pages.
PCT/US2016/047834, "International Search Report and Written Opinion", dated Oct. 28, 2016, 13 pages.
PCT/US2019/060910, "International Search Report and Written Opinion", dated Mar. 12, 2020, 11 pages.
PCT/US2019/068091, "International Preliminary Report on Patentability", dated Jul. 1, 2021, 13 pages.
PCT/US2019/068091, "International Search Report and Written Opinion", dated Apr. 16, 2020, 16 pages.
PCT/US2019/068091, "Invitation to Pay Additional Fees and, Where Applicable, Protest Fee", dated Feb. 21, 2020, 3 pages.
PCT/US2019/068428, "International Preliminary Report on Patentability", dated Jul. 1, 2021, 10 pages.
PCT/US2019/068428, "International Search Report and Written Opinion", dated Apr. 16, 2020, 13 pages.
PCT/US2019/068428, "Invitation to Pay Additional Fees and, Where Applicable, Protest Fee", dated Feb. 13, 2020, 2 pages.
PCT/US2020/014476, "International Preliminary Report on Patentability", dated Jul. 29, 2021, 13 pages.
PCT/US2020/014476, "International Search Report and Written Opinion", dated Jun. 9, 2020, 17 pages.
PCT/US2020/014476, "Invitation to Pay Additional Fees and, Where Applicable, Protest Fee", dated Mar. 26, 2020, 3 pages.
PCT/US2020/014479, "International Preliminary Report on Patentability", dated Jul. 29, 2021, 22 pages.
PCT/US2020/014479, "International Search Report and Written Opinion", dated Apr. 8, 2020, 24 pages.
PCT/US2020/038504, "International Preliminary Report on Patentability", dated Dec. 30, 2021, 11 pages.

(56) References Cited

OTHER PUBLICATIONS

PCT/US2020/038504 , "International Search Report and Written Opinion", dated Jul. 14, 2020, 12 pages.
Porowski et al., "High Resistivity GaN Single Crystalline Substrates", Acta Physica Polonica A, vol. 92, No. 5, 1997, pp. 958-962.
Porowski , "Near Defect Free GaN Substrates", Journal of Nitride Semiconductor, 1999, 11 pages.
Purvis , "Changing the Crystal Face of Gallium Nitride", The Advance Semiconductor Magazine, III-Vs Review, vol. 18, No. 8, Nov. 2005, 3 pages.
Romanov et al., "Strain-Induced Polarization in Wurtzite III-Nitride Semipolar Layers", Journal of Applied Physics, vol. 100, No. 2, Jul. 2006, pp. 023522-1-023522-10.
Sarva et al., "Dynamic Compressive Strength Of Silicon Carbide Under Uniaxial Compression", Material Sciences and Engineering, vol. A317, 2001, pp. 140-144.
Sato et al., "High Power and High Efficiency Green Light Emitting Diode on Free-Standing Semipolar (1122) Bulk GaN Substrate", Physica Status Solidi, vol. 1, No. 4, Jun. 15, 2007, pp. 162-164.
Sato et al., "Optical Properties of Yellow Light-Emitting-Diodes Grown on Semipolar (1122) Bulk GaN Substrates", Applied Physics Letter, vol. 92, No. 22, Jun. 5, 2008, pp. 221110-1-221110-3.
Schmidt et al., "Demonstration of Nonpolar M-Plane InGaN/GaN Laser Diodes", Japanese Journal of Applied Physics, vol. 46, No. 9, Feb. 23, 2007, pp. L190-L191.
Schmidt et al., "High Power and High External Efficiency m-Plane InGaN Light Emitting Diodes", Japanese Journal of Applied Physics, vol. 46, No. 7, Feb. 9, 2007, pp. L126-L128.
Schoedl et al., "Facet Degradation of GaN Heterostructure Laser Diodes", Journal of Applied Physics, vol. 97, No. 12, Jun. 16, 2005, pp. 123102-1-123102-8.
Schremer et al., "Progress in Etched Facet Technology for GaN and Blue Lasers", Proceedings of Society of Photo-Optical Instrumentation Engineers, vol. 6473, Feb. 2007, pp. 64731F-1-64731F-8.
Sharma et al., "Vertically Oriented GaN-based Air-Gap Distributed Bragg Reflector Structure Fabricated Using Band-Gap-Selective Photoelectrochemical Etching", Applied Physics Letters, vol. 87, 2005, pp. 051107-1-051107-3.
Shchekin et al., "High Performance Thin-Film Flip-Chip InGaN—GaN Light-Emitting Diodes", Applied Physics Letters, vol. 89, No. 7, Aug. 16, 2006, pp. 071109-1-071109-3.
Shen et al., "Auger Recombination in InGaN Measured by Photoluminescence", Applied Physics Letters, vol. 91, No. 14, Oct. 1, 2007, pp. 141101-1-141101-3.
Sizov et al., "500-Nm Optical Gain Anisotropy of Semipolar (1122) InGaN Quantum Wells", Applied Physics Express, vol. 2, No. 7, Jun. 19, 2009, pp. 071001-1-071001-3.
Tomiya et al., "Dislocation Related Issues in the Degradation of GaN-Based Laser Diodes", Institute of Electrical and Electronics Engineers Journal of Selected Topics in Quantum Electronics, vol. 10, No. 6, Nov.-Dec. 2004, pp. 1277-1286.
Tyagi et al., "High Brightness Violet InGaN/GaN Light Emitting Diodes on Semipolar (1011) Bulk GaN Substrates", Japanese Journal of Applied Physics, vol. 46, No. 7, Feb. 9, 2007, pp. L129-L131.
Tyagi et al., "Partial Strain Relaxation via Misfit Dislocation Generation at Heterointerfaces in (Al,In)GaN Epitaxial Layers Grown on Semipolar (1122) GaN Free Standing Substrates", Applied Physics Letter, vol. 95, No. 25, Dec. 23, 2009, pp. 251905-1-251905-3.
Tyagi et al., "Semipolar (1011) InGaN/GaN Laser Diodes on Bulk GaN Substrates", Japanese Journal of Applied Physics, vol. 46, No. 19, May 11, 2007, pp. L444-L445.
Uchida et al., "Recent Progress in High-Power Blue-Violet Lasers", Institute of Electrical and Electronics Engineers Journal of Selected Topics in Quantum Electronics, vol. 9, No. 5, Sep.-Oct. 2003, pp. 1252-1259.
Waltereit et al., "Nitride Semiconductors Free of Electrostatic Fields for Efficient White Light-Emitting Diodes", Nature, vol. 406, Aug. 24, 2000, pp. 865-868.
Wang et al., "Ammonothermal Growth of GaN Crystals in Alkaline Solutions", Journal of Crystal Growth, vol. 287, 2006, pp. 376-380.
Weisbuch et al., "Recent Results and Latest Views on Microactivity LEDs", Light Emitting Diodes: Research, Manufacturing, and Applications, vol. 5366, 2004, pp. 1-19.
Wierer et al., "High-Power AlGaInN Flip-Chip Light-Emitting Diodes", Applied Physics Letters, vol. 78, No. 22, May 28, 2001, pp. 3379-3381.
Yamaguchi , "Anisotropic Optical Matrix Elements in Strained GaN-Quantum Wells with Various Substrate Orientations", Physical Status Solidi, vol. 5, No. 6, May 13, 2008, pp. 2329-2332.
Yibing , "Phenomenon Analysis and Solution Measure for Blue GaN-Based LEDs Peak Wavelength Blue Moves", Journal of Human University of Technology, vol. 22 No. 3, May 2008, pp. 87-90.
Yoshizumi et al., "Continuous-Wave Operation of 520 nm Green InGaN-Based Laser Diodes on Semi-Polar (2021) GaN Substrates", Applied Physics Express, vol. 2, No. 9, Aug. 21, 2009, pp. 092101-1-092101-3.
Yu et al., "Multiple Wavelength Emission from Semipolar InGaN/GaN Quantum Wells Selectively Grown by MOCVD", Quantum Electronics and Laser Science Conference, May 2007, 2 pages.
Zhong et al., "Demonstration of High Power Blue-Green Light Emitting Diode on Semipolar (1122) Bulk GaN Substrate", Electronics Letters, vol. 43, No. 15, Jul. 19, 2007, 2 pages.
Zhong et al., "High Power and High Efficiency Blue Light Emitting Diode on Freestanding Semipolar (1011) Bulk GaN Substrate", Applied Physics Letter, vol. 90, No. 23, Jun. 5, 2007, pp. 233504-1-233504-3.

* cited by examiner 2 row configuration

Single row configuration
Spatial multiplexing vertical or horizontal w/ 90 degree polarization rotation

FIBER DELIVERED LASER INDUCED WHITE LIGHT SYSTEM

CROSS-REFERENCE TO RELATED APPLICATIONS

The present application is a continuation of U.S. application Ser. No. 16/230,158, filed Dec. 21, 2018, the entire contents of which are incorporated herein by reference in its entirety for all purposes.

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

The conventional light bulb dissipates more than 90% of the energy used as thermal energy.
The conventional light bulb routinely fails due to thermal expansion and contraction of the filament element.
The conventional light bulb emits light over a broad spectrum, much of which is not perceived by the human eye.
The conventional light bulb emits in all directions, which is undesirable for applications requiring strong directionality or focus, e.g. projection displays, optical data storage, etc.

To overcome some of the drawbacks of the conventional light bulb, several alternatives have been developed including fluorescent lamps, Mercury vapor lamps, sodium vapor lamps, other high-intensity discharge (HID) lamps, gas discharge lamps such as neon lamps, among others. These lamp technologies in general suffer from similar problems to Edison lamps as well as having their own unique drawbacks. For example, fluorescent lamps require high voltages to start, which can be in the range of a thousand volts for large lamps, and also emit highly non-ideal spectra that are dominated by spectral lines.

In the past decade, solid state lighting has risen in importance due to several key advantages it has over conventional lighting technology. Solid state lighting is lighting derived from semiconductor devices such as diodes which are designed and optimized to emit photons. Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 µW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 µW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. LEDs are now used in applications as diverse as aviation lighting, automotive headlamps, advertising, general lighting, traffic signals, and camera flashes. LEDs have allowed new text, video displays, and sensors to be developed, while their high switching rates can be very useful in communications technology. LEDs, however, are not the only solid-state light source and may not be preferable light sources for certain lighting applications. Alternative solid state light sources utilizing stimulated emission, such as laser diodes (LDs) or super-luminescent light emitting diodes (SLEDs), provide many unique features advantageously over LEDs.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

Solid-state laser light sources, due to the narrowness of their spectra which enables efficient spectral filtering, high modulation rates, and short carrier lifetimes, smaller in size, and far greater surface brightness compared to LEDs, can be more preferable as visible light sources as a means of transmitting information with high bandwidth in many applications including lighting fixtures, lighting systems, displays, projectors and the like. Advancements of new GaN-based blue laser technology based on improved processes have substantially reduced manufacture cost and opened opportunities for utilizing the modulated laser signal and the light spot directly to measure and or interact with the surrounding environment, transmit data to other electronic systems, and respond dynamically to inputs from various sensors. Such applications are herein referred to as "smart lighting" applications to be disclosed throughout the specification herein.

SUMMARY

The present invention provides a fiber-delivered phosphor-emitted white light system and method of making the same. Merely by examples, the invention provides laser pumped phosphor light sources from gallium and nitrogen containing laser diodes, white light source integrated with a fiber attached phosphor in packaging and laser pump-light delivery configuration. The invention is applicable to many applications including static lighting devices and methods, dynamic lighting devices and methods, LIDAR, LiFi, and visible light communication devices and methods, and various combinations of above in applications of general lighting, commercial lighting and display, automotive lighting and communication, defense and security, industrial processing, and internet communications, and others.

Specific embodiments of this invention employ a transferred gallium and nitrogen containing material process for fabricating laser diodes or other gallium and nitrogen containing devices (as shown in U.S. Pat. Nos. 9,666,677 and 9,379,525, filed by one of inventors of this application) enabling benefits over conventional fabrication technologies.

In some embodiments, beam shaping elements such as MEMS scanning mirrors, and communications triggered by integrated sensor feedback are employed to generate smart laser lighting. The smart laser lighting can be combined with LIDAR technology for enhanced system functionality and/or enhanced LIDAR function. Specific embodiments of this invention employ a transferred gallium and nitrogen containing material process (U.S. Pat. Nos. 9,666,677 and 9,379,525) for fabricating laser diodes or other gallium and nitrogen containing devices enabling benefits over conventional fabrication technologies.

Optionally, the phosphor material used in the fiber-delivered smart laser lighting system is comprised of a ceramic yttrium aluminum garnet (YAG) doped with Ce or a single crystal YAG doped with Ce or a powdered YAG comprising a binder material. The phosphor has an optical conversion efficiency of greater than 50 lumen per optical watt, greater than 100 lumen per optical watt, greater than 200 lumen per optical watt, or greater than 300 lumen per optical watt.

Optionally, a waveguide element is used to transport the laser excitation pump source to the remote wavelength converter element such as a phosphor element. In a preferred embodiment, the transport waveguide is an optical fiber wherein the optical fiber could be comprised of a single mode fiber (SMF) or a multi-mode fiber (MMF), with core diameters ranging from about 1 um to 10 um, about 10 um to 50 um, about 50 um to 150 um, about 150 um to 500 um, about 500 um to 1 mm, or greater than 1 mm. The optical core material may consist of a glass such as silica glass wherein the silica glass could be doped with various constituents and have a predetermined level of hydroxyl groups (OH) for an optimized propagation loss characteristic. The glass fiber material may also be comprised of a fluoride glass, a phosphate glass, or a chalcogenide glass. In an alternative embodiment, a plastic optical fiber is used to transport the laser pump light.

Optionally, the phosphor material is configured to operate in a mode selected from a reflective mode, a transmissive mode, and a combination of a reflective mode and a transmissive mode in association with receiving the first laser beam with the first peak wavelength to excite the emission with the second peak wavelength.

Optionally, the integrated package includes the wavelength conversion member configured as a remote pumped phosphor and an optical fiber to guide the laser beam from the gallium and nitrogen containing laser diode to the remote pumped phosphor.

Optionally, the at least one gallium and nitrogen containing laser diode includes multiple laser diodes such as 2 laser diodes, 3 laser diodes, or 4 laser diodes to generate 2 laser beams, 3 laser beams, or 4 laser beams, respectively. The multiple laser beams form an excitation spot on the wavelength conversion member.

Optionally, each of the multiple laser diodes is characterized by one of multiple first peak wavelengths in 420 nm to 485 nm blue color range. The multiple first peak wavelengths result in an improved color quality of the white light.

Optionally, the wavelength conversion member includes a first phosphor material configured to be excited by the first laser beam with the first peak wavelength to produce a first emission of a second peak wavelength and a second phosphor material configured to be excited by the laser beam to produce a second emission with a third peak wavelength.

Optionally, the gallium and nitrogen containing laser diode is characterized by the first laser beam with the first peak wavelength in violet color range. The first phosphor material is characterized by the first emission with the second peak wavelength in blue color range. The second phosphor material is characterized by the second emission with the third wavelength in yellow color range. The white light is comprised of at least the first emission and the second emission.

Optionally, the beam projector includes a MEMS or other micro-controlled scanner or display module, micro-mirror, micro-lens, configured to dynamically scan a beam of the sensing light signal across the remote target object.

Optionally, the blue laser light is characterized by high power levels in one range selected from 1 mW to 10 mW, 10 mW to 100 mW, 100 mW to 1 W, and 1 W to 10 W capable of sensing and mapping the remote target object under damp condition with relative humidity level in each of following ranges of greater than 25%, greater than 50%, greater than 75%, and greater than 100%.

In a specific embodiment, the present invention provides an apparatus for remotely delivering white light. The apparatus includes at least one laser diode device. The apparatus further includes a package member with electrical feedthroughs configured to couple power from a driver to the at least one laser diode device. The package member includes a support member. The at least one laser diode device is configured to the support member and driven by the driver to emit a beam of laser electromagnetic radiation characterized by a first wavelength ranging from 395 nm to 490 nm. Additionally, the apparatus includes a waveguide assembly having a first end section coupled to the package member to receive the laser electromagnetic radiation and a waveguide transport member to deliver the laser electromagnetic radiation through a length to exit a second end section with a propagation direction, a beam diameter, and a divergence. The apparatus further includes a phosphor member disposed in a light head member and configured with a surface to receive the laser electromagnetic radiation exited from the second end section. The phosphor member provides a wavelength conversion of at least a fraction of the laser electromagnetic radiation of the first wavelength to a phosphor emission of a second wavelength. The second wavelength is longer than the first wavelength. Furthermore, the apparatus includes a mechanical fixture in the light head member configured to support the phosphor member and the second end section of the waveguide assembly with an angle of incidence in a range from 5 degrees to 90 degrees between the primary propagation direction of the laser electromagnetic radiation and a direction parallel the surface of the phosphor member. The laser electromagnetic radiation exiting the second end section of the waveguide assembly forms an excitation spot of the incident laser electromagnetic radiation on the surface of the phosphor member. The excitation spot is characterized by a diameter ranging from 25 μm to 5 mm. The excitation spot generates a substantially white light emission characterized by a mixture of the laser electromagnetic radiation of the first wavelength and the phosphor emission of the second wavelength.

In another specific embodiment, the present invention provides an apparatus for remotely delivering white light. The apparatus includes a package case enclosing an electronic board member with a multi-pin connector. The apparatus further includes a laser module configured in a sub-package plugged to the electronic board member inside the package case. The sub-package includes a support member, at least one gallium and nitrogen containing laser diode device configured to mount on the support member. The at least one gallium and nitrogen containing laser diode device is configured to emit a beam of electromagnetic radiation characterized by a first wavelength ranging from 395 nm to 490 nm. Additionally, the apparatus includes a collimating lens configured in the sub-package to collimate the beam of the electromagnetic radiation to an output port of the sub-package. The apparatus also includes a lid member sealed the package case with the multi-pin connector coupled with an electrical feedthrough. Furthermore, the apparatus includes a fiber assembly comprising an optical fiber with a first end coupled to the output port to receive the electromagnetic radiation and deliver the electromagnetic radiation through an arbitrary length to exit a second end with a primary propagation direction, a beam diameter, and a divergence. The apparatus further includes a phosphor member disposed remotely in a light head member coupled with the second end of the optical fiber. The phosphor member has a surface configured to receive the electromagnetic radiation exiting the second end of the optical fiber and provides a wavelength conversion of at least a fraction of the electromagnetic radiation of the first wavelength to a phosphor emission of a second wavelength, wherein the second wavelength is longer than the first wavelength. Moreover, the apparatus includes a mechanical fixture in the light head member configured to set a distance between the surface of the phosphor member and the second end of the optical fiber and set an angle of incidence between the primary propagation direction of the electromagnetic radiation exiting the second end and a direction parallel the surface of the phosphor member to create an excitation spot of the electromagnetic radiation on the surface of the phosphor member with a diameter ranging from 25 μm to 5 mm. The excitation spot generates a white light emission characterized by a mixture of the electromagnetic radiation of the first wavelength and the phosphor emission of the second wavelength.

In yet another specific embodiment, the present invention provides a fiber-delivered laser-induced white light source for auto headlight. The white light source includes a laser module packaged in a metal case plugged to a circuit board, the metal case enclosing a support member, at least one laser diode device configured to mount on the support member and to emit a laser beam characterized by a wavelength ranging from 395 nm to 490 nm, and a collimating lens configured to guide the laser beam to an output port. Additionally, the white light source includes a focus lens coupled to the output port from outside the metal case to receive and confine the laser beam. Furthermore, the white light source includes a fiber assembly embedding an optical fiber having a first end section coupled to the output port with alignment to receive the laser beam from the focus lens and deliver the laser beam through the optical fiber to a second end section. Moreover, the white light source includes a light head member disposed remotely in an auto headlight module holding the second end section of the optical fiber near a phosphor material. The light head member is configured to direct the laser beam exiting the second end section of the optical fiber at the phosphor material at an angle of incidence in a range from 5 degrees to 90 degrees between the laser beam and a direction parallel to a surface of the phosphor material to create a spot ranging from 50 μm to 5 mm. The laser beam in the spot induces a phosphor-excited emission which is partially mixed with the laser beam to produce a white light emission as an illumination and projection light source of the auto headlight module.

Merely by way of example, the present invention can be applied to applications such as white lighting, white spot lighting, flash lights, automotive applications, automobile headlights or other lighting and communications functions, autonomous vehicles, all-terrain vehicle lighting, light sources used in recreational sports such as biking, surfing, running, racing, boating, light sources used for drones, planes, robots, other mobile or robotic applications, autonomous devices such as land, sea, or air vehicles and technology, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

BRIEF DESCRIPTION OF THE FIGURES

The following drawings are merely examples for illustrative purposes according to various disclosed embodiments and are not intended to limit the scope of the present invention.

DETAILED DESCRIPTION

The present invention provides a fiber-delivered phosphor-emitted white light system and method of making the same. Merely by examples, the invention provides laser pumped phosphor light sources from gallium and nitrogen containing laser diodes, white light source integrated with a fiber attached phosphor in packaging and pump-light delivering configuration. The invention is applicable to many applications including dynamic lighting devices and methods, LIDAR, LiFi, and visible light communication devices and methods, and various combinations of above in applications of general lighting, commercial lighting and display, automotive lighting and communication, defense and security, industrial processing, and internet communications, and others.

Figure 1:
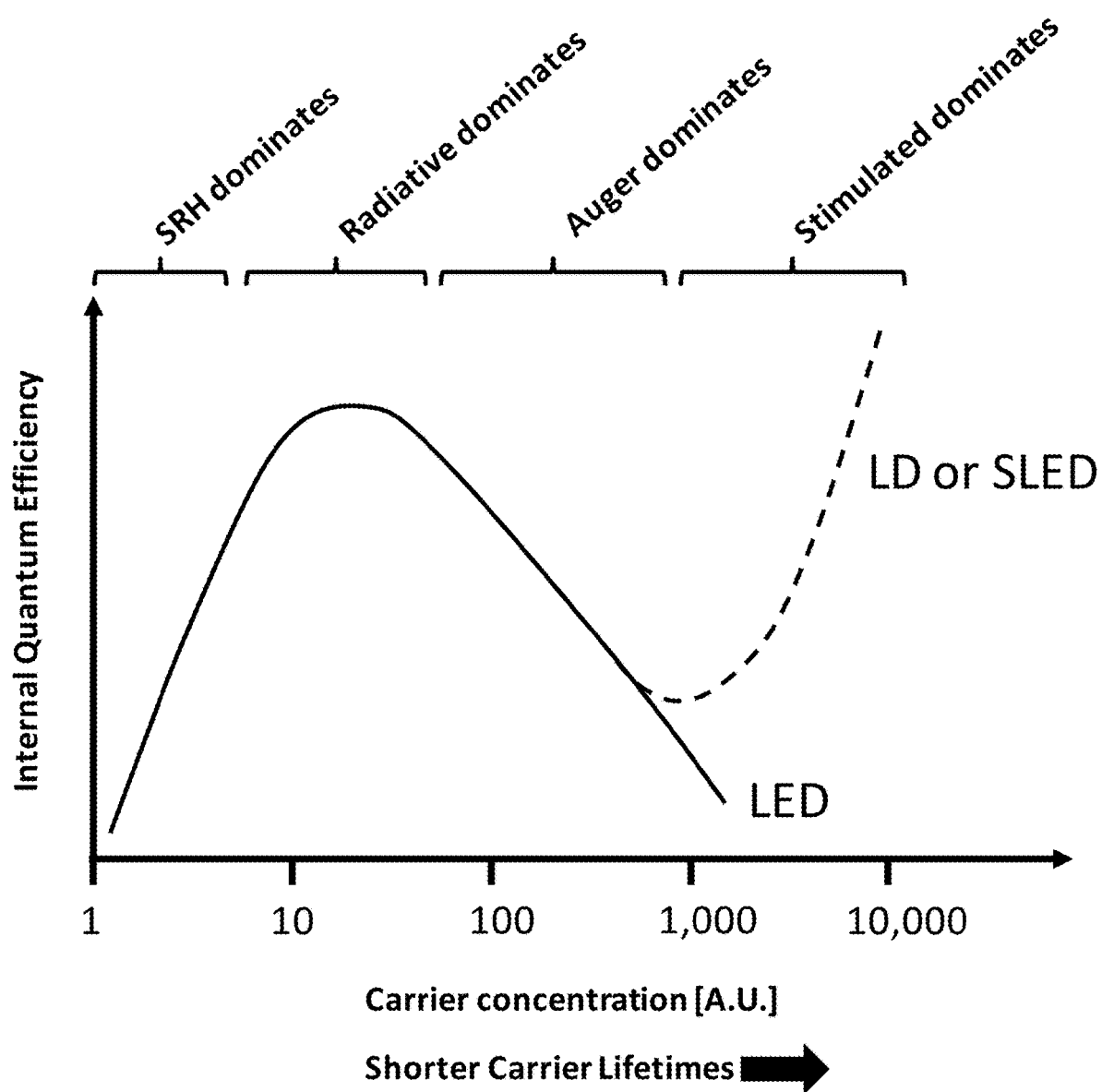
FIG. 1 is a schematic diagram showing dependence of internal quantum efficiency in a laser diode on carrier concentration in the light emitting layers of the device.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm$^2$ range. FIG. 1 shows a schematic diagram of the relationship between internal quantum efficiency [IQE] and carrier concentration in the light emitting layers of a light emitting diode [LED] and light-emitting devices where stimulated emission is significant such as laser diodes [LDs] or super-luminescent LEDs. IQE is defined as the ratio of the radiative recombination rate to the total recombination rate in the device. At low carrier concentrations Shockley-Reed-Hall recombination at crystal defects dominates recombination rates such that IQE is low.

Figure 2:
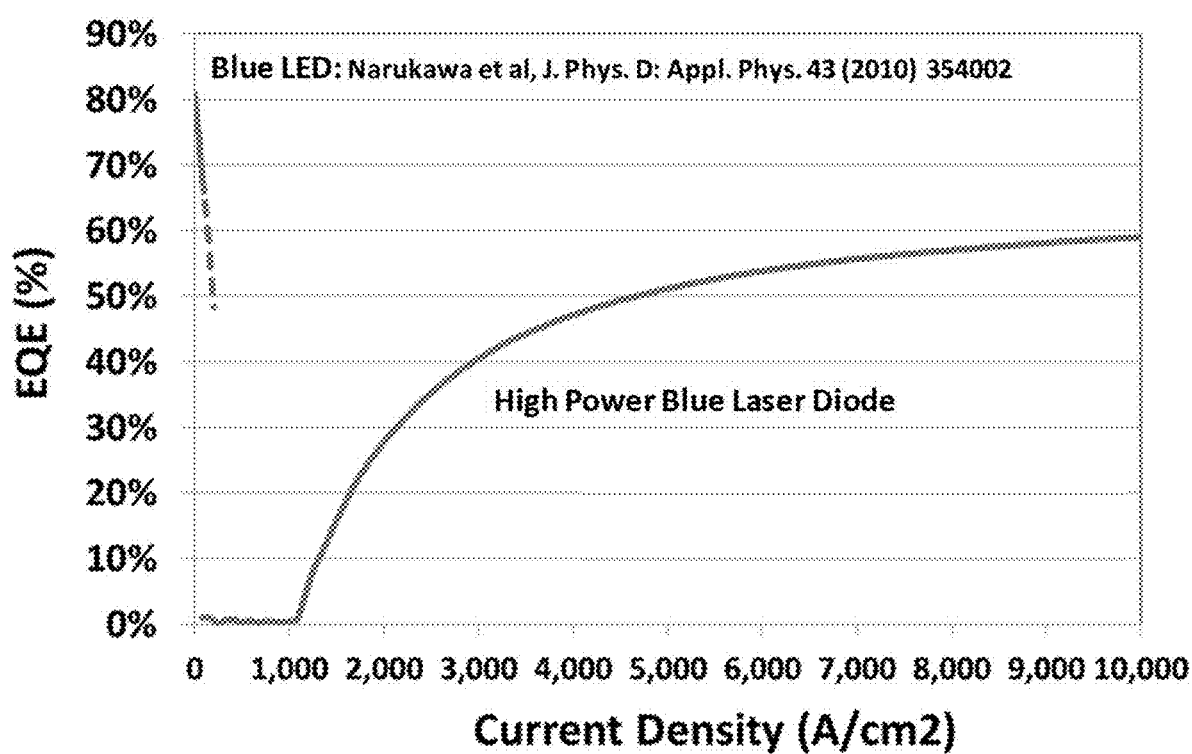
FIG. 2 is a plot of external quantum efficiency as a function of current density for a high-power blue laser diode compared to the high power blue light emitting diode.

At moderate carrier concentrations, spontaneous radiative recombination dominates such that IQE is relatively high. At high carrier concentrations, non-radiative auger recombination dominates such that IQE is again relatively low. In devices such as LDs or SLEDs, stimulated emission at very high carrier densities leads to a fourth regime where IQE is relatively high. FIG. 2 shows a plot of the external quantum efficiency [EQE] for a typical blue LED and for a high power blue laser diode. EQE is defined as the product of the IQE and the fraction of generated photons that are able to exit the device. While the blue LED achieves a very high EQE at very low current densities, it exhibits very low EQE at high current densities due to the dominance of auger recombination at high current densities. The LD, however, is dominated by stimulated emission at high current densities, and exhibits very high EQE. At low current densities, the LD has relatively poor EQE due to re-absorption of photons in the device. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm$^2$ to 30 mm$^2$ of epi area.

A second limitation of LEDs is also related to their brightness, more specifically it is related to their spatial brightness. A conventional high brightness LED emits ~1 W per mm$^2$ of epi area. With some advances and breakthrough this can be increased up to 5-10λ to 5-10 W per mm$^2$ of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 μm wide by about 0.5 μm tall, which equates to over 250,000 W/mm$^2$. This spatial brightness is over 5 orders of magnitude higher than LEDs or put another way, 10,000 times brighter than an LED.

Based on essentially all the pioneering work on GaN LEDs, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective laser-based remotely delivered white light source. In a specific embodiment, the present optical device can be manufactured in a relatively simple and cost-effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a laser chip on submount (CoS) with the laser light being delivered by a waveguide to a phosphor supported on a remotely disposed submount and/or a remote support member to form a remotely-delivered white light source. In some embodiments, the waveguide is a semiconductor waveguide integrated on a intermediate submount coupled with the CoS. In some embodiments the waveguide includes an optical fiber disposed substantially free in space or in custom layout, making the white light source a fiber-delivered white light source. In some embodiments the white light source includes beam collimation and focus elements to couple the laser light into the waveguide or fiber. In some embodiments, the white light source includes multiple laser chips either independently or co-packaged in a same package case and the phosphor member are supported in a separate submont heatsink packaged in a remote case. In some embodiments there could be additional beam shaping optical elements included for shaping or controlling the white light out of the phosphor.

In various embodiments, the laser device and phosphor device are separately packaged or mounted on respective support member and the phosphor materials are operated in a reflective mode to result in a white emitting laser-based light source. In additional various embodiments, the electromagnetic radiation from the laser device is remotely coupled to the phosphor device through means such as free space coupling or coupling with a waveguide such as a fiber optic cable or other solid waveguide material, and wherein the phosphor materials are operated in a reflective mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, autonomous vehicles, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 µm in diameter, less than 100 µm in diameter, or even less than 50 µm in diameter, power densities of over 1 W/mm$^2$, 100 W/mm$^2$, or even over 2,500 W/mm$^2$ can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 µm, or 50 µm, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In some embodiments of the present invention the gallium and nitrogen containing light emitting device may not be a laser device, but instead may be configured as a superluminescent diode or superluminescent light emitting diode (SLED) device. For the purposes of this invention, a SLED device and laser diode device can be used interchangeably. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. The advantage of a SLED device is that SLED it can combine the unique properties of high optical emission power and extremely high spatial brightness of laser diodes that make them ideal for highly efficient long throw illumination and high brightness phosphor excitation applications with a broad spectral width of (>5 nm) that provides for an improved eye safety and image quality in some cases. The broad spectral width results in a low coherence length similar to an LED. The low coherence length provides for an improved safety such has improved eye safety. Moreover, the broad spectral width can drastically reduce optical distortions in display or illumination applications. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width. In the present specification, both a laser diode (LD) device and a superluminescent light emitting diode (SLED) device are sometime simply referred to "laser device".

A gallium and nitrogen containing laser diode (LD) or super luminescent light emitting diode (SLED) may comprise at least a gallium and nitrogen containing device having an active region and a cavity member and are characterized by emitted spectra generated by the stimulated emission of photons. In some embodiments a laser device emitting red laser light, i.e. light with wavelength between about 600 nm to 750 nm, are provided. These red laser diodes may comprise at least a gallium phosphorus and arsenic containing device having an active region and a cavity member and are characterized by emitted spectra generated by the stimulated emission of photons. The ideal wavelength for a red device for display applications is ~635 nm, for green ~530 nm and for blue 440-470 nm. There may be tradeoffs between what colors are rendered with a display using different wavelength lasers and also how bright the display is as the eye is more sensitive to some wavelengths than to others.

In some embodiments according to the present invention, multiple laser diode sources are configured to excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Beyond scaling the power of each single laser diode emitter, the total luminous flux of the white light source can be increased by continuing to increase the total number of laser diodes, which can range from 10s, to 100s, and even to 1000s of laser diode emitters resulting in 10s to 100s of kW of laser diode excitation power. Scaling the number of laser diode emitters can be accomplished in many ways such as including multiple lasers in a co-package, spatial beam combining through conventional refractive optics or polarization combining, and others. Moreover, laser diode bars or arrays, and mini-bars can be utilized where each laser chip includes many adjacent laser diode emitters. For example, a bar could include from 2 to 100 laser diode emitters spaced from about 10 microns to about 400 microns apart. Similarly, the reliability of the source can be increased by using multiple sources at lower drive conditions to achieve the same excitation power as a single source driven at more harsh conditions such as higher current and voltage.

In a specific area of light source application is automobile headlamp. Semiconductor based light emitting diode (LED) headlight sources were fielded in 2004, the first solid-state sources. These featured high efficiency, reliability, and compactness, but the limited light output per device and brightness caused the optics and heat sinks to be still are quite large, and the elevated temperature requirements in auto applications were challenging. Color uniformity from the blue LED excited yellow phosphor needed managed with special reflector design. Single LED failure meant the entire headlamp needed to be scrapped, resulting in challenging costs for maintenance, repair, and warranty. Moreover, the LED components are based on spontaneous emission, and therefore are not conducive to high-speed modulation required for advanced applications such as 3D sensing (LiDAR), or optical communication (LiFi). The low luminance also creates challenges for spatially dynamic automotive lighting systems that utilize spatial modulators such as MEMS or liquid crystal devices. Semiconductor laser diode (LD) based headlights started production in 2014 based on laser pumped phosphor architectures, since direct emitting lasers such as R-G-B lasers are not safe to deploy onto the road and since R-G-B sources leave gaps in the spectrum that would leave common roadside targets such as yellow or orange with insufficient reflection back to the eye. Laser pumped phosphor are solid state light sources and therefore featured the same benefits of LEDs, but with higher brightness and range from more compact headlamp reflectors. Initially, these sources exhibited high costs, reduced reliability compared to LEDs, due to being newer technology. In some cases, the laser and phosphor were combined in a single unit, and in other cases, the blue laser light was delivered by fiber to a remotely disposed phosphor module to produce white light emission. Special precautions were needed to ensure safe white light emission occurred with passive and active safety measures. Color uniformity from the blue laser excited yellow phosphor needed managed with special reflector design.

In some embodiments, the invention described herein can be applied to a fiber delivered headlight comprised of one or more gallium and nitrogen containing visible laser diode for emitting laser light that is efficiently coupled into a waveguide (such as an optical fiber) to deliver the laser emission to a remote phosphor member configured on the other end of the optical fiber. The laser emission serves to excite the phosphor member and generate a high brightness white light. In a headlight application, the phosphor member and white light generation occurs in a final headlight module, from where the light is collimated and shaped onto the road to achieve the desired light pattern.

This disclosure utilizes fiber delivery of visible laser light from a gallium and nitrogen containing laser diode to a remote phosphor member to generate a white light emission with high luminance, and has several key benefits over other approaches. One advantage lies in production of controllable light output or amount of light for low beam or high beam using modular design in a miniature headlight module footprint. Another advantage is to provide high luminance and long range of visibility. For example, based on recent driving speeds and safe stopping distances, a range of 800 meters to 1 km is possible from a 200 lumens on the road using a size<35 mm optic structure with light sources that are 1000 cd per mm$^2$. Using higher luminance light sources allows one to achieve longer-range visibility for the same optics size. Further advantage of the fiber-delivered whitelight headlight is able to provide high contrast. It is important to minimize glare and maximize safety and visibility for drivers and others including oncoming traffic, pedestrians, animals, and drivers headed in the same direction traffic ahead. High luminance is required to produce sharp light gradients and the specific regulated light patterns for automotive lighting. Moreover, using a waveguide such as an optical fiber, extremely sharp light gradients and ultra-safe glare reduction can be generated by reshaping and projecting the decisive light cutoff that exists from core to cladding in the light emission profile.

Another advantage of the present invention is to provide rich spectrum white color light. Laser pumped phosphors are broadband solid-state light sources and therefore featured the same benefits of LEDs, but with higher luminance. Direct emitting lasers such as R-G-B lasers are not safe to deploy onto the road since R-G-B sources leave gaps in the spectrum that would leave common roadside targets such as yellow or orange with insufficient reflection back to the eye. Also, because of the remote nature of the light sources, the headlight module can be mounted onto a pre-existing heat sink with adequate thermal mass that is located anywhere in the vehicle, eliminating the need for heat sink in the headlight.

One big advantage is small form factor of the light source and a low-cost solution for swiveling the light for glare mitigation and enhancing aerodynamic performance. For example, miniature optics <1 cm in diameter in a headlight module can be utilized to capture nearly 100% of the light from the fiber. The white light can be collimated and shaped with tiny diffusers or simple optical elements to produce the desired beam pattern on the road. it is desired to have extremely small optics sizes for styling of the vehicle. Using higher luminance light sources allows one to achieve smaller optics sizes for the same range of visibility. This headlight design allows one to integrate the headlight module into the grill, onto wheel cover, into seams between the hood and front bumper, etc. This headlight design features a headlight module that is extremely low mass and lightweight, and therefore minimized weight in the front of the car, contributing to safety, fuel economy, and speed/acceleration performance. For electric vehicles, this translates to increased vehicle range. Moreover, the decoupled fiber delivered architecture use pre-existing heat sink thermal mass already in vehicle, further minimizing the weight in the car. Furthermore, this headlight module is based on solid-state light source, and has long lifetime >10,000 hours. Redundancy and interchangeability are straightforward by simply replacing the fiber-delivered laser light source.

Because of the fiber configuration in the design of the fiber-delivered laser-induced white light headlight module, reliability is maximized by positioning the laser-induced light source away from the hot area near engine and other heat producing components. This allows the headlight module to operate at extremely high temperatures >100° C., while the laser module can operate in a cool spot with ample heat sinking. In a specific embodiment, the present invention utilizes thermally stable, military standard style, telcordia type packaging technology. The only elements exposed to the front of the car are the complexly passive headlight module, comprised tiny macro-optical elements. There is no laser directly deployed in the headlight module, only incoherent white light and a reflective phosphor architecture inside. Direct emitting lasers such as R-G-B lasers are not safe to deploy onto the road at high power and are not used in this design. It is safe and cost efficient to assemble this fiber-delivered white light source into the car while manufacturing the vehicle.

In LED-based headlights, if one high power LED element dies, the entire headlamp is typically scrapped. The fiber-delivered headlight design enables "plug and play" replacement of the light source, eliminating wasted action of completely scrapping headlights due to a failed component.

The plug and play can occur without alignment, like replacing a battery, minimize warranty costs. This eliminates excessive replacement cost, customer wait times, dangerous driving conditions, and expensive loaner vehicles. Because of the ease of generating new light patterns, and the modular approach to lumen scaling, this fiber-delivered light source allows for changing lumens and beam pattern for any region without retooling for an entirely new headlamp. This convenient capability to change beam pattern can be achieved by changing tiny optics and or diffusers instead of retooling for new large reflectors. Moreover, the fiber-delivered white light source can be used in interior lights and daytime running lights (DRL), with transport or side emitting plastic optical fiber (POF).

Spatially dynamic beam shaping devices such as digital-light processing (DLP), liquid-crystal display (LCD), 1 or 2 MEMS or Galvo mirror systems, lightweight swivels, scanning fiber tips. Future spatially dynamic sources may require even brighter light, such as 5000-10000 lumens from the source, to produce high definition spatial light modulation on the road using MEMS or liquid crystal components. Such dynamic lighting systems are incredibly bulky and expensive when co-locating the light source, electronics, heat sink, optics, and light modulators, and secondary optics. Therefore, they require-fiber delivered high luminance white light to enable spatial light modulation in a compact and more cost effective manner.

A additional advantage of combining the emission from multiple laser diode emitters is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in an emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm, 10 nm, 15 nm, etc.) can be included to excite a yellow phosphor and create a larger blue spectrum.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k 1) plane wherein h=k=0, and 1 is non-zero), non-polar GaN substrates (i.e., substrate material where the largest area surface is oriented at an angle ranging from about 80-100 degrees from the polar orientation described above towards an (h k 1) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k 1) plane wherein l=0, and at least one of h and k is non-zero). Of course, there can be other variations, modifications, and alternatives.

The laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane. In some embodiments, a gallium and nitrogen containing laser diode laser diode comprises a gallium and nitrogen containing substrate. The substrate member may have a surface region on the polar {0001} plane (c-plane), nonpolar plane (m-plane, a-plane), and semipolar plain ({11-22}, {10-1-1}, {20-21}, {30-31}) or other planes of a gallium and nitrogen containing substrate. The laser device can be configured to emit a laser beam characterized by one or more wavelengths from about 390 nm to about 540 nm.

Figure 3:
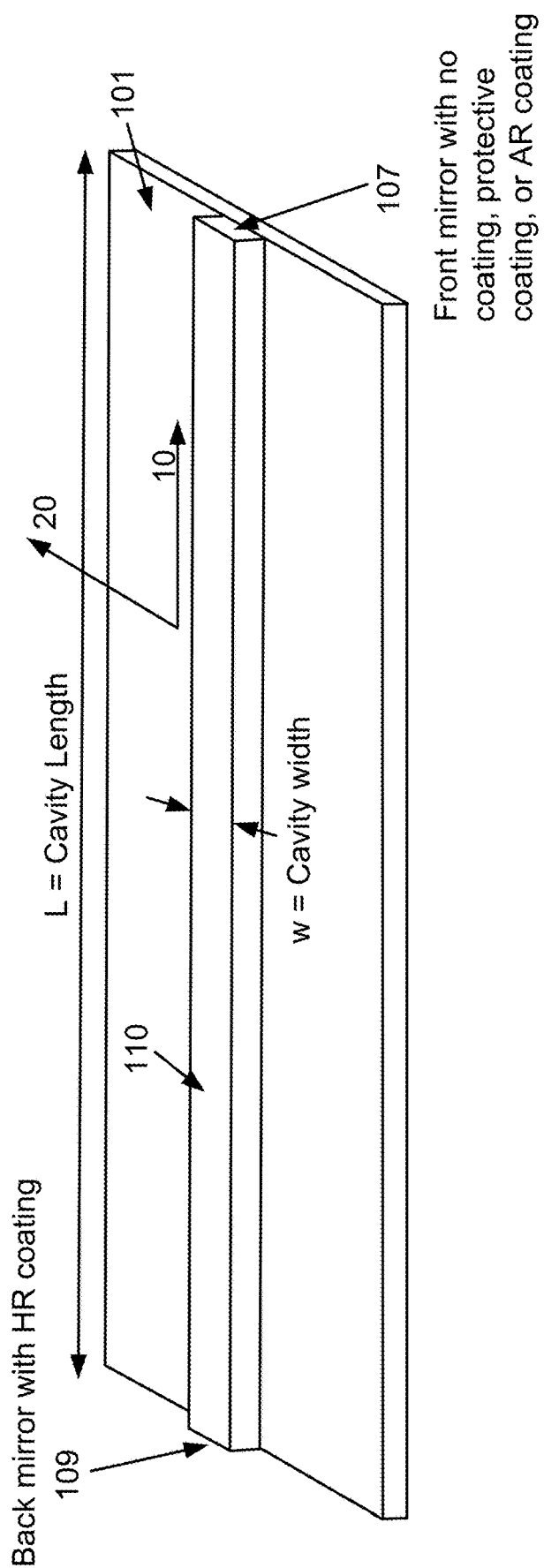
FIG. 3 is a simplified schematic diagram of a laser diode formed on a gallium and nitrogen containing substrate with the cavity aligned in a direction ended with cleaved or etched mirrors according to some embodiments of the present invention.

FIG. 3 is a simplified schematic diagram of a laser diode formed on a gallium and nitrogen containing substrate with the cavity aligned in a direction ended with cleaved or etched mirrors according to some embodiments of the present invention. In an example, the substrate surface 101 is a polar c-plane and the laser stripe region 110 is characterized by a cavity orientation substantially in an m-direction 10, which is substantially normal to an a-direction 20, but can be others such as cavity alignment substantially in the a-direction. The laser strip region 110 has a first end 107 and a second end 109 and is formed on an m-direction on a {0001} gallium and nitrogen containing substrate having a pair of cleaved or etched mirror structures, which face each other. In another example, the substrate surface 101 is a semipolar plane and the laser stripe region 110 is characterized by a cavity orientation substantially in a projection of a c-direction 10, which is substantially normal to an a-direction 20, but can be others such as cavity alignment substantially in the a-direction. The laser strip region 110 has a first end 107 and a second end 109 and is formed on an semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. Optionally, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may comprise $Al_xIn_yGa_{1-x-y}N$, where 0≤x, y, x+y≤1. In one specific embodiment, the nitride crystal comprises GaN. In some embodiments, the GaN substrate has threading dislocations, at a concentration between about $10^5$ cm$^{-2}$ and about $10^8$ cm$^{-2}$, in a direction that is substantially orthogonal or oblique with respect to the surface.

The exemplary laser diode devices in FIG. 3 have a pair of cleaved or etched mirror structures 109 and 107, which face each other. The first cleaved or etched facet 109 comprises a reflective coating and the second cleaved or etched facet 107 comprises no coating, an antireflective coating, or exposes gallium and nitrogen containing material. The first cleaved or etched facet 109 is substantially parallel with the second cleaved or etched facet 107. The first and second cleaved facets 109 and 107 are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The reflective coating is selected from silicon dioxide, hafnia, and titania, tantalum pentoxide, zirconia, aluminum oxide, aluminum nitride, and aluminum oxynitride including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for a ridge laser. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In some embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe 110 is characterized by a length and width. The length ranges from about 50 µm to about 3000 µm, but is preferably between about 10 µm and about 400 µm, between about 400 µm and about 800 µm, or about 800 µm and about 1600 µm, but could be others. The stripe also has a width ranging from about 0.5 µm to about 50 µm, but is preferably between about 0.8 µm and about 2.5 µm for single lateral mode operation or between about 2.5 µm and about 50 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 50 µm, and others. In a specific embodiment, the width is substantially constant in dimension, although there may be slight variations. The width and length are often formed using a masking and etching process, which are commonly used in the art.

The laser stripe region 110 is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

In a specific embodiment, the laser device may emit red light with a center wavelength between 600 nm and 750 nm. Such a device may comprise layers of varying compositions of $Al_xIn_yGa_{1-x-y}As_zP_{1-z}$, where $x+y\leq 1$ and $z\leq 1$. The red laser device comprises at least an n-type and p-type cladding layer, an n-type SCH of higher refractive index than the n-type cladding, a p-type SCH of higher refractive index than the p-type cladding and an active region where light is emitted. In a specific embodiment, the laser stripe is provided by an etching process selected from dry etching or wet etching. In a preferred embodiment, the etching process is dry, but can be others. The device also has an overlying dielectric region, which exposes the contact region. In a specific embodiment, the dielectric region is an oxide such as silicon dioxide, but can be others. Of course, there can be other variations, modifications, and alternatives. The laser stripe is characterized by a length and width. The length ranges from about 50 µm to about 3000 µm, but is preferably between 10 µm and 400 µm, between about 400 µm and 800 µm, or about 800 µm and 1600 µm, but could be others such as greater than 1600 µm. The stripe also has a width ranging from about 0.5 µm to about 80 µm, but is preferably between 0.8 µm and 2.5 µm for single lateral mode operation or between 2.5 µm and 60 µm for multi-lateral mode operation, but can be other dimensions. The laser strip region has a first end and a second end having a pair of cleaved or etched mirror structures, which face each other. The first facet comprises a reflective coating and the second facet comprises no coating, an antireflective coating, or exposes gallium and nitrogen containing material. The first facet is substantially parallel with the second cleaved or etched facet.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

Similar to an edge emitting laser diode, a SLED is typically configured as an edge-emitting device wherein the high brightness, highly directional optical emission exits a waveguide directed outward from the side of the semiconductor chip. SLEDs are designed to have high single pass gain or amplification for the spontaneous emission generated along the waveguide. However, unlike laser diodes, they are designed to provide insufficient feedback to in the cavity to achieve the lasing condition where the gain equals the total losses in the waveguide cavity. In a typical example, at least one of the waveguide ends or facets is designed to provide very low reflectivity back into the waveguide. Several methods can be used to achieve reduced reflectivity on the waveguide end or facet. In one approach an optical coating is applied to at least one of the facets, wherein the optical coating is designed for low reflectivity such as less than 1%, less than 0.1%, less than 0.001%, or less than 0.0001% reflectivity. In another approach for reduced reflectivity the waveguide ends are designed to be tilted or angled with respect to the direction of light propagation such that the light that is reflected back into the chip does not constructively interfere with the light in the cavity to provide feedback. The tilt angle must be carefully designed around a null in the reflectivity versus angle relationship for optimum performance. The tilted or angled facet approach can be achieved in a number of ways including providing an etched facet that is designed with an optimized angle lateral angle with respect to the direction of light propagation. The angle of the tilt is pre-determined by the lithographically defined etched facet patter. Alternatively, the angled output could be achieved by curving and/or angling the waveguide with respect to a cleaved facet that forms on a pre-determined crystallographic plane in the semiconductor chip. Another approach to reduce the reflectivity is to provide a roughened or patterned surface on the facet to reduce the feedback to the cavity. The roughening could be achieved using chemical etching and/or a dry etching, or with an alternative technique. Of course, there may be other methods for reduced feedback to the cavity to form a SLED device. In many embodiments a number of techniques can be used in combination to reduce the facet reflectivity including using low reflectivity coatings in combination with angled or tilted output facets with respect to the light propagation.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with a of the following epitaxially grown elements:

an n-GaN or n-AlGaN cladding layer with a thickness from 100 nm to 3000 nm with Si doping level of $5 \times 10^{17}$ $cm^{-3}$ to $3 \times 10^{18}$ $cm^{-3}$;

an n-side SCH layer comprised of InGaN with molar fraction of indium of between 2% and 15% and thickness from 20 nm to 250 nm;

a single quantum well or a multiple quantum well active region comprised of at least two 2.0 nm to 8.5 nm InGaN quantum wells separated by 1.5 nm and greater, and optionally up to about 12 nm, GaN or InGaN barriers;

a p-side SCH layer comprised of InGaN with molar a fraction of indium of between 1% and 10% and a thickness from 15 nm to 250 nm or an upper GaN-guide layer;

an electron blocking layer comprised of AlGaN with molar fraction of aluminum of between 0% and 22% and thickness from 5 nm to 20 nm and doped with Mg;

a p-GaN or p-AlGaN cladding layer with a thickness from 400 nm to 1500 nm with Mg doping level of $2 \times 10^{17}$ $cm^{-3}$ to $2 \times 10^{19}$ cm–3; and a $p^{++}$-GaN contact layer with a thickness from 20 nm to 40 nm with Mg doping level of $1 \times 10^{19}$ $cm^{-3}$ to $1 \times 10^{21}$ $cm^{-3}$.

A gallium and nitrogen containing laser diode laser device may also include other structures, such as a surface ridge architecture, a buried heterostructure architecture, and/or a plurality of metal electrodes for selectively exciting the active region. For example, the active region may comprise first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material. In a specific embodiment, the device also has an overlying n-type gallium nitride layer, an active region, and an overlying p-type gallium nitride layer structured as a laser stripe region. Additionally, the device may also include an n-side separate confinement heterostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about $10^{19}$ to $10^{21}$ Mg/am$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$.

Figure 4:
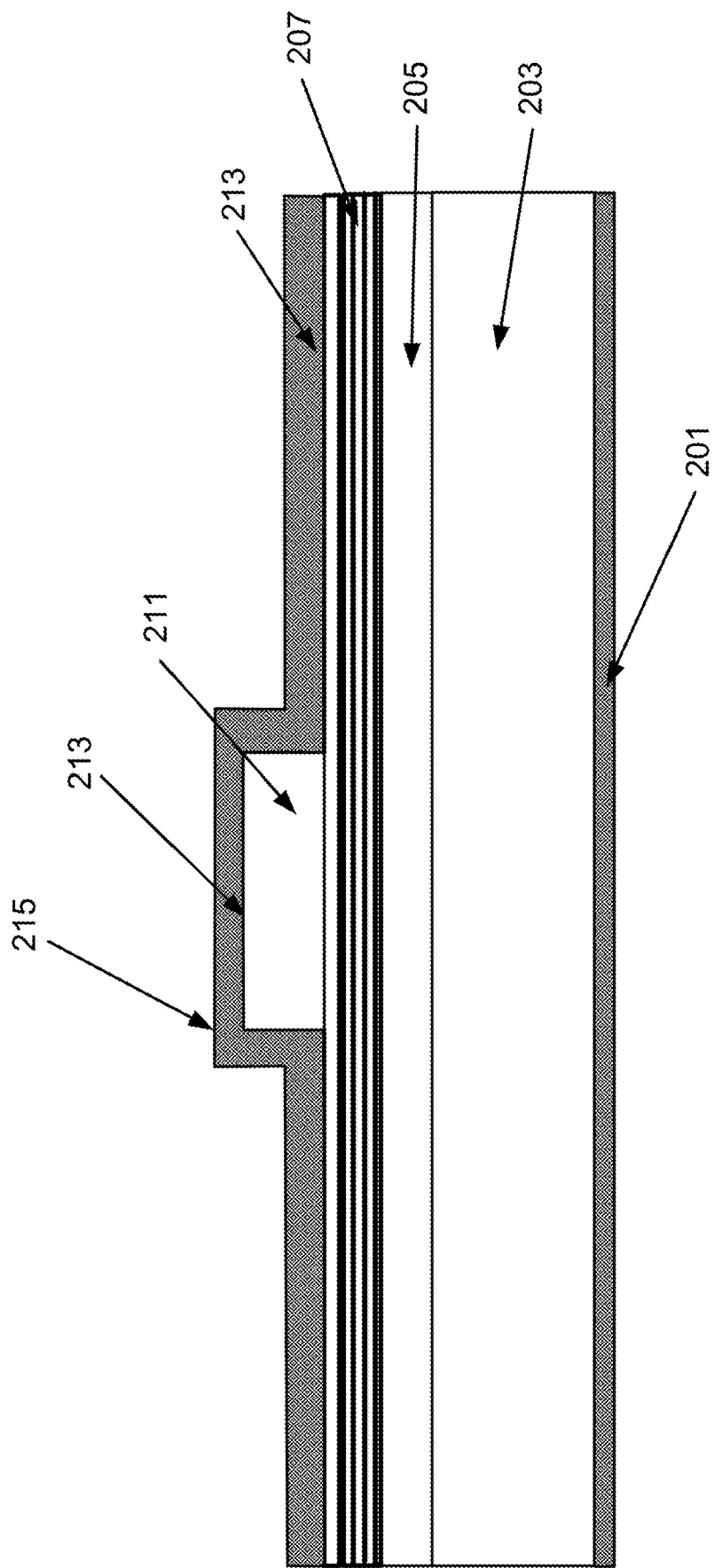
FIG. 4 is a cross-sectional view of a laser device according to an embodiment of the present invention.

FIG. 4 is a cross-sectional view of a laser device 200 according to some embodiments of the present disclosure. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of metal organic chemical vapor deposition (MOCVD), molecular beam epitaxy (MBE), or other epitaxial growth techniques suitable for GaN growth. The epitaxial layer is a high-quality epitaxial layer overlying the n-type gallium nitride layer. In some embodiments the high-quality layer is doped, for example, with Si or O to form n-type material, with a dopant concentration between about $10^{16}$ cm$^{-3}$ and $10^{20}$ cm$^{-3}$.

An n-type $Al_uIn_vGa_{1-u-v}N$ layer, where $0 \le u$, v, $u+v \le 1$, is deposited on the substrate. The carrier concentration may lie in the range between about $10^{16}$ cm$^{-3}$ and $10^{20}$ cm$^{-3}$. The deposition may be performed using metalorganic chemical vapor deposition (MOCVD) or molecular beam epitaxy (MBE).

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may comprise hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes a contact region 213. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof. In some embodiments, barrier layers and more complex metal stacks are included.

Active region 207 preferably includes one to ten quantum-well regions or a double heterostructure region for light emission. Following deposition of the n-type layer to achieve a desired thickness, an active layer is deposited. The quantum wells are preferably InGaN with GaN, AlGaN, InAlGaN, or InGaN barrier layers separating them. In other embodiments, the well layers and barrier layers comprise $Al_wIn_xGa_{1-w-x}N$ and $Al_yIn_zGa_{1-y-z}N$, respectively, where $0 \le w$, x, y, z, $w+x$, $y+z \le 1$, where $w<u$, y and/or $x>v$, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may comprise $Al_sIn_tGa_{1-s-t}N$, where $0 \le s$, t, $s+t \le 1$, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes the contact region 213.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIG. 3 and FIG. 4 and described above are typically suitable for low-power applications.

In various embodiments, the present invention realizes high output power from a diode laser is by widening a portion of the laser cavity member from the single lateral mode regime of 1.0-3.0 μm to the multi-lateral mode range 5.0-20 μm. In some cases, laser diodes having cavities at a width of 50 μm or greater are employed.

The laser stripe length, or cavity length ranges from 100 to 3000 μm and employs growth and fabrication techniques such as those described in U.S. patent application Ser. No.

12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

Optionally, FIG. 4 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlInGaN, or InGaN and n-type cladding layers comprised of GaN, AlGaN, or AlInGaN. The n-typed layers may have thickness in the range of 0.3 μm to about 3 μm or to about 5 μm and may be doped with an n-type carrier such as Si or O to concentrations between $1 \times 10^{16}$ cm$^{-3}$ to $1 \times 10^{19}$ cm$^{-3}$. Overlying the n-type layers is the active region and waveguide layers 207. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlInGaN, or a combination thereof. The thickness of the p-type cladding layers is in the range of 0.3 μm to about 2 μm and is doped with Mg to a concentration of between $1 \times 10^{16}$ cm$^{-3}$ to $1 \times 10^{19}$ cm$^{-3}$. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing a of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing Au, Al, Pd, Pt, Ni, Ti, or Ag and may be deposited with electron beam deposition, sputter deposition, or thermal evaporation.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode.

In an embodiment, the LD or SLED device is characterized by a ridge with non-uniform width. The ridge is comprised by a first section of uniform width and a second section of varying width. The first section has a length between 100 and 500 μm long, though it may be longer. The first section has a width of between 1 and 2.5 μm, with a width preferably between 1 and 1.5 μm. The second section of the ridge has a first end and a second end. The first end connects with the first section of the ridge and has the same width as the first section of the ridge. The second end of the second section of the ridge is wider than the first section of the ridge, with a width between 5 and 50 μm and more preferably with a width between 15 and 35 μm. The second section of the ridge waveguide varies in width between its first and second end smoothly. In some embodiments the second derivative of the ridge width versus length is zero such that the taper of the ridge is linear. In some embodiments, the second derivative is chosen to be positive or negative. In general, the rate of width increase is chosen such that the ridge does not expand in width significantly faster than the optical mode. In specific embodiments, the electrically injected area is patterned such that only a part of the tapered portion of the waveguide is electrically injected.

In an embodiment, multiple laser dice emitting at different wavelengths are transferred to the same carrier wafer in close proximity to one another; preferably within one millimeter of each other, more preferably within about 200 micrometers of each other and most preferably within about 50 μm of each other. The laser die wavelengths are chosen to be separated in wavelength by at least twice the full width at half maximum of their spectra. For example, three dice, emitting at 440 nm, 450 nm and 460 nm, respectively, are transferred to a single carrier chip with a separation between die of less than 50 μm and die widths of less than 50 μm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based visible light communication (VLC) source in that bandwidth would scale easily with the number of laser emitters. Of course, a similar embodiment with similar advantages could be constructed from SLED emitters.

After the laser diode chip fabrication as described above, the laser diode can be mounted to a submount. In some examples the submount is comprised of AlN, SiC, BeO, diamond, or other materials such as metals, ceramics, or composites. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 µm to about 2 mm. In the example wherein the submount is an intermediate submount between the laser diode chip and the common support member it could be characterized by width and length ranging in dimension from about 0.5 mm to about 5 mm and the thickness may range from about 50 µm to about 500 µm. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 5:
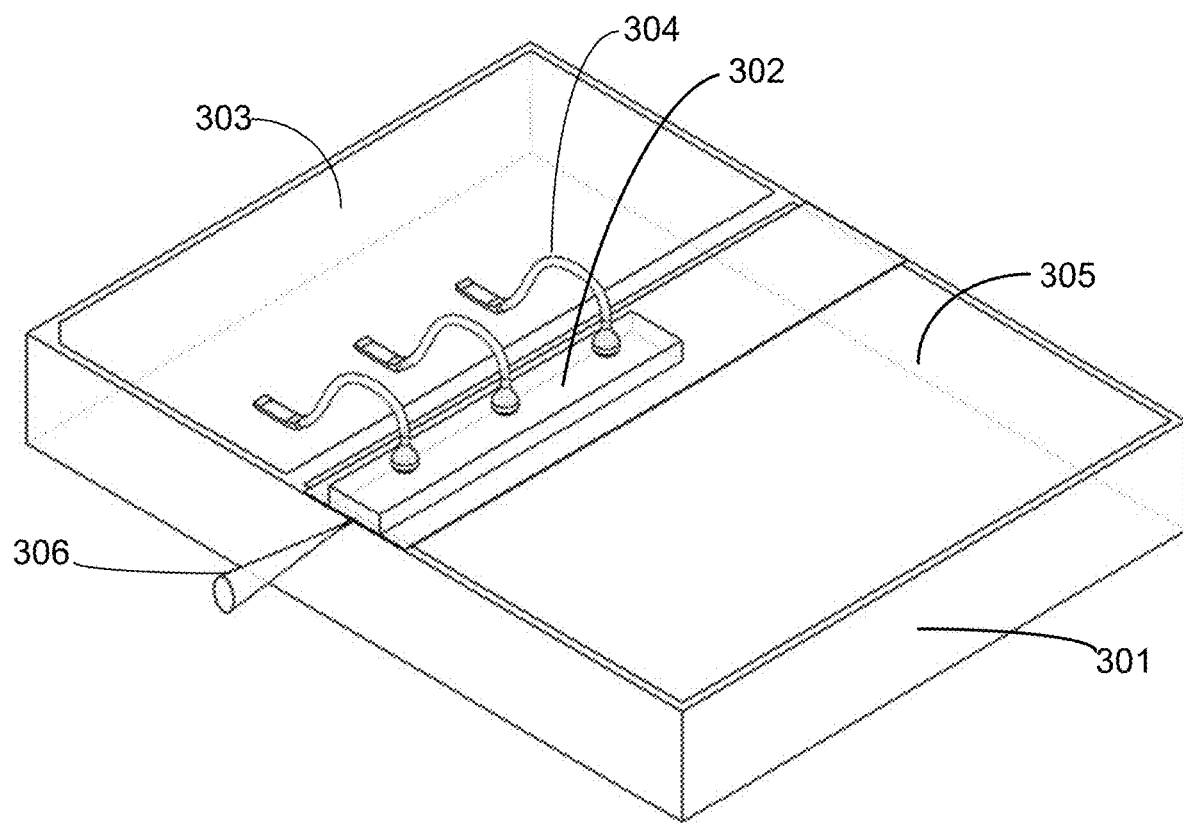
FIG. 5 is a schematic diagram illustrating a chip on submount (CoS) based on a conventional laser diode formed on gallium and nitrogen containing substrate technology according to an embodiment of the present invention.

A schematic diagram illustrating a CoS based on a conventional laser diode formed on gallium and nitrogen containing substrate technology according to this present invention is shown in FIG. 5. The CoS is comprised of submount material 301 configured to act as an intermediate material between a laser diode chip 302 and a final mounting surface. The submount is configured with electrodes 303 and 305 that may be formed with deposited metal layers such as Au. In one example, Ti/Pt/Au is used for the electrodes. Wirebonds 304 are configured to couple the electrical power from the electrodes 303 and 305 on the submount to the laser diode chip to generate a laser beam output 306 from the laser diode. The electrodes 303 and 305 are configured for an electrical connection to an external power source such as a laser driver, a current source, or a voltage source. Wirebonds 304 can be formed on the electrodes to couple electrical power to the laser diode device and activate the laser.

In another embodiment, the gallium and nitrogen containing laser diode fabrication includes an epitaxial release step to lift off the epitaxially grown gallium and nitrogen layers and prepare them for transferring to a carrier wafer which could comprise the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In this embodiment, gallium and nitrogen containing epitaxial layers are grown on a bulk gallium and nitrogen containing substrate. The epitaxial layer stack comprises at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to a carrier wafer. In one embodiment, a bonding material is deposited on the surface overlying the semiconductor device layers. A bonding material is also deposited either as a blanket coating or patterned on the carrier wafer. Standard lithographic processes are used to selectively mask the semiconductor device layers. The wafer is then subjected to an etch process such as dry etch or wet etch processes to define via structures that expose the sacrificial layers on the sidewall of the mesa structure. As used herein, the term mesa region or mesa is used to describe the patterned epitaxial material on the gallium and nitrogen containing substrate and prepared for transferring to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the sacrificial layers while leaving the semiconductor device layers intact. The resulting structure comprises undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

In a preferred embodiment, a semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning comprises a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below a sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 µm to about 500 µm or to about 5000 µm. Each of these mesas is a 'die'.

In a preferred embodiment, these dice are transferred to a carrier wafer at a second pitch using a selective bonding process such that the second pitch on the carrier wafer is greater than the first pitch on the gallium and nitrogen containing substrate. In this embodiment the dice are on an expanded pitch for so called "die expansion". In an example, the second pitch is configured with the dice to allow each die with a portion of the carrier wafer to be a semiconductor device, including contacts and other components. For example, the second pitch would be about 50 µm to about 1000 µm or to about 5000 µm, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 6:
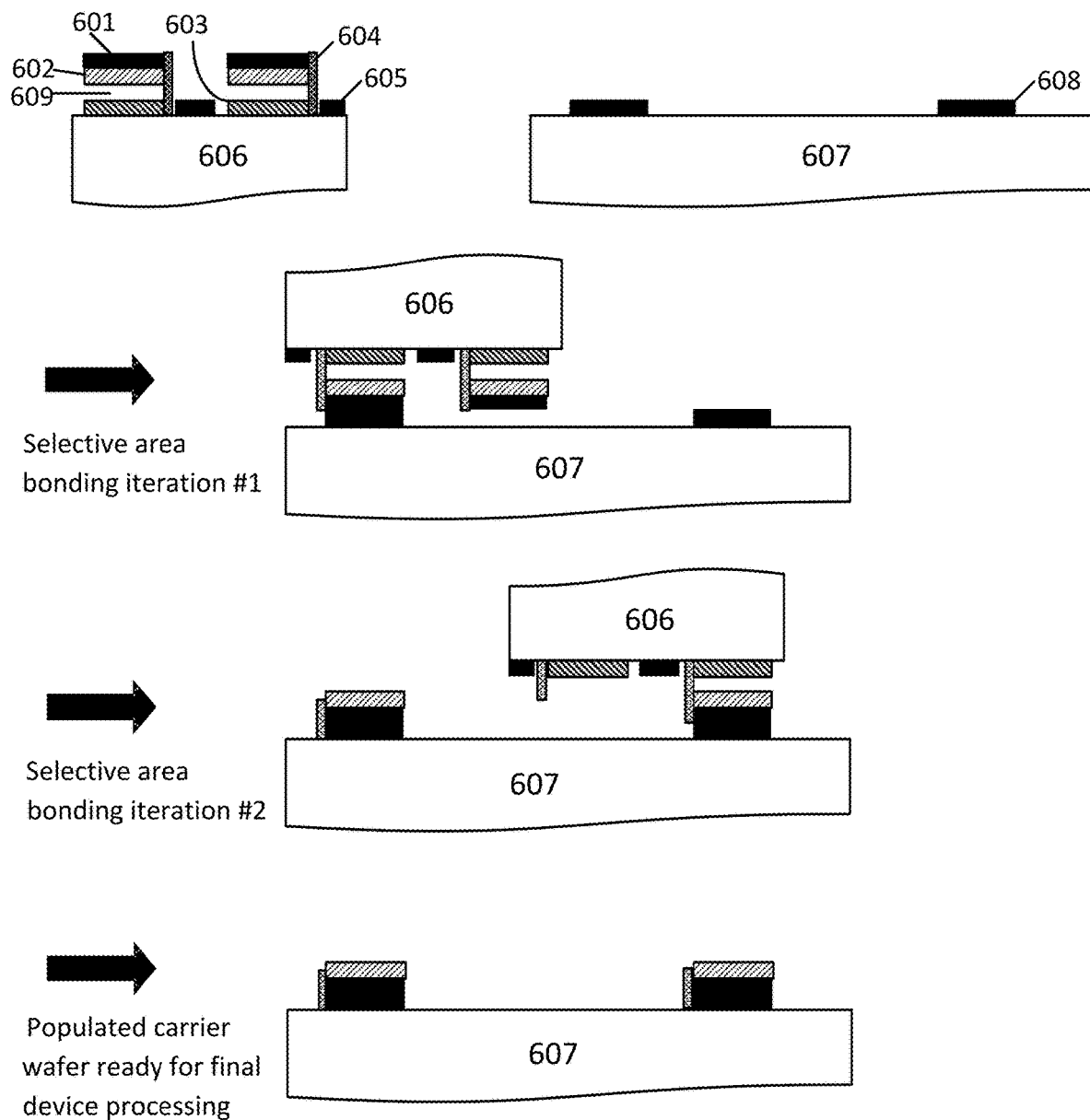
FIG. 6 is a schematic representation of the die expansion process with selective area bonding according to some embodiments of the present invention.

FIG. 6 is a schematic representation of the die expansion process with selective area bonding according to the present invention. A device wafer is prepared for bonding in accordance with an embodiment of this invention. The device wafer consists of a substrate 606, buffer layers 603, a fully removed sacrificial layer 609, device layers 602, bonding media 601, cathode metal 605, and an anchor material 604. The sacrificial layer 609 is removed in the PEC etch with the anchor material 604 is retained. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer substrate 607 and bond pads 608 at second pitch. The substrate 606 is aligned to the carrier wafer 607 such that a subset of the mesa on the gallium and nitrogen containing substrate 606 with a first pitch aligns with a subset of bond pads 608 on the carrier wafer 607 at a second pitch. Since the first pitch is greater than the second pitch and the mesas will comprise device die, the basis for die expansion is established. The bonding process is carried out and upon separation of the substrate from the carrier wafer 607 the subset of mesas on the substrate 606 are selectively transferred to the carrier wafer 607. The process is then repeated with a second set of mesas and bond pads 608 on the carrier wafer 607 until the carrier wafer 607 is populated fully by epitaxial mesas. The gallium and nitrogen containing epitaxy substrate 201 can now optionally be prepared for reuse.

In the example depicted in FIG. 6, one quarter of the epitaxial dice on the epitaxy wafer 606 are transferred in this first selective bond step, leaving three quarters on the epitaxy wafer 606. The selective area bonding step is then repeated to transfer the second quarter, third quarter, and fourth quarter of the epitaxial die to the patterned carrier wafer 607. This selective area bond may be repeated any number of times and is not limited to the four steps depicted in FIG. 6. The result is an array of epitaxial die on the carrier wafer 607 with a wider die pitch than the original die pitch on the epitaxy wafer 606. The die pitch on the epitaxial wafer 606 will be referred to as pitch 1, and the die pitch on the carrier wafer 607 will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial dice which are in contact with a bond bad 608 on the carrier wafer 607 will bond. Sub-micron alignment tolerances are possible on commercial die bonders. The epitaxy wafer 606 is then pulled away, breaking the epitaxy material at a weakened epitaxial release layer 609 such that the desired epitaxial layers remain on the carrier wafer 607. Herein, a 'selective area bonding step' is defined as a single iteration of this process.

In one embodiment, the carrier wafer 607 is patterned in such a way that only selected mesas come in contact with the metallic bond pads 608 on the carrier wafer 607. When the epitaxy substrate 606 is pulled away the bonded mesas break off at the weakened sacrificial region, while the un-bonded mesas remain attached to the epitaxy substrate 606. This selective area bonding process can then be repeated to transfer the remaining mesas in the desired configuration. This process can be repeated through any number of iterations and is not limited to the two iterations depicted in FIG. 6. The carrier wafer can be of any size, including but not limited to about 2 inch, 3 inch, 4 inch, 6 inch, 8 inch, and 12 inch. After all desired mesas have been transferred, a second bandgap selective PEC etching can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 µm and about 500 µm wide or between about 500 µm and about 3000 µm wide and between about 100 and about 3000 µm long. In an example, the second die pitch on the carrier wafer is between about 100 µm and about 200 µm or between about 200 µm and about 1000 µm or between about 1000 µm and about 3000 µm. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring dice at close spacing from multiple epitaxial wafers, it is important for the un-transferred dice on the epitaxial wafer to not inadvertently contact and bond to die already transferred to the carrier wafer. To achieve this, epitaxial dice from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the dice from the second epitaxial wafer. A second epitaxial wafer transfers a second set of dice to the carrier wafer. Finally, the semiconductor devices are fabricated, and passivation layers are deposited followed by electrical contact layers that allow each die to be individually driven. The dice transferred from the first and second substrates are spaced at a pitch which is smaller than the second pitch of the carrier wafer. This process can be extended to transfer of dice from any number of epitaxial substrates, and to transfer of any number of devices per dice from each epitaxial substrate.

Figure 7:
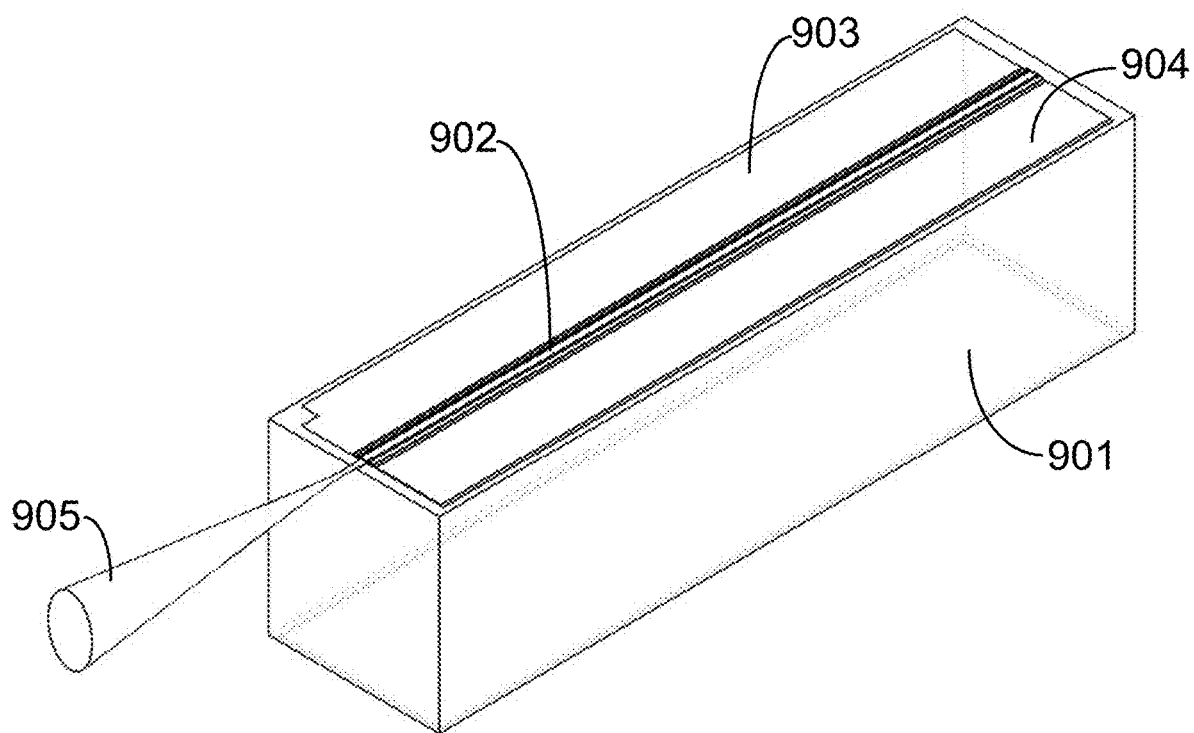
FIG. 7 is a schematic diagram illustrating a CoS based on lifted off and transferred epitaxial gallium and nitrogen containing layers according to an embodiment of this present invention.

A schematic diagram illustrating a CoS based on lifted off and transferred epitaxial gallium and nitrogen containing layers according to this present invention is shown in FIG. 7. The CoS is comprised of submount material 901 configured from the carrier wafer with the transferred epitaxial material with a laser diode configured within the epitaxy 902. Electrodes 903 and 904 are electrically coupled to the n-side and the p-side of the laser diode device and configured to transmit power from an external source to the laser diode to generate a laser beam output 905 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration such as size, cost, and performance due to the low thermal impedance.

Further process and device description for this embodiment describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

Phosphor selection is a key consideration within the laser based integrated white light source. The phosphor must be able to withstand the extreme optical intensity and associated heating induced by the laser excitation spot without severe degradation. Important characteristics to consider for phosphor selection include:

A high conversion efficiency of optical excitation power to white light lumens. In the example of a blue laser diode exciting a yellow phosphor, a conversion efficiency of over 150 lumens per optical watt, or over 200 lumens per optical watt, or over 300 lumens per optical watt is desired.

A high optical damage threshold capable of withstanding 1-20 W of laser power in a spot comprising a diameter of 1 mm, 500 µm, 200 µm, 100 µm, or even 50 µm.

High thermal damage threshold capable of withstanding temperatures of over 150° C., over 200° C., or over 300° C. without decomposition.

A low thermal quenching characteristic such that the phosphor remains efficient as it reaches temperatures of over 150° C., 200° C., or 250° C.

A high thermal conductivity to dissipate the heat and regulate the temperature. Thermal conductivities of greater than 3 W/m-K, greater than 5 W/m-K, greater than 10 W/m-K, and even greater than 15 W/m-K are desirable.

A proper phosphor emission color for the application.

A suitable porosity characteristic that leads to the desired scattering of the coherent excitation without unacceptable reduction in thermal conductivity or optical efficiency.

A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.

A surface condition optimized for the application. In an example, the phosphor surfaces can be intentionally roughened for improved light extraction.

In a preferred embodiment, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase out-coupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, ceramic yttrium aluminum garnets (YAG) doped with $Ce^{3+}$ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:Ce can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt. Additionally, the ceramic YAG:Ce phosphors is characterized by a temperature quenching characteristics above 150° C., above 200° C., or above 250° C. and a high thermal conductivity of 5-10 W/m-K to effectively dissipate heat to a heat sink member and keep the phosphor at an operable temperature.

In another preferred embodiment according to this invention, the white light source is configured with a single crystal phosphor (SCP) such as YAG:Ce. In one example the $Ce:Y_3Al_5O_{12}$ SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt. Additionally, the single crystal YAG:Ce phosphors is characterized by a temperature quenching characteristics above 150° C., above 200° C., or above 300° C. and a high thermal conductivity of 8-20 W/m-K to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:Ce can be configured to emit a yellow emission. In alternative or the same embodiments a YAG:Ce can be configured to emit a green emission. In yet alternative or the same embodiments the YAG can be doped with Eu to emit a red emission. In some embodiments a LuAG is configured for emission. In alternative embodiments, silicon nitrides or aluminum-oxi-nitrides can be used as the crystal host materials for red, green, yellow, or blue emissions.

In an alternative embodiment, a powdered single crystal or ceramic phosphor such as a yellow phosphor or green phosphor is included. The powdered phosphor can be dispensed on a transparent member for a transmissive mode operation or on a solid member with a reflective layer on the back surface of the phosphor or between the phosphor and the solid member to operate in a reflective mode. The phosphor powder may be held together in a solid structure using a binder material wherein the binder material is preferable in inorganic material with a high optical damage threshold and a favorable thermal conductivity. The phosphor power may be comprised of a colored phosphor and configured to emit a white light when excited by and combined with the blue laser beam or excited by a violet laser beam. The powdered phosphors could be comprised of YAG, LuAG, or other types of phosphors.

In one embodiment of the present invention the phosphor material contains a yttrium aluminum garnet host material and a rare earth doping element, and others. In an example, the wavelength conversion element is a phosphor which contains a rare earth doping element, selected from a of Ce, Nd, Er, Yb, Ho, Tm, Dy and Sm, combinations thereof, and the like. In an example, the phosphor material is a high-density phosphor element. In an example, the high-density phosphor element has a density greater than 90% of pure host crystal. Cerium (III)-doped YAG (YAG:$Ce^{3+}$, or $Y_3Al_5O_{12}$:$Ce^{3+}$) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (bluish) white. The yellow emission of the $Ce^{3+}$:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with $Ce^{3+}$ ions $(Y_{1-a}Gd_a)_3(Al_{1-b}Ga_b)_5O_{12}$:$Ce^{3+}$, $SrGa_2S_4$:$Eu^{2+}$, SrS:$Eu^{2+}$, terbium aluminum based garnets (TAGs) ($Tb_3Al_5O_5$), colloidal quantum dot thin films containing CdTe, ZnS, ZnSe, ZnTe, CdSe, or CdTe.

In further alternative examples, some rare-earth doped SiAlONs can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red $CaAlSiN_3$-based (CASN) phosphor may be used.

In yet a further example, white light sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from a of (Y, Gd, Tb, Sc, Lu, La)$_3$(Al, Ga, In)$_5O_{12}$: $Ce^{3+}$, $SrGa_2S_4$:$Eu^{2+}$, SrS:$Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from a of the group consisting of $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd, Y,Lu,La)VO_4$: $Eu^{3+}$, $Bi^{3+}$; $Y_2(O,S)_3$:$Eu^{3+}$; $Ca_{1-x}Mo_{1-y}Si_yO_4$: where 0.05<x<0.5, 0<y<0.1; $(Li,Na,K)_5Eu(W,Mo)O_4$; (Ca,Sr)S:$Eu^{2+}$; $SrY_2S_4$:$Eu^{2+}$; $CaLa_2S_4$:$Ce^{3+}$; (Ca,Sr)S:$Eu^{2+}$; $3.5MgO \times 0.5MgF_2 \times GeO_2$:$Mn^{4+}$ (MFG); (Ba,Sr,Ca)$Mg_xP_2O_7$:$Eu^{2+}$, $Mn^{2+}$; $(Y,Lu)_2WO_6$:$Eu^{3+}$, $Mo^{6+}$; (Ba,Sr, Ca)$_3$ $Mg_xSi_2O_8$:$Eu^{2+}$, $Mn^{2+}$, wherein 1<x<2; $(RE_{1-y}Ce_y)$ $Mg_{2-x}Li_xSi_{3-x}P_xO_{12}$, where RE is at least one of Sc, Lu, Gd, Y, and Tb, 0.0001<x<0.1 and 0.001<y<0.1; (Y, Gd, Lu, La)$_{2-x}Eu_xW_{1-y}Mo_yO_6$, where 0.5<x<1.0, 0.01<y<1.0; $(SrCa)_{1-x}Eu_xSi_5N_8$, where 0.01<x<0.3; $SrZnO_2$:$Sm^{+3}$; $M_mO_nX$, wherein M is selected from the group of Sc, Y, a lanthanide, an alkali earth metal and mixtures thereof; X is a halogen; 1<m<3; and 1<n<4, and wherein the lanthanide doping level can range from 0.1 to 40% spectral weight; and $Eu^{3+}$ activated phosphate or borate phosphors; and mixtures thereof. Further details of other phosphor species and related techniques can be found in U.S. Pat. No. 8,956,894, in the name of Raring et al. issued Feb. 17, 2015, and titled "White light devices using non-polar or semipolar gallium containing materials and phosphors", which is commonly owned, and hereby incorporated by reference herein.

In some embodiments of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the integrated white light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 1 W to 100 W range focused to spot sizes of less than 1 mm in diameter, less than 500 μm in diameter, or even less than 100 μm in diameter, power densities of over 1 W/mm$^2$, 100 W/mm$^2$, or even over 2,500 W/mm$^2$ can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm$^2$, 10 W/mm$^2$, or even over 250 W/mm$^2$. Thus, even for this best-case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is attached to a remote submount member that is packaged in a separate assembly. In some embodiments, a heatsink can be used to support the phosphor for release heat generated during wavelength conversion. Ideally the phosphor bond interface will have a substantially large area with a flat surface on both the phosphor side and the support member sides of the interface.

In the present invention, the laser diode output beam must be configured to be incident on the phosphor material to excite the phosphor. In some embodiments the laser beam may be directly incident on the phosphor and in other embodiments the laser beam may interact with an optic, reflector, waveguide, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

In some embodiments, the apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The white light apparatus also has an electrical input interface configured to couple electrical input power to the laser diode device to generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 1000 lumens, 10,000 lumens, or greater of white light output.

The support member is configured to transport thermal energy from the at least one laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(m-K), aluminum with a thermal conductivity of about 200 W/(mK), 4H—SiC with a thermal conductivity of about 370 W/(m-K), 6H—SiC with a thermal conductivity of about 490 W/(m-K), AlN with a thermal conductivity of about 230 W/(m-K), a synthetic diamond with a thermal conductivity of about >1000 W/(m-K), sapphire, or other metals, ceramics, or semiconductors. The support member may be formed from a growth process such as SiC, AlN, or synthetic diamond, and then mechanically shaped by machining, cutting, trimming, or molding. Alternatively, the support member may be formed from a metal such as copper, copper tungsten, aluminum, or other by machining, cutting, trimming, or molding.

Currently, solid state lighting is dominated by systems utilizing blue or violet emitting light emitting diodes (LEDs) to excite phosphors which emit a broader spectrum. The combined spectrum of the so-called pump LEDs and the phosphors can be optimized to yield white light spectra with controllable color point and good color rendering index. Peak wall plug efficiencies for state of the art LEDs are quite high, above 70%, such that LED based white light bulbs are now the leading lighting technology for luminous efficacy. As laser light sources, especially high-power blue laser diodes made from gallium and nitrogen containing material based novel manufacture processes, have shown many advantageous functions on quantum efficiency, power density, modulation rate, surface brightness over conventional LEDs. This opens up the opportunity to use lighting fixtures, lighting systems, displays, projectors and the like based on solid-state light sources as a means of transmitting information with high bandwidth using visible light. It also enables utilizing the modulated laser signal or direct laser light spot manipulation to measure and or interact with the surrounding environment, transmit data to other electronic systems and respond dynamically to inputs from various sensors. Such applications are herein referred to as "smart lighting" applications.

In some embodiments, the present invention provides novel uses and configurations of gallium and nitrogen containing laser diodes in communication systems such as visible light communication systems. More specifically the present invention provides communication systems related to smart lighting applications with gallium-and-nitrogen-based lasers light sources coupled to one or more sensors with a feedback loop or control circuitry to trigger the light source to react with one or more predetermined responses and combinations of smart lighting and visible light communication. In these systems, light is generated using laser devices which are powered by one or more laser drivers. In some embodiments, individual laser devices are used and optical elements are provided to combine the red, green and blue spectra into a white light spectrum. In other embodiments, blue or violet laser light is provided by a laser source and is partially or fully converted by a wavelength converting element into a broader spectrum of longer wavelength light such that a white light spectrum is produced.

The blue or violet laser devices illuminate a wavelength converting element which absorbs part of the pump light and reemits a broader spectrum of longer wavelength light. The light absorbed by the wavelength converting element is referred to as the "pump" light. The light engine is configured such that some portion of both light from the wavelength converting element and the unconverted pump light are emitted from the light-engine. When the non-converted, blue pump light and the longer wavelength light emitted by the wavelength converting element are combined, they may form a white light spectrum. In an example, the partially converted light emitted generated in the wavelength conversion element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

In an example, the wavelength conversion element is a phosphor which contains garnet host material and a doping element. In an example, the wavelength conversion element is a phosphor, which contains an yttrium aluminum garnet host material and a rare earth doping element, and others. In an example, the wavelength conversion element is a phosphor which contains a rare earth doping element, selected from one or more of Nd, Cr, Er, Yb, Nd, Ho, Tm Cr, Dy, Sm, Tb and Ce, combinations thereof, and the like. In an example, the wavelength conversion element is a phosphor which contains oxy-nitrides containing one or more of Ca, Sr, Ba, Si, Al with or without rare-earth doping. In an example, the wavelength conversion element is a phosphor which contains alkaline earth silicates such as $M_2SiO_4:Eu^{2+}$ (where M is one or more of $Ba^{2+}$, $Sr^{2+}$ and $Ca^{2+}$). In an example, the wavelength conversion element is a phosphor which contains $Sr_2LaAlO_5:Ce^{3+}$, $Sr_3SiO_5:Ce^{3+}$ or $Mn^{4+}$-doped fluoride phosphors. In an example, the wavelength conversion element is a high-density phosphor element. In an example, the wavelength conversion element is a high-density phosphor element with density greater than 90% of pure host crystal. In an example, the wavelength converting material is a powder. In an example, the wavelength converting material is a powder suspended or embedded in a glass, ceramic or polymer matrix. In an example, the wavelength converting material is a single crystalline member. In an example, the wavelength converting material is a powder sintered to density of greater than 75% of the fully dense material. In an example, the wavelength converting material is a sintered mix of powders with varying composition and/or index of refraction. In an example, the wavelength converting element is one or more species of phosphor powder or granules suspended in a glassy or polymer matrix. In an example, the wavelength conversion element is a semiconductor. In an example, the wavelength conversion element contains quantum dots of semiconducting material. In an example, the wavelength conversion element is comprised by semiconducting powder or granules.

For laser diodes the phosphor may be remote from the laser die, enabling the phosphor to be well heat sunk, enabling high input power density. This is an advantageous configuration relative to LEDs, where the phosphor is typically in contact with the LED die. While remote-phosphor LEDs do exist, because of the large area and wide emission angle of LEDs, remote phosphors for LEDs have the disadvantage of requiring significantly larger volumes of phosphor to efficiently absorb and convert all of the LED light, resulting in white light emitters with large emitting areas and low luminance.

For LEDs, the phosphor emits back into the LED die where the light from the phosphor can be lost due to absorption. For laser diode modules, the environment of the phosphor can be independently tailored to result in high efficiency with little or no added cost. Phosphor optimization for laser diode modules can include highly transparent, non-scattering, ceramic phosphor plates. Decreased temperature sensitivity can be determined by doping levels. A reflector can be added to the backside of a ceramic phosphor, reducing loss. The phosphor can be shaped to increase in-coupling and reduce back reflections. Of course, there can be additional variations, modifications, and alternatives.

For laser diodes, the phosphor or wavelength converting element can be operated in either a transmission or reflection mode. In a transmission mode, the laser light is shown through the wavelength converting element. The white light spectrum from a transmission mode device is the combination of laser light not absorbed by the phosphor and the spectrum emitted by the wavelength converting element. In a reflection mode, the laser light is incident on the first surface of the wavelength converting element. Some fraction of the laser light is reflected off of the first surface by a combination of specular and diffuse reflection. Some fraction of the laser light enters the phosphor and is absorbed and converted into longer wavelength light. The white light spectrum emitted by the reflection mode device is comprised by the spectrum from the wavelength converting element, the fraction of the laser light diffusely reflected from the first surface of the wavelength converting element and any laser light scattered from the interior of the wavelength converting element.

In a specific embodiment, the laser light illuminates the wavelength converting element in a reflection mode. That is, the laser light is incident on and collected from the same side of the wavelength converting element. The element may be heat sunk to the emitter package or actively cooled. Rough surface is for scattering and smooth surface is for specular reflection. In some cases, such as with a single crystal phosphor a rough surface with or without an AR coating of the wavelength converting element is provided to get majority of excitation light into phosphor for conversion and Lambertian emission while scattering some of the excitation light from the surface with a similar Lambertian as the emitted converted light. In other embodiments such as ceramic phosphors with internal built-in scattering centers are used as the wavelength converting elements, a smooth surface is provided to allow all laser excitation light into the phosphor where blue and wavelength converted light exits with a similar Lambertian pattern.

In a specific embodiment, the laser light illuminates the wavelength converting element in a transmission mode. That is, the laser light is incident on one side of the element, traverses through the phosphor, is partially absorbed by the element and is collected from the opposite side of the phosphor.

The wavelength converting elements, in general, can themselves contain scattering elements. When laser light is absorbed by the wavelength converting element, the longer wavelength light that is emitted by the element is emitted across a broad range of directions. In both transmission and reflection modes, the incident laser light must be scattered into a similar angular distribution in order to ensure that the resulting white light spectrum is substantially the same when viewed from all points on the collecting optical elements. Scattering elements may be added to the wavelength converting element in order to ensure the laser light is sufficiently scattered. Such scattering elements may include: low index inclusions such as voids, spatial variation in the optical index of the wavelength converting element which could be provided as an example by suspending particles of phosphor in a matrix of a different index or sintering particles of differing composition and refractive index together, texturing of the first or second surface of the wavelength converting element, and the like.

In a specific embodiment, a laser or SLED driver module is provided. For example, the laser driver module generates a drive current, with the drive currents being adapted to drive a laser diode to transmit one or more signals such as digitally encoded frames of images, digital or analog encodings of audio and video recordings or any sequences of binary values. In a specific embodiment, the laser driver module is configured to generate pulse-modulated signals at a frequency range of about 50 to 300 MHz, 300 MHz to 1 GHz or 1 GHz to 100 GHz. In another embodiment the laser driver module is configured to generate multiple, independent pulse-modulated signal at a frequency range of about 50 to 300 MHz, 200 MHz to 1 GHz or 1 GHz to 100 GHz. In an embodiment, the laser driver signal can be modulated by an analog voltage or current signal.

Figure 8A:
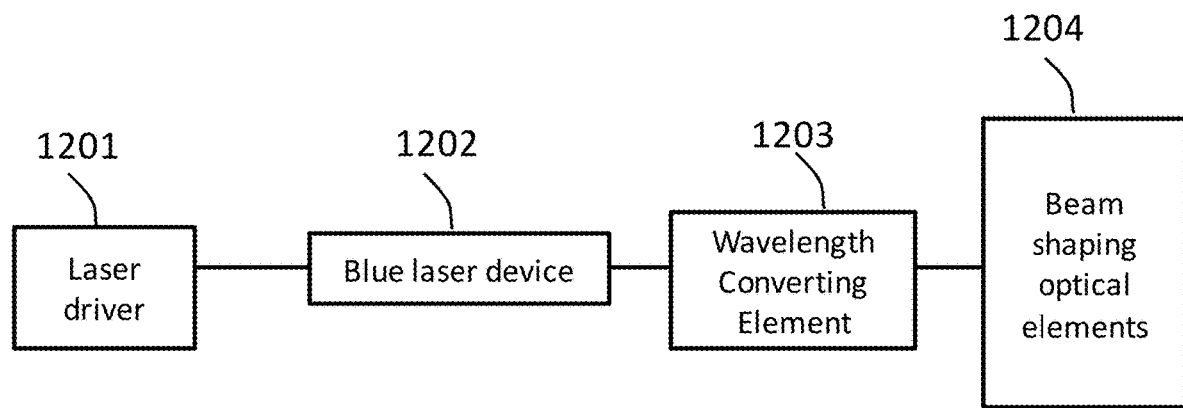
FIG. 8A is a functional block diagram for a laser-based white light source containing a blue pump laser and a wavelength converting element according to an embodiment of the present invention.

FIG. 8A is a functional block diagram for a laser-based white light source containing a blue pump laser and a wavelength converting element according to an embodiment of the present invention. In some embodiments, the white light source is used as a "light engine" for static lighting, dynamic light, VLC, or smart lighting applications. Referring to FIG. 8A, a blue or violet laser device 1202 emitting a spectrum with a center point wavelength between 390 and 480 nm is provided. The light from the blue laser device 1202 is incident on a wavelength converting element 1203 which partially or fully converts the blue light into a broader spectrum of longer wavelength light such that a white light spectrum is produced. A laser driver 1201 is provided which powers the laser device 1202. In a preferred embodiment the laser diode device is a gallium and nitrogen containing laser diode device operating in the 395 nm to 425 nm wavelength range, 425 nm to 490 nm wavelength range, or 490 nm to 550 nm range. For example, the laser diode is a blue laser diode with an output power of less than 1 W, or about 1 W to about 4 W, or about 4 W to about 10 W. In some embodiments, one or more beam shaping optical elements 1204 may be provided in order to shape or focus the white light spectrum. Optionally, the one or more beam shaping optical elements 1204 can be one selected from slow axis collimating lens, fast axis collimating lens, aspheric lens, ball lens, total internal reflector (TIR) optics, parabolic lens optics, refractive optics, or a combination of above. In other embodiments, the one or more beam shaping optical elements 1204 can be disposed prior to the laser light incident to the wavelength converting element 1203.

Figure 8B:
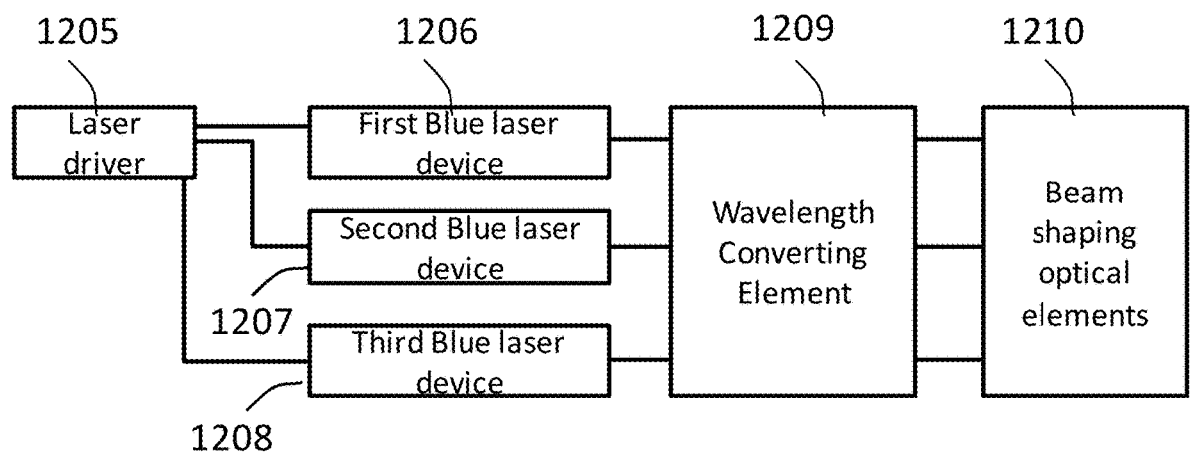
FIG. 8B is a functional block diagram for a laser-based white light source containing multiple blue pump lasers and a wavelength converting element according to another embodiment of the present invention.

FIG. 8B is a functional block diagram for a laser-based white light source containing multiple blue pump lasers and a wavelength converting element according to another embodiment of the present invention. Referring to FIG. 8B, a laser driver 1205 is provided, which delivers a delivers a controlled amount of current at a sufficiently high voltage to operate three laser diodes 1206, 1207 and 1208. In a preferred embodiment the laser diode devices are gallium and nitrogen containing laser diode devices operating in the 395 nm to 425 nm wavelength range, 425 nm to 490 nm wavelength range, or 490 nm to 550 nm range. For example, the three laser diodes are blue laser diodes with an aggregated output power of less than 1 W, or about 1 W to about 6 W, or about 6 W to about 12 W, or about 12 W to 30 W. The three blue laser devices 1206, 1207 and 1208 are configured to have their emitted light to be incident on a wavelength converting element 1209 in either a transmission or reflection mode. The wavelength converting element 1209 absorbs a part or all the blue laser light and emits photons with longer wavelengths. The spectra emitted by the wavelength converting element 1209 and any remaining laser light are collected by beam shaping optical elements 1210, such as lenses or mirrors, which direct the light with a preferred direction and beam shape. Optionally, the wavelength converting element 1209 is a phosphor-based material. Optionally, more than one wavelength converting elements can be used. Optionally, the bean shaping optical elements can be one or a combination of more selected the list of slow axis collimating lens, fast axis collimating lens, aspheric lens, ball lens, total internal reflector (TIR) optics, parabolic lens optics, refractive optics, and others. Optionally, the beam shaping optical element is implemented before the laser light hits the wavelength converting element.

In another embodiment, an optical fiber is used as the waveguide element wherein on one end of the fiber the electromagnetic radiation from the one or more laser diodes is in-coupled to enter the fiber and on the other end of the fiber the electromagnetic radiation is out-coupled to exit the fiber wherein it is then incident on the phosphor member. The optical fiber could have a transport length ranging from 100 µm to about 100 m, or to about 1 km, or greater. The optical fiber could be comprised of a single mode fiber (SMF) or a multi-mode fiber (MMF), with core diameters ranging from about 1 µm to 10 µm, about 10 µm to 50 µm, about 50 µm to 150 µm, about 150 µm to 500 µm, about 500 µm to 1 mm, or greater than 1 mm. The optical core material may consist of a glass such as silica glass wherein the silica glass could be doped with various constituents and have a predetermined level of hydroxyl groups (OH) for an optimized propagation loss characteristic. The glass fiber material may also be comprised of a fluoride glass, a phosphate glass, or a chalcogenide glass. In an alternative embodiment, a plastic optical fiber is used to transport the laser pump light.

Figure 9A:
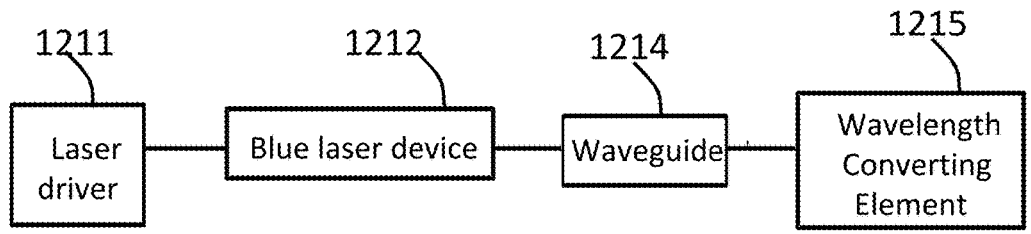
FIG. 9A is a functional block diagram for a laser-based fiber-delivered white light source according to an embodiment of the present invention.

FIG. 9A is a functional block diagram for a laser-induced fiber-delivered white light source according to an embodiment of the present invention. This diagram is merely an example, which should not unduly limit the scope of the claims. One of ordinary skill in the art would recognize many variations, alternatives, and modifications. As shown, the laser-induced fiber-delivered white light source has a laser driver 1211 configured to provide one or more driving currents or voltages or modulation control signals. The laser-induced fiber-delivered white light source also includes at least one blue laser device 1212 configured to emit a laser light with a blue wavelength in a range from about 385 nm to about 485 nm. Optionally, the at least one laser diode device 1212 is a LD chip configured as a chip-on-submount form having a Gallium and Nitrogen containing emitting region operating in one wavelength selected from 395 nm to 425 nm wavelength range, 425 nm to 490 nm wavelength range, and 490 nm to 550 nm range. Optionally, the at least one laser diode device 1212 includes a set of multiple laser diode (LD) chips. Each includes an GaN-based emission stripe configured to be driven by independent driving current or voltage from the laser driver 1211 to emit a laser light. All emitted light from the multiple LD chips can be combined to one beam of electromagnetic radiation. Optionally, the multiple LD chips are blue laser diodes with an aggregated output power of less than 1 W, or about 1 W to about 10 W, or about 10 W to about 30 W, or about 30 W to 100 W, or greater. Optionally, each emitted light is driven and guided separately.

In the embodiment, the laser-induced fiber-delivered white light source includes a waveguide device 1214 configured to couple and deliver the laser light from the at least one laser diode device 1212 to a remote destination. Optionally, the waveguide device 1214 is an optical fiber for being relatively flexibly disposed in any custom-designed light system. The optical fiber includes a single mode fiber or multiple mode fiber with a core diameter in a range selected from about 1 µm to 10 µm, about 10 µm to 50 µm, about 50 µm to 150 µm, about 150 µm to 500 µm, about 500 µm to 1 mm, or greater than 1 mm. Optionally, the waveguide device 1214 is a semiconductor waveguide pre-fabricated on a semiconductor substrate to fit a relative flexible light path in any custom-designed light system. The waveguide device 1214 can have an arbitrary length to deliver the laser electromagnetic radiation through a waveguide transport member which terminate at a light head member disposed at the remote destination. Optionally, the laser light exiting the light head is characterized by a beam diameter ranging from 1 µm to 5 mm and a divergence ranging from 0 degree to 200 degrees full angle.

In the embodiment, the laser-induced fiber-delivered white light source also includes a wavelength converting element 1215 disposed in the light head member at the remote destination. Optionally, the wavelength converting element 1215 is a phosphor material configured to be a single plate or a pixelated plate disposed on a submount material completely separated from the laser diode device 1212. Optionally, the phosphor material used in the fiber-delivered laser lighting system is comprised of a ceramic yttrium aluminum garnet (YAG) doped with Ce or a single crystal YAG doped with Ce or a powdered YAG comprising a binder material. The phosphor material is configured to convert at least partially the incoming laser electromagnetic radiation of a first wavelength (e.g., in blue spectrum) to a phosphor emission of a second wavelength. The second wavelength is longer than the first wavelength. Optionally, the second wavelength is in yellow spectrum range. Optionally, the phosphor material has an optical conversion efficiency of greater than 50 lumen per optical watt, greater than 100 lumen per optical watt, greater than 200 lumen per optical watt, or greater than 300 lumen per optical watt.

Optionally, the phosphor material 1215 has a surface being placed at a proximity of the end section of the optical fiber or semiconductor waveguide in the light head member to receive the laser electromagnetic radiation exited from the waveguide device 1214. Optionally, the laser electromagnetic radiation has a primary propagation direction which is configured to be in an angle of incidence with respect to a direction of the surface of the phosphor material in a range from 20 degrees to close to 90 degrees. Optionally, the angle of incidence of the laser electromagnetic radiation is limited in 25 to 35 degrees. Optionally, the angle of incidence of the laser electromagnetic radiation is limited in 35 to 40 degrees. Optionally, the end section of the waveguide device 1214 in the light head member is disposed in a close proximity relative to the surface of phosphor material so that laser electromagnetic radiation can land on the surface to form an excitation spot in a range of 25 µm to 5 mm. Optionally, the excitation spot is limited within 50 µm to 500 µm. The laser electromagnetic radiation at the excitation spot is absorbed by the phosphor material to induce a phosphor emission with a spectrum of longer wavelengths than the first wavelength of the incoming electromagnetic radiation. A combination of the phosphor emission of a second wavelength plus a partial mixture with the laser electromagnetic radiation of the first wavelength produces a white light emission. Optionally, the white light emission is substantially reflected from the surface of the phosphor material and redirected or shaped as a white light beam used for various applications. Optionally, the white light emission out of the phosphor material can be in a range selected from 10 to 100 lm, 100 to 500 lm, 500 to 1000 lm, 1000 to 3000 lm, and greater than 3000 lm. Alternatively, the white light emission out of the light head member as a white light source with a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$.

Figure 9B:
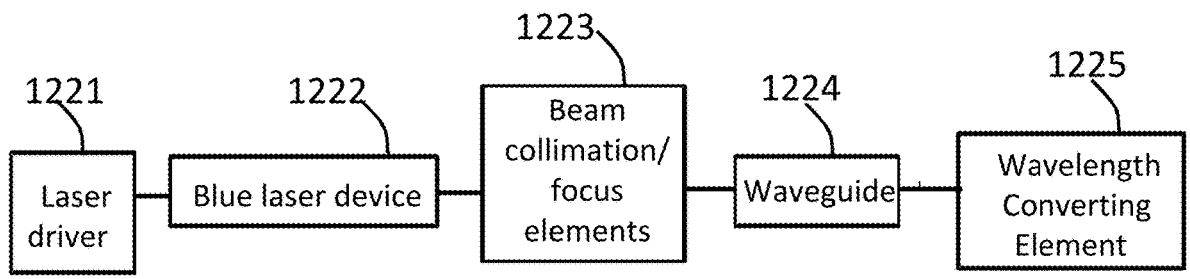
FIG. 9B is a functional block diagram for a laser-based fiber-delivered white light source according to another embodiment of the present invention.

FIG. 9B is a functional block diagram for a laser-induced fiber-delivered white light source according to another embodiment of the present invention. This diagram is merely an example, which should not unduly limit the scope of the claims. One of ordinary skill in the art would recognize many variations, alternatives, and modifications. As shown, the laser-induced fiber-delivered white light source includes a blue laser device 1222 driven by a laser driver 1221 to emit a laser light with a blue emission characterized by a wavelength ranging from 395 nm to 550 nm. Optionally, the laser device is a laser diode (LD) chip configured as a Chip-on-submount form with a GaN-based emitting region operating in a first wavelength selected from 395 nm to 425 nm wavelength range, 425 nm to 490 nm wavelength range, and 490 nm to 550 nm range. The laser light exits the emitting region as a beam of electromagnetic radiation with relatively large divergence.

Optionally, the laser-induced fiber-delivered white light source includes one or more beam collimation and focus elements 1223 configured to confine or shape the beam of electromagnetic radiation. The one or more beam collimation and focus elements 1223 may include a collimation lens, a focus lens, a filter, a beam splitter for guiding the beam of electromagnetic radiation to a specific direction with reduced beam diameter and smaller divergence. In the embodiment, the laser-induced fiber-delivered white light source also includes a waveguide device 1224. Optionally, the waveguide device 1224 is substantially similar to the waveguide device 1214 described in earlier sections. The waveguide device 1224 is configured to receive the laser beam with proper alignment to an output port of the laser package holding the blue laser device 1222 to couple the laser electromagnetic radiation into a narrowed light path in sufficiently high efficiency greater than 60% or even greater than 80%. The waveguide device 1224 is configured to deliver the laser electromagnetic radiation to a remote destination for various specific applications.

In the embodiment, the laser-induced fiber-delivered white light source further includes a wavelength converting element 1225. Optionally, the wavelength converting element 1225 includes at least a phosphor material disposed in a remote location completely separated from the laser devices and is able to receive the laser electromagnetic radiation exiting the waveguide device 1224. The laser electromagnetic radiation interacts with the phosphor material within an excitation spot to induce a phosphor emission which has a second wavelength that is longer than the first wavelength of the laser electromagnetic radiation. A mixture of a portion of laser electromagnetic radiation of the first wavelength with the phosphor emission of the second wavelength produces a white light emission. The white light emission is used for many illumination and projection applications statically and dynamically. Optionally, the white light emission out of the phosphor material is achieved in 10 to 100 lm, 100 to 500 lm, 500 to 1000 lm, 1000 to 3000 lm, and greater than 3000 lm. Alternatively, the white light emission generated by the laser induced has a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$^2$.

Figure 9C:
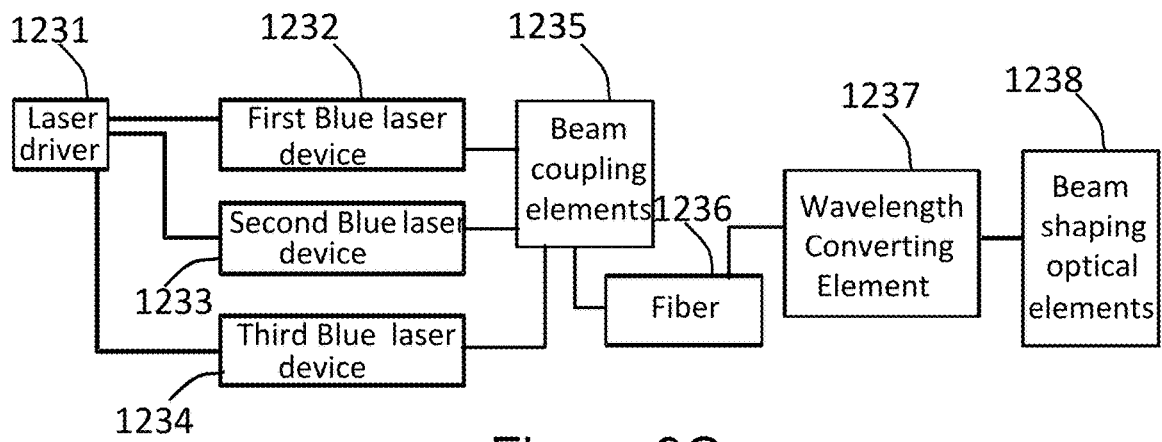
FIG. 9C is a functional block diagram for a multi-laser-based fiber-delivered white light source according to yet another embodiment of the present invention.

FIG. 9C is a functional block diagram for a multi-laser-based fiber-delivered white light source according to yet another embodiment of the present invention. This diagram is merely an example, which should not unduly limit the scope of the claims. One of ordinary skill in the art would recognize many variations, alternatives, and modifications. As shown, the multi-laser-based fiber-delivered white light source includes a first blue laser device 1232, a second blue laser device 1233, and a third blue laser device 1234, commonly driven by a laser driver 1231. Optionally, there can be more than three laser devices driven by one or more laser drivers. Optionally, each laser device is configured to emit a laser light with a blue emission in one wavelength ranging from 395 nm to 550 nm. Optionally, the wavelength range can be limited in one selected from 395 nm to 425 nm wavelength range, 425 nm to 490 nm wavelength range, and 490 nm to 550 nm range. Optionally, each blue laser device, 1232, 1233, and 1234, includes a laser diode (LD) chip configured in Chip-on-submount form with a Gallium and Nitrogen containing emitting region to emit the blue laser light. Optionally, all emitted blue laser light from the multiple laser diode devices can be combined to one laser beam by one or more beam coupling elements 1235. Optionally, the one combined laser beam of the multi-laser-based filter delivered white light source is configured to provide a beam of electromagnetic radiation of a first wavelength in blue spectrum with an aggregated output power of less than 1 W, or about 1 W to about 10 W, or about 10 W to about 30 W, or greater.

In the embodiment, the multi-laser-based fiber-delivered white light source includes a fiber assembly 1236 configured to align fiber core to the combined laser beam of electromagnetic radiation so that the about 60% or greater, or 80% or greater efficiency of the combined laser beam of electromagnetic radiation can be coupled into an optical fiber embedded within the fiber assembly 1236. The fiber assembly 1236 is substantially similar the waveguide device 1214 and 1224 for delivering the laser electromagnetic radiation to a remote destination via a flexible or customized light path in the optical fiber with an arbitrary length (e.g., over 100 m). At the end of the optical fiber, the laser electromagnetic radiation of the first wavelength exits with a confined beam diameter and restricted divergence.

In the embodiment, the multi-laser-based fiber-delivered white light source includes a wavelength converting element 1237 disposed in a light head member at the remote destination to receive the laser beam exiting an end section of the optical fiber. In a specific embodiment, the wavelength converting element 1237 includes a phosphor plate or a pixelated phosphor plate disposed in the light head member at proximity of the end section of the optical fiber so that the beam of electromagnetic radiation exited the optical fiber can land in an spot on an surface of the phosphor plate with a spot size limited in a range of about 50 µm to 5 mm. Optionally, the phosphor plate used in the fiber-delivered laser lighting system is comprised of a ceramic yttrium aluminum garnet (YAG) doped with Ce or a single crystal YAG doped with Ce or a powdered YAG comprising a binder material. The phosphor plate has an optical conversion efficiency of greater than 50 lumen per optical watt, greater than 100 lumen per optical watt, greater than 200 lumen per optical watt, or greater than 300 lumen per optical watt. The phosphor plate absorbs the blue emission lasering the beam of electromagnetic radiation of the first wavelength to induce a phosphor emission of a second wavelength in yellow or violet spectra range. Optionally, the phosphor emission of the second wavelength is partially mixed with a portion of the incoming/reflecting beam of electromagnetic radiation of the first wavelength to produce a white light beam. Optionally, the light head member is configured to set the relative position of the end section of the optical fiber on a sloped body to make an angle of incidence of the exiting electromagnetic radiation with respect to a direction of the surface of the phosphor plate in a range from 5 degrees to 90 degrees. Optionally, the angle of incidence is narrowed in a smaller range from 25 degrees to 35 degrees or from 35 degrees to 40 degrees. Optionally, the white light emission is sufficiently reflected out of the phosphor plate.

In the embodiment, the multi-laser-based fiber-delivered white light source optionally includes one or more beam shaping optical elements 1238. In an embodiment, the one or more beam shaping optical elements 1238 includes a light head member which provides a mechanical fixture for holding the end section of the optical fiber for outputting the laser electromagnetic radiation and supporting the phosphor plate via a submount. Optionally, the mechanical fixture includes a sloped metal body to support the end section of the optical fiber in an angled direction with respect to the phosphor plate which is disposed at a bottom region of the sloped metal body. Optionally, the mechanical fixture includes a heatsink associated with the submount to support the phosphor plate for facilitating heat conduction from the hot phosphor material to the heatsink during a heated wavelength conversion process when the laser beam with high power illuminates in a small excitation spot on the surface of the phosphor plate. Optionally, the mechanical fixture includes a reflecting semi-cone structure for facilitating collection of the white light emission from the surface of the phosphor plate. In another embodiment, the one or more beam shaping optical elements 1238 includes additional secondary optics elements for handling the white light emission generated by the multi-laser-based fiber-delivered white light source. These secondary optics elements include static free-space optical elements, fiber-based optical elements, semiconductor-based optical elements, or one or more optical elements that are dynamically controlled for providing smart lighting information or information projection.

Figure 10A:
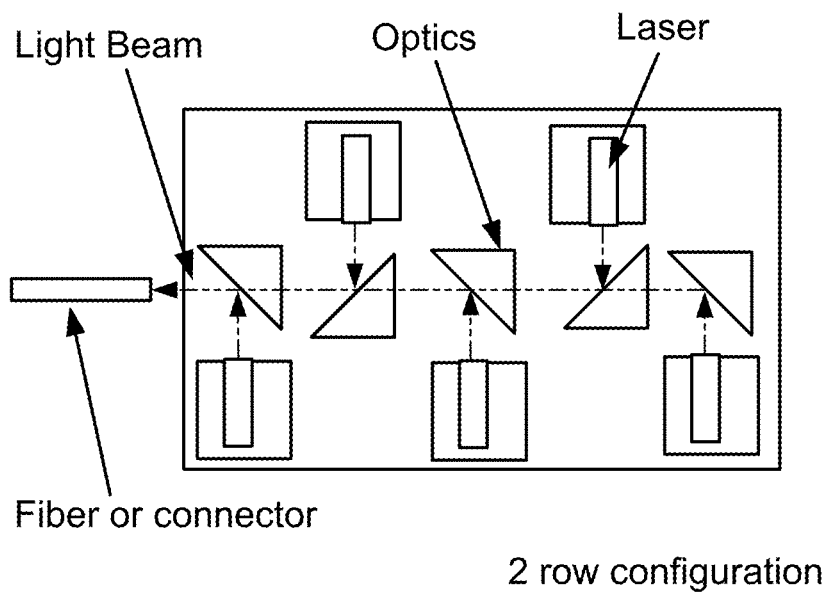
FIG. 10A is a simplified diagram illustrating a plurality of laser bars configured with optical combiners according to embodiments of the present invention.
Figure 10A:
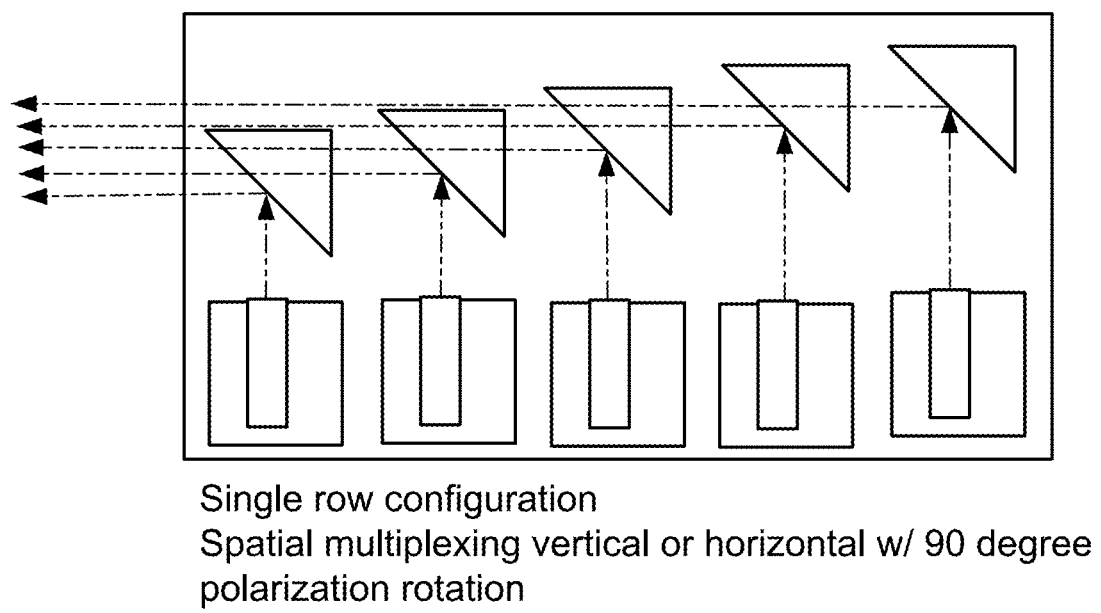

FIG. 10A is a simplified diagram illustrating multiple discrete lasers configured with an optical combiner according to embodiments of the present invention. As shown, the diagram includes a package or enclosure for multiple laser diode light emitting devices. In a preferred embodiment the laser diode light-emitting devices are gallium and nitrogen containing laser diode devices operating in the 395 nm to 425 nm wavelength range, 425 nm to 490 nm wavelength range, or 490 nm to 550 nm range. For example, the multiple laser diode emitters are blue laser diodes with an aggregated output power of less than 1 W, or about 1 W to about 10 W, or about 10 W to about 30 W, or about 30 W to 100 W, or greater. Each of the devices is configured on a single ceramic or multiple chips on a ceramic, which are disposed on common heat sink. As shown, the package includes all free optics coupling, collimators, mirrors, spatially or polarization multiplexed for free space output or refocused in a fiber or other waveguide medium. As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

Figure 10B:
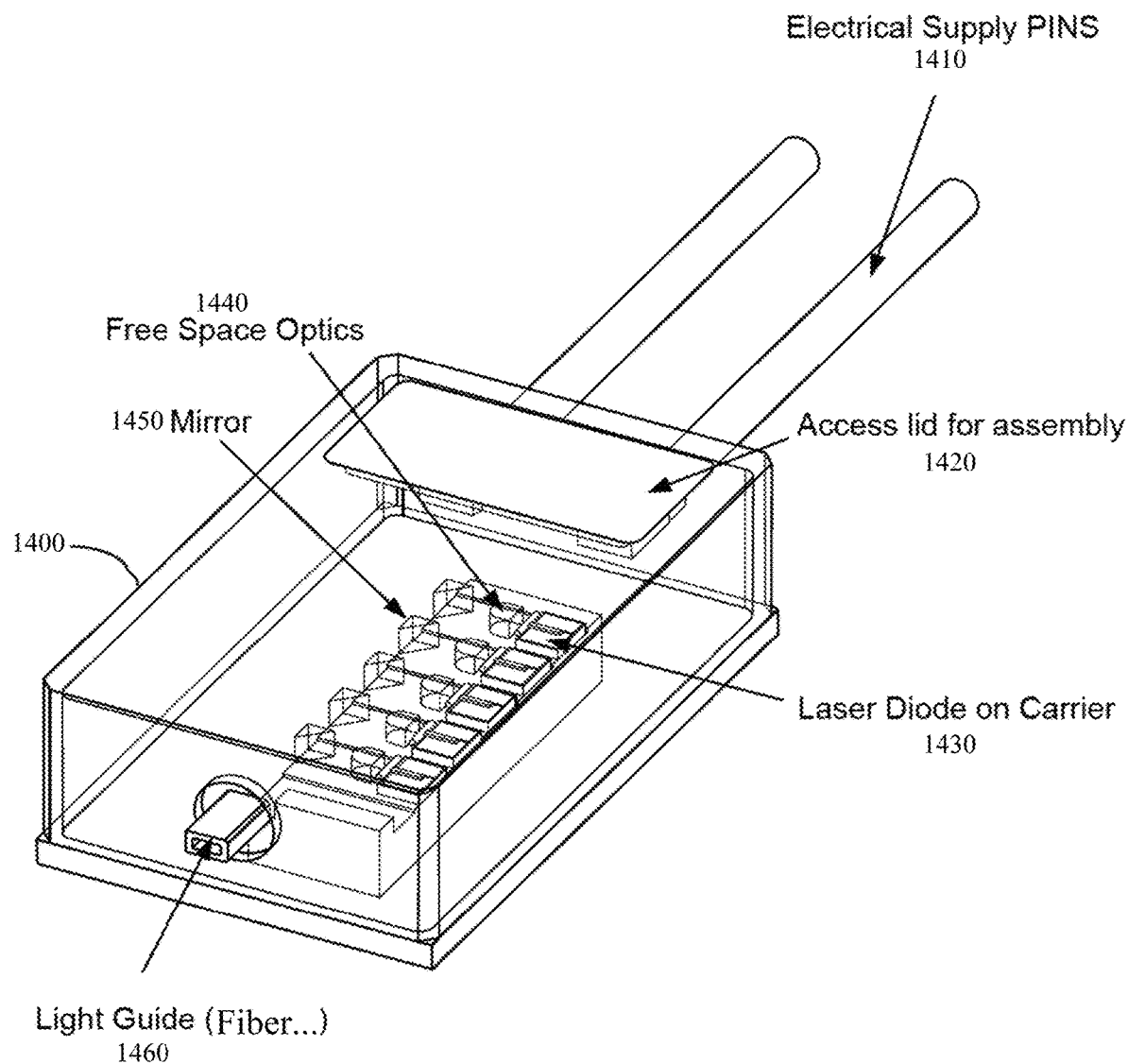
FIG. 10B is a schematic diagram of an enclosed free space laser module according to a specific embodiment of the present invention.

FIG. 10B is an example of enclosed free space laser module. A case 1400 is used for assembling a free-space mirror-based laser combiner. The laser module includes two electrical supply pins 1410 for providing driving voltages for the laser diodes 1430. In a preferred embodiment the laser diode devices are gallium and nitrogen containing laser diode devices operating in the 395 nm to 425 nm wavelength range, 425 nm to 490 nm wavelength range, or 490 nm to 550 nm range. For example, the multiple laser diode emitters are blue laser diodes with an aggregated output power of less than 1 W, or about 1 W to about 10 W, or about 10 W to about 30 W, or greater. The case 1400 includes a hole for a fiber 1460 to couple with the light guide output combined from all laser diodes 1430 through the series of mirrors 1450. An access lid 1420 is designed for easy access of free-space optical elements 1440 in the assembly. A compact plug-and-play design provides a lot of flexibilities and ease of use.

Figure 10C:
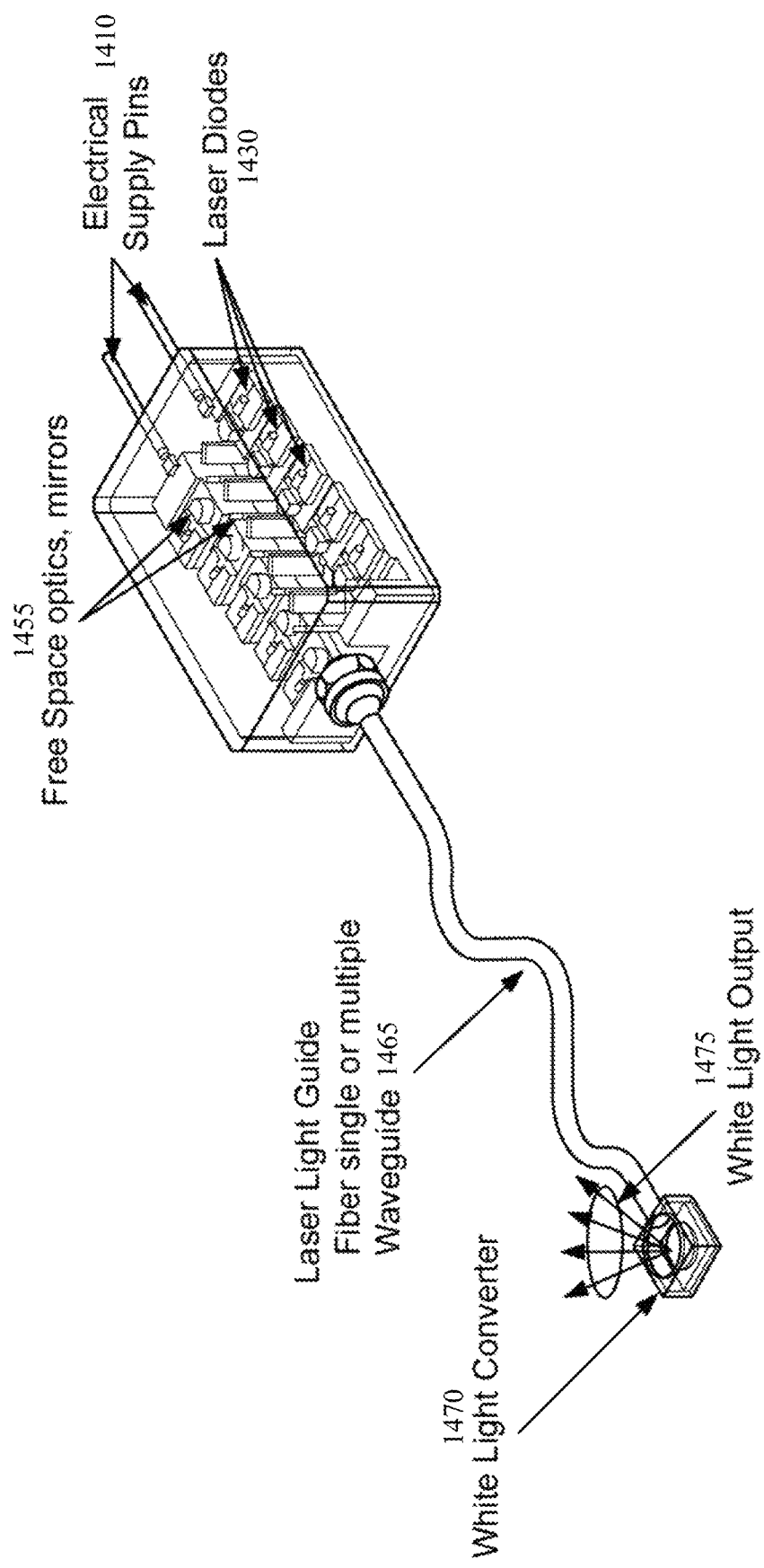
FIG. 10C is a schematic diagram of an enclosed free space multi-chip laser module with an extended delivery fiber plus phosphor converter according to another specific embodiment of the present invention.

FIG. 10C is a schematic of an enclosed free space multi-chip laser module with an extended delivery fiber plus phosphor converter according to a specific embodiment of the present invention. As shown, the enclosed free space multi-chip laser module is substantially similar to the one shown in FIG. 10A with two electrical supply pins 1410 to produce a laser light beam in violet or blue light spectrum. The multiple laser chips 1430 in the package equipped with free-space optics units 1455 provide substantially high intensity for the light source that is desired for many new applications. Additionally, an extended optical fiber 1465 with one end is coupled with the light guide output for further guiding the laser light beam to a desired distance for certain applications up to 100 m or greater. Optionally, the optical fiber can be also replaced by multiple waveguides built in a planar structure for adapting silicon photonics integration. At the other end of the optical fiber, a phosphor-based wavelength converter 1470 may be disposed to receive the laser light, where the violet or blue color laser light is converted to white color light 1475 and emitted out through an aperture or collimation device. As a result, a white light source with small size, remote pump, and flexible setup is provided.

Figure 11:
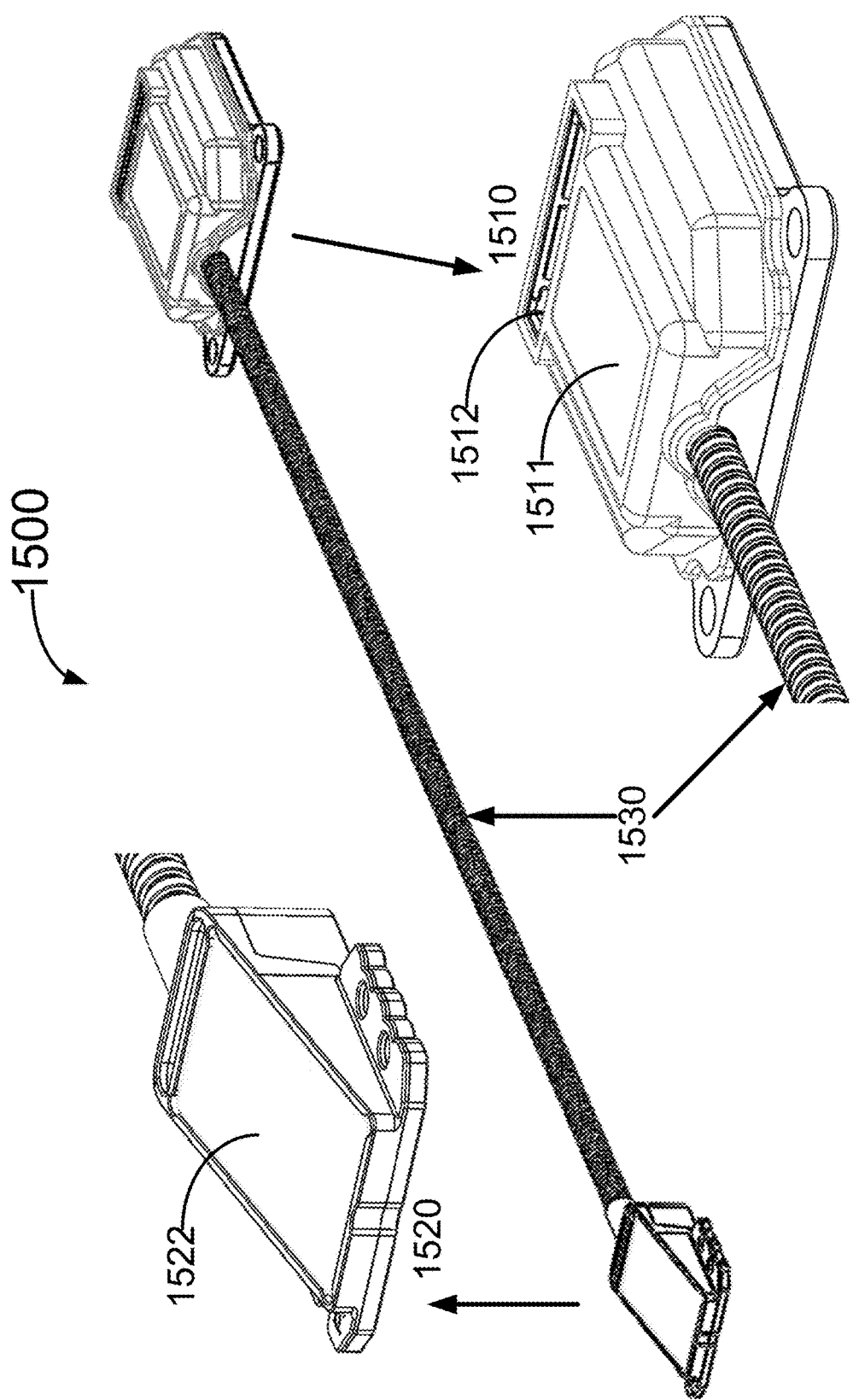
FIG. 11 is a perspective view of a fiber-delivered white light source including a general laser package and a light head member linked each other via a fiber assembly according to an embodiment of the present invention.

FIG. 11 is a perspective view of a fiber-delivered white light source including a general laser package and a light head member including a wavelength conversion phosphor member wherein the laser package and the light head member are linked to each other via a fiber assembly according to an embodiment of the present invention. This diagram is merely an example, which should not unduly limit the scope of the claims. One of ordinary skill in the art would recognize many variations, alternatives, and modifications. As shown, a fiber-delivered white light source 1500 includes at least a general laser package 1510 for laser and a light head member 1520 connected by a fiber assembly 1530. The general laser package 1510 is a metal case for enclosing a laser module therein having an electrical connector 1512 disposed through a cover member 1511 for providing electrical supply to the devices in the case. The bottom side (not visible) is for mounting to a heat conductive base for distributing heat out of the heat-generating laser device. The light head member 1520 is metal case with a sloped shape and a glass window 1522 covering the slopped facet, enclosing a phosphor material inside (not shown) for receiving laser light delivered by the fiber assembly 1530 and converting the laser emission to a white light emission. The bottom side (not visible) od the light head member 1530 is made by metal or other thermal conductive material for efficiently distributing heat generated by the phosphor material therein. The fiber assembly 1530 shown in FIG. 11 is visible with a semi-flexible metal armor used to protect the optical fiber inside throughout an extended length from a first end coupled to the general laser package 1510 and a second end coupled with the light head member 1520 at a remote destination. The extended length can be over 100 m.

Figure 12:
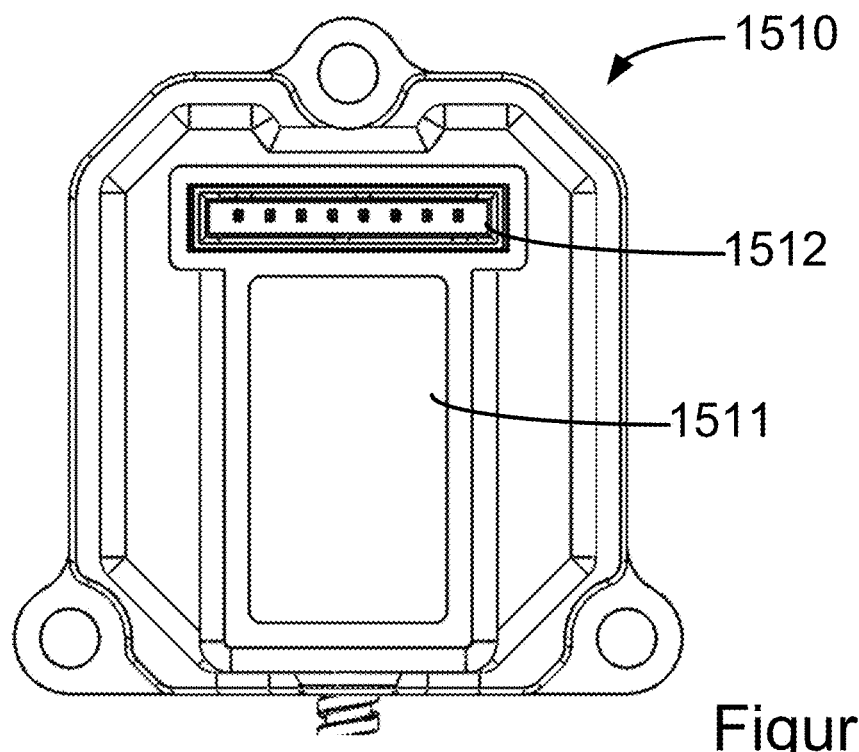
FIG. 12 is a top view of the general laser package of FIG. 11 according to the embodiment of the present invention.

FIG. 12 is a top view of the general laser package of FIG. 11 according to the embodiment of the present invention. This diagram is merely an example, which should not unduly limit the scope of the claims. One of ordinary skill in the art would recognize many variations, alternatives, and modifications. As shown, the electrical connector 1512 with multiple pins are disposed via an electrical feedthrough at the top cover member 1511 of the general laser package 1510. The opposite side of the general laser package is a bottom member used for mounting the general laser package 1510 in applications. The bottom member is preferred to be made by metal or metal alloy material, for example, AlN, AlO, BeO, Diamond, CuW, Cu, or Silver, or other high thermal conductive materials for mounting on a heatsink to quickly distributing heat generated by laser devices inside the package 1510.

Figure 13:
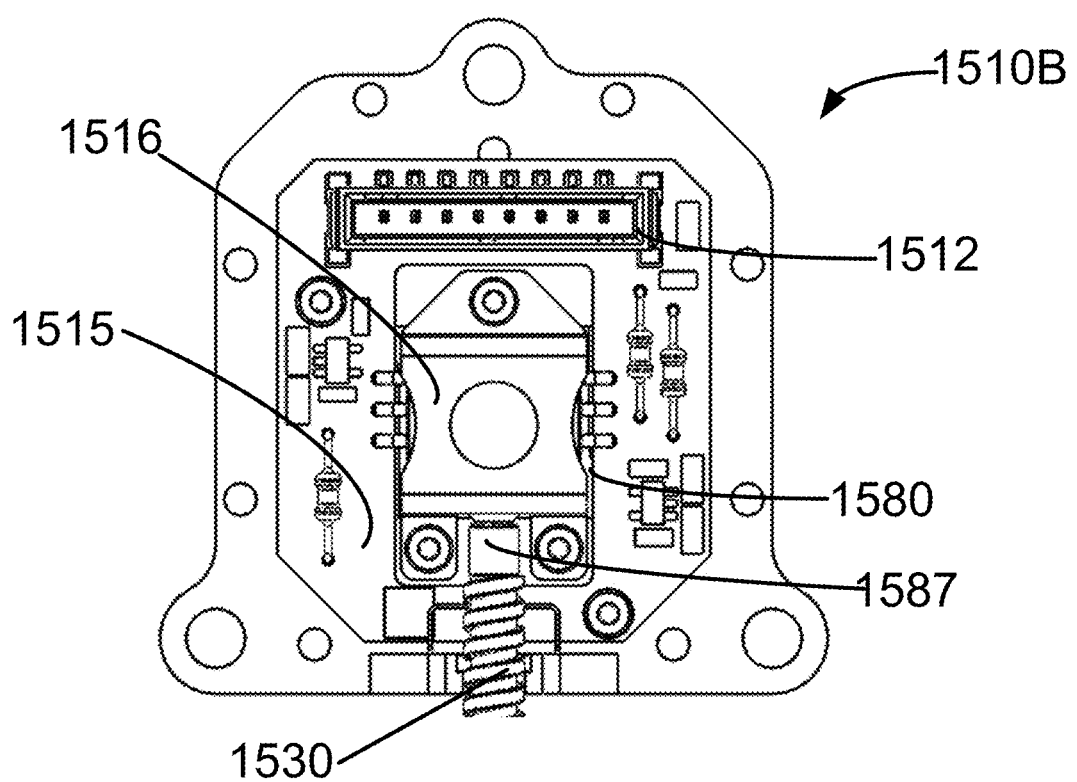
FIG. 13 is a top view of interior elements of the general laser package of FIG. 12 including a blue-laser module mounted on a circuit board according to the embodiment of the present invention.

FIG. 13 is a top view of interior elements of the general laser package of FIG. 12 including a blue-laser module mounted on an electronic circuit board according to the embodiment of the present invention. This diagram is merely an example, which should not unduly limit the scope of the claims. One of ordinary skill in the art would recognize many variations, alternatives, and modifications. The general laser package 1510B of FIG. 13 is substantially the same general laser package 1510 of FIG. 12 with the top cover member 1511 being removed. As shown, the general laser package 1510B encloses a board member 1515 on which the electrical connector 1512 and multiple resistors and capacitors or other electronic components are mounted. Primarily, a blue-laser module 1580 is disposed in a center region with multiple electrical pins plugged into the board member 1515. A fixing member 1516 is placed on top of the blue-laser module 1580 for securing the mounting of the blue-laser module 1580. An output port 1587 is coupled to the blue-laser module 1580 from one side thereof and also coupled to the fiber assembly (with the metal armor of the optical fiber being partially visible). In the embodiment, the blue-laser module 1580 is configured to generate high-power laser light for the fiber-delivered white light source 1500 (FIG. 11). For example, the blue laser module contains one or more laser diode chips with gallium and nitrogen containing emitting region configured to generate a laser electromagnetic radiation of a first wavelength in blue spectrum range with a power less than 1 W, or about 1 W to about 3 W, or about 3 W to about 10 W, or about 10 W to 100 W, or greater than 100 W.

Figure 14:
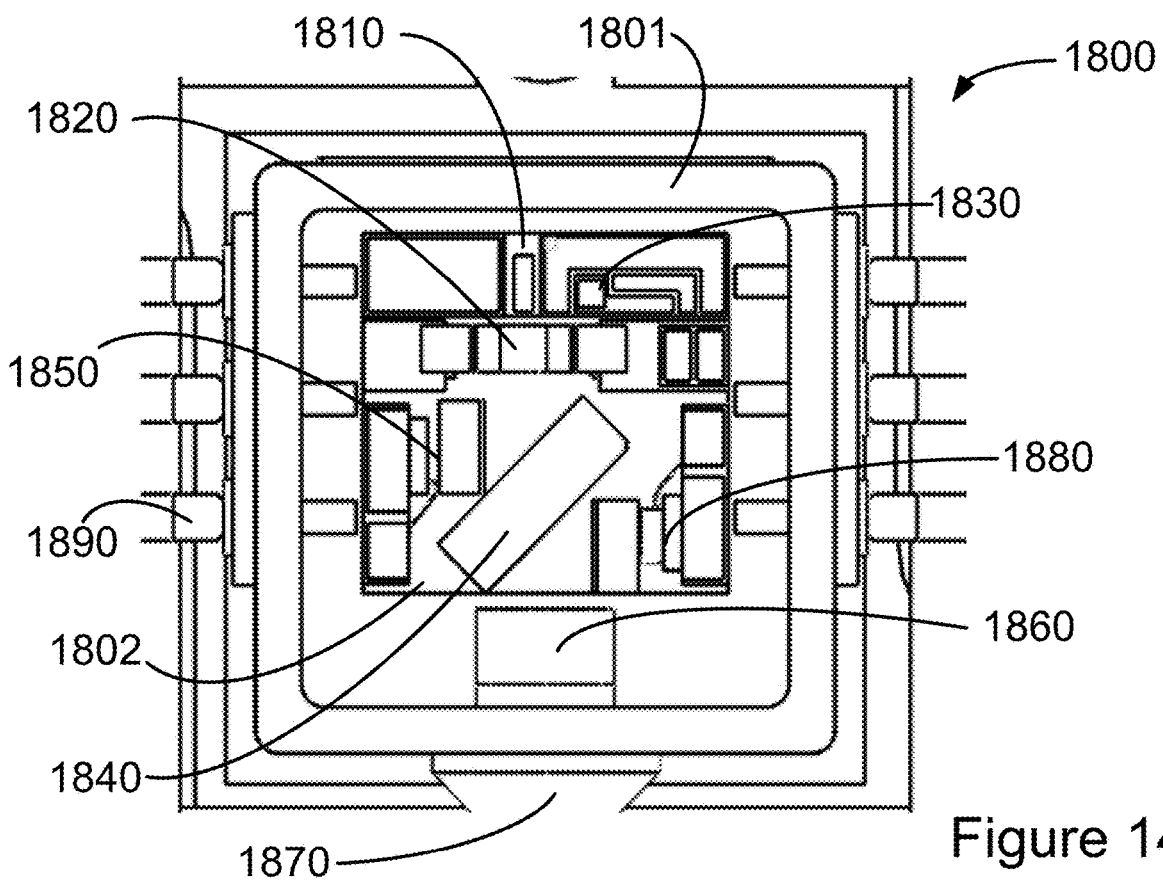
FIG. 14 is a top view of the blue-laser module with opened lid according to an embodiment of the present invention.

FIG. 14 is a top view of the blue-laser module with opened lid according to an embodiment of the present invention. This diagram is merely an example, which should not unduly limit the scope of the claims. One of ordinary skill in the art would recognize many variations, alternatives, and modifications. As shown, the blue-laser module 1800 is configured as a metal case 1801 (with lid opened) enclosing a support member 1802 for supporting multiple components: at least one laser diode device 1810, a collimating lens 1820, a thermistor 1830, a beam splitter 1840, a first photodetector 1850, a focus lens 1860, an output port 1870, and a second photodetector 1880. Optionally, the laser diode device 1810 is a configured to be a chip-on-submount (CoS) device having a Gallium and Nitrogen (GaN) containing active region which is driven to generate a laser light with primary emission spectrum in blue region ranging from 415 nm to 485 nm. Optionally, the laser diode device 1810 is mounted on a ceramic base member on the support member 1802. In an embodiment, the ceramic base member is a High Temperature Co-fired Ceramic (HTCC) submount structure configured to embed electrical conductors therein for connecting the laser diode with its driver, and to provide sufficiently efficient thermal conduction for the laser diode during operation.

In an embodiment, the laser light generated by the laser diode device 1810 exits with a large spread into a collimating lens 1820 to form a laser beam with a reduced spot size and a narrowed spread range. Optionally, the collimating lens 1820 is disposed in front of an exit facet of the GaN active region of the CoS chip 1810 and fixed by a weld clip. A thermistor 1830 is disposed near the laser diode device 1810 as a temperature sensor for monitoring temperature during operation. Optionally, an electrostatic discharge (ESD) Zener diode is included to protect the laser diode device from static electrical shock.

In the embodiment, the beam splitter 1840 is disposed in the path of the collimated laser beam. Optionally, the beam splitter 1840 is a filter. Optionally, beam splitter 1840 is an optical crystal with a front facet and a back facet. The front facet of the beam splitter faces the incoming laser beam and is coated with an anti-reflection thin-film for enhancing transmission. Optionally, a small amount of laser light still is reflected. The first photodetector 1850 is placed (to the left) to detect the reflected light. Optionally, the photodiode 1850 is the first photodetector characterized to detect primarily blue emission for safety sensing of the laser diode device 1810. The back facet of the beam splitter allows that a primary first portion of the laser beam is exited in a first direction while a minor second portion with the blue emission being substantially filtered is split to a second direction deviated from the first direction. The second photodetector 1880 is placed (to the right) to detect yellow spectrum for monitoring the second portion of the laser beam with the blue emission being substantially filtered. Optionally, an extra filter is placed in front of the second photodetector 1880.

In the embodiment, the primary first portion of the laser beam exited from the beam splitter 1840 is led to a focus lens 1860 disposed inside the metal case 1801. Optionally, the focus lens 1860 is configured to confine the laser beam to much smaller size that can be coupled into an optical fiber. Optionally, the Optionally, the coupling efficiency of the laser beam into the optical fiber is achieved and maintained greater than 80%. Optionally, the focus lens 1860 is mounted to the output port 1870 from inside of the metal case 1801. The optical port 1870 is 360-degree laser weld in a through hole at one side wall of the metal case 1801. Referring to FIG. 13, a first end of the fiber assembly 1530 is configured to couple with the output port which is denoted as 1587.

In the embodiment, the blue-laser module 1800 also includes multiple pins 1890 that are disposed at two opposite sides of the metal case 1801. One end of each pin is connected to the electrical connector embedded in the ceramic base member. Another end of each pin is bended down to plug into the board member 1515 (see FIG. 13) so that the blue-laser module 1800 can receive electrical driver/control signals.

Figure 15:
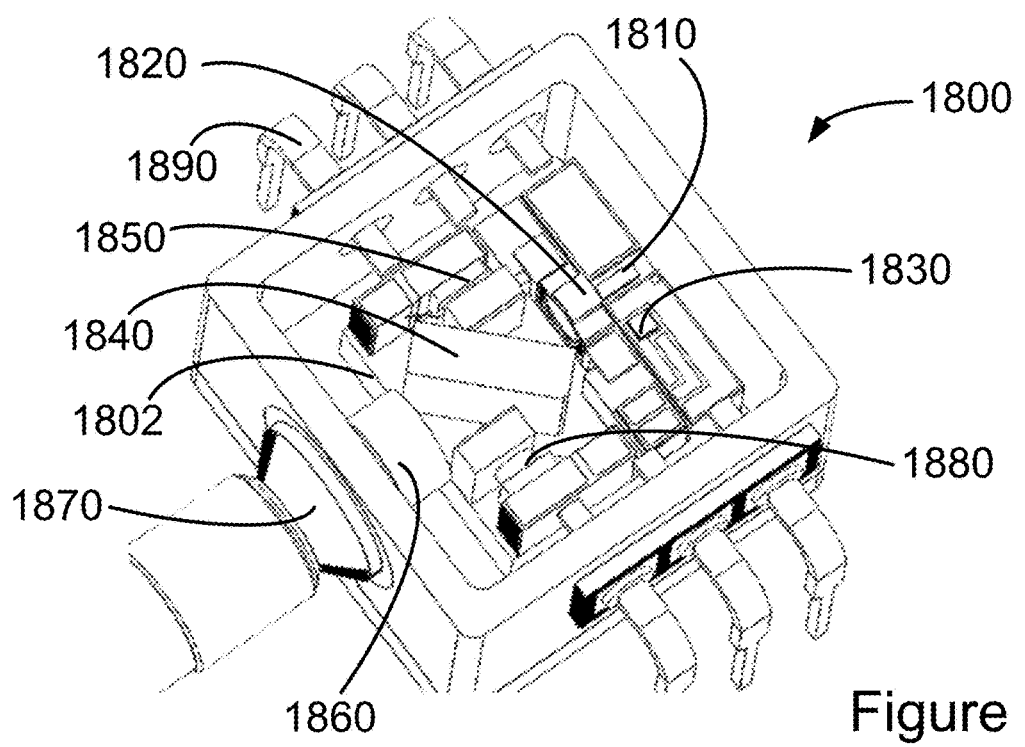
FIG. 15 is a perspective view of the blue-laser module according to the embodiment of the present invention.

FIG. 15 is a perspective view of the blue-laser module according to the embodiment of the present invention. Referring to FIG. 15, it shows a substantially same blue-laser module of FIG. 14 for better illustrating the structural layout of each components mentioned herein.

Figure 16:
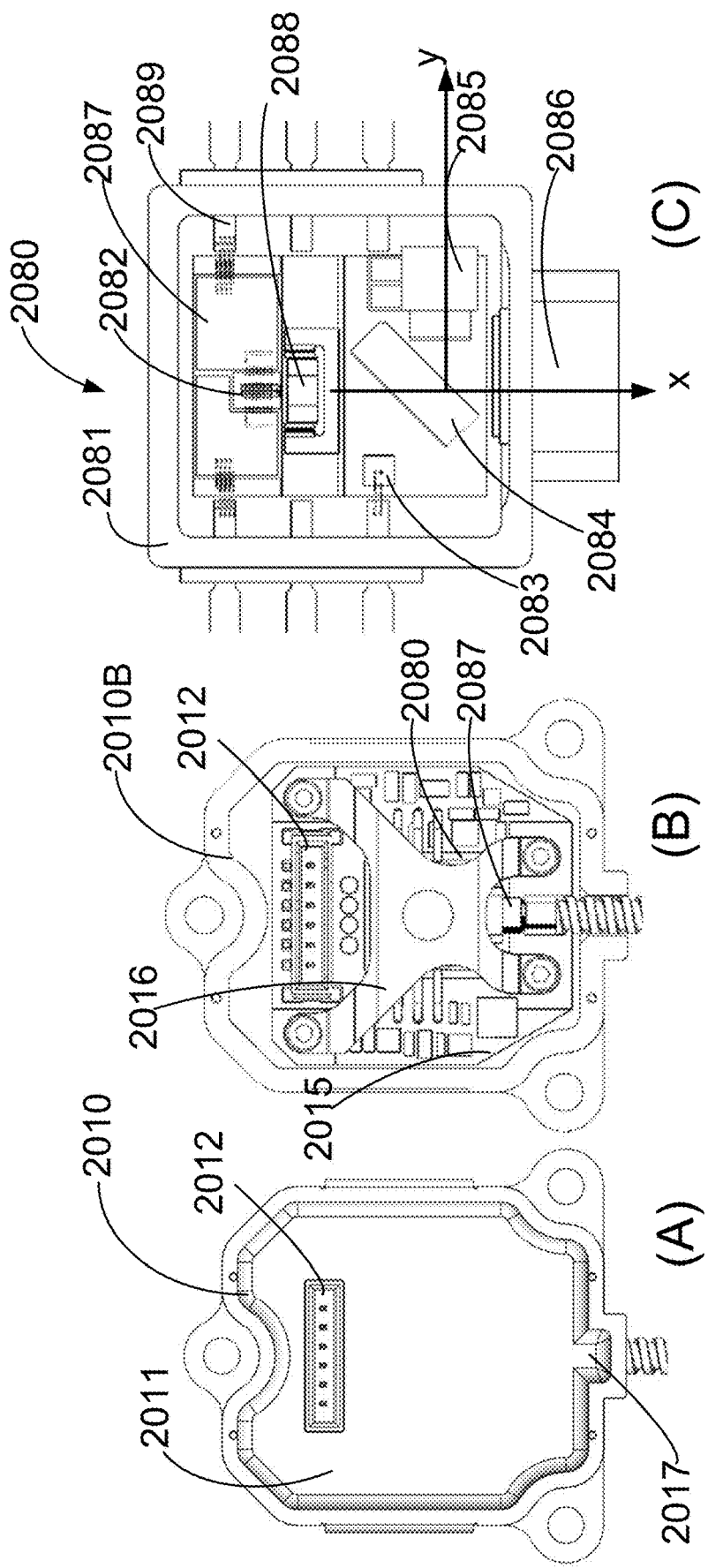
FIG. 16 is (A) a top view of a general laser package, (B) a top view of interior elements of the general laser package including a blue-laser module, and (C) a top view of the blue-laser module according to another embodiment of the present invention.

FIG. 16 is (A) a top view of a general laser package, (B) a top view of interior elements of the general laser package including a blue-laser module, and (C) a top view of the blue-laser module according to another embodiment of the present invention. These diagrams are merely an example, which should not unduly limit the scope of the claims. One of ordinary skill in the art would recognize many variations, alternatives, and modifications. In the embodiment shown in the FIG. 16, in part A, the top cover member 2011 of a general laser package 2010 is seen with an electrical connector 2012 disposed therein. An output port 2017 is configured to couple with a fiber assembly. In part B, the general laser package 2010B is shown without the top cover member 2011. The electrical connector 2012 is seen mounted on a board member 2015. A blue-laser module 2080 is partially visible is also mounted on the board member 2015 with several pins visibly located at two opposite sides while a large piece of fixing clip 2016 is placed on top of the blue-laser module 2080. A focus lens 2087 is disposed outside the blue-laser module 2080 and coupled with the fiber assembly at the output port 2017 (see part A). In part C, the blue-laser module 2080 is shown as a metal case 2081 with its lid opened. The blue-laser module 2080 in the embodiment includes at least a laser diode device 2082 disposed on a support member 2087 to generate a laser light, a collimating lens 2088 disposed and aligned to one facet of an emitting stripe of the laser diode device 2082 in an optical path of the laser light, and a beam splitter 2084 disposed down-stream of the optical path of the laser light. Optionally, multiple laser diode devices configured respectively as Chip-on-Submount LD chips can be laid in the metal case 2081 of the blue-laser module for achieving higher laser power. Optionally, multiple laser beams from multiple LD chips can be combined to reach unified power of 6 W, or 12 W, or 15 W for obtaining a brighter white light.

In the embodiment, the laser diode device 2082 includes an active region made by Gallium Nitride having the emitting stripe configured to emit light from one end facet. Optionally, the emitted light is substantially a blue emission with a wavelength in a range from 415 nm to 485 nm. The support member 2087 optionally is a High Temperature Co-fired Ceramic (HTCC) submount structure configured to embed electrical conducting wires therein. This type of ceramic support member provides high thermal conductivity for efficiently dissipating heat generated by the laser diode 2082 to a heatsink that is made to contact with the support member 2087. The ceramic support member 2087 also can allow optimized conduction wire layout so that ESD can be prevented and thermal management of the whole module can be improved. Referring to part C of FIG. 16, at least two electrical pins 2089 are configured to connect with the conducting wires in the HTTC ceramic submount structure for providing external drive signals for the laser diode 2082. Optionally, the blue-laser module 2080 includes a temperature sensor 2083 that can be disposed within the metal case on the support member and relative far away from the location of the laser diode 2082.

In the embodiment, the light generated by the laser diode device 2082 is led into the collimating lens 2088 so that the light can be confined with a smaller spread range to form a laser beam along a first direction (x). Optionally, the beam splitter 2084 is disposed down stream of an optical path along the first direction x, and is configured to split the laser beam to at least a first portion primarily in the first direction x and a second portion redirected to a second direction y. The first portion of the laser beam remains primarily a blue emission. The second portion may be filtered to eliminate the blue spectrum while retaining minor yellow spectrum. In the embodiment, the blue-laser module 2080 further includes a photo diode 2085 disposed in the path of the second direction y inside the metal case 2081 to detect the yellow spectrum.

Figure 17:
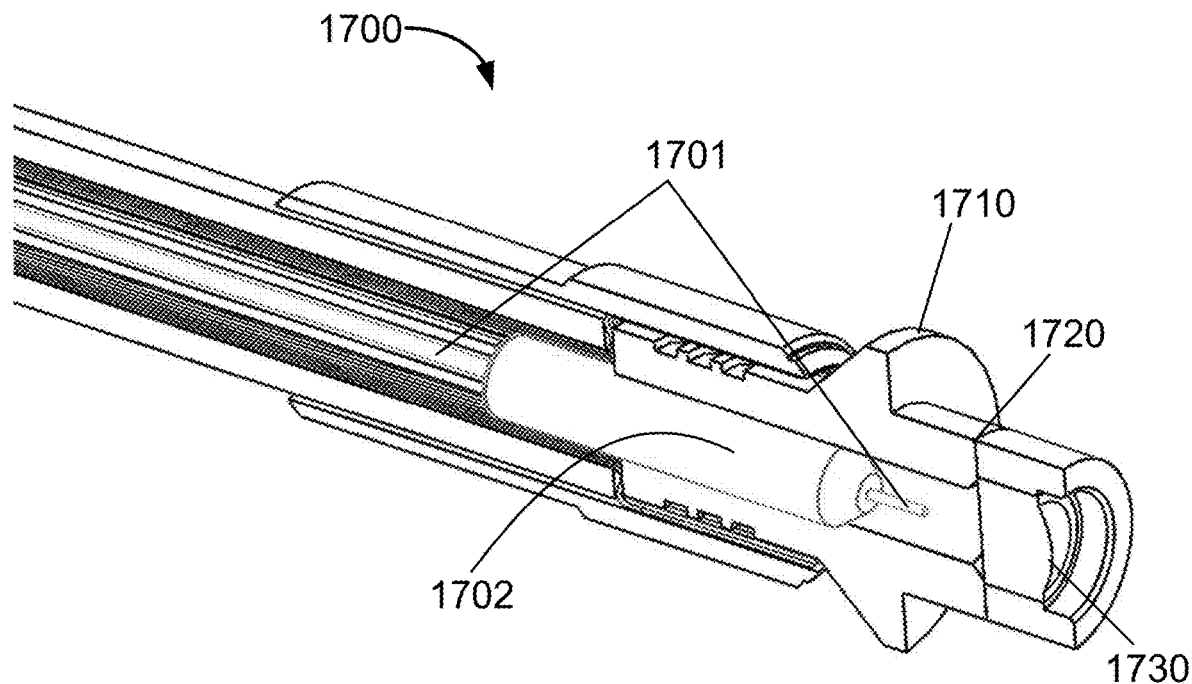
FIG. 17 is a partial cross-sectional view of an end section of a fiber assembly according to an embodiment of the present invention.

FIG. 17 is a partial cross-sectional view of an end section of a fiber assembly according to an embodiment of the present invention. This diagram is merely an example, which should not unduly limit the scope of the claims. One of ordinary skill in the art would recognize many variations, alternatives, and modifications. As shown, in an embodiment, the end section of the fiber assembly 1700 is supposed to be coupled with the laser module 1800 (see FIG. 15). An optical fiber 1701 is embedded in the fiber assembly 1700. Optionally, the optical fiber 1701 is comprised of a single mode fiber (SMF) or a multi-mode fiber (MMF), with core diameters ranging from about 1 um to 10 um, about 10 um to 50 um, about 50 um to 150 um, about 150 um to 500 um, about 500 um to 1 mm, or greater than 1 mm. The optical core material may consist of a glass such as silica glass wherein the silica glass could be doped with various constituents and have a predetermined level of hydroxyl groups (OH) for an optimized propagation loss characteristic. The glass fiber material may also be comprised of a fluoride glass, a phosphate glass, or a chalcogenide glass. In an alternative embodiment, a plastic optical fiber is used to transport the laser pump light. Optionally, most part of the optical fiber in a middle section of the fiber assembly 1700 is protected by a fiber jacket. FIG. 17 shows that an end section of the fiber assembly in a ferrule 1702 is terminated in a fiber termination adaptor 1710. Optionally, the ferrule 1702 can be made by glass, or ceramic material, or metal material. Referring to FIG. 15 and FIG. 17, the fiber termination adaptor 1710 is coupled with an output port by laser welding. In a specific embodiment, the fiber termination adaptor 1710 includes a precision circular rim made for laser welded at its perimeter with an inner diameter of a hole in a side wall of the laser module sub-package 1800 (see FIG. 15) for hermetical sealing. The fiber termination adaptor 1710 further has its end face 1720 being laser welded with a lens which essentially the focus lens 1870 (see FIG. 15) for hermetic sealing. Optionally, the focus lens 1730 (FIG. 17) is also hermetically sealed around its perimeter in the lens structure 1860 (FIG. 15). Optionally, during the fiber coupling process, an active alignment process is performed to simultaneously align a focus lens 1730 (or 1860 in FIG. 15) to the fiber core 1701 such that the maximum amount of radiated power emitting from the laser diode through the focus lens 1730 is focused into the fiber 1701. Both the focus lens 1730 and fiber 1701 must be manipulated in the X, Y, Z linear direction within micron precision. In addition, the angular rotation of each axis must also be controlled during the alignment procedure. At the same time, the fiber assembly 1700 involving the fiber core, ferrule, fiber termination adaptor, requires a hermetically sealed assembly in addition to the good alignment between fiber and focus lens such that a coupling efficiency is kept greater than 60% or even greater than 80%.

Figure 18:
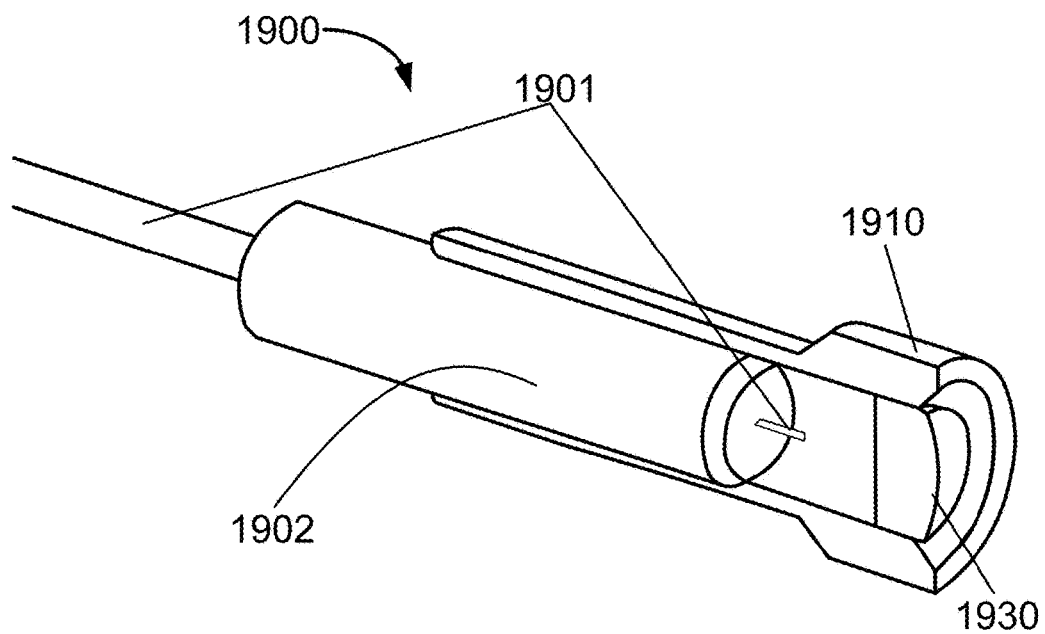
FIG. 18 is a partial cross-sectional view of an end section of a fiber assembly according to another embodiment of the present invention.

FIG. 18 is a partial cross-sectional view of an end section of a fiber assembly according to another embodiment of the present invention. This diagram is merely an example, which should not unduly limit the scope of the claims. One of ordinary skill in the art would recognize many variations, alternatives, and modifications. As shown, in an alternative embodiment, a fiber assembly 1900 includes an end section having a ferrule 1902 enclosing the optical fiber 1901 therein except a small section of fiber core. On rest part (in the middle section) of the fiber assembly 1900, the optical fiber 1901 is protected by a fiber jacket. The ferrule 1902 is capped by a fiber termination adaptor 1910. In this embodiment, the fiber termination adaptor design is made to include a lens 1930 at its very end, allowing passive alignment of several relative positions between the lens 1930 and fiber core 1901. In the embodiment, the lens 1930 can be disposed at a concentricity position via mechanical references, eliminating the X, Y motion requirement of the lens. A precision spacer (not shown) allows the Z-axis position to be passively obtained to achieve desired alignment with sufficiently high coupling efficiency. The fiber termination adaptor 1910 has a precision rim for laser welded at its perimeter with the inner diameter of a hole in the side wall of the laser module 2080 (see FIG. 16). Optionally, the fiber assembly 1900 can be actively aligned, during its welding process with the laser module 2080, to the radiated power emitting from the laser diode with relaxed requirements. For example, the precision requirement can be relaxed to tens of microns instead of limiting to micron precision.

Figure 19:
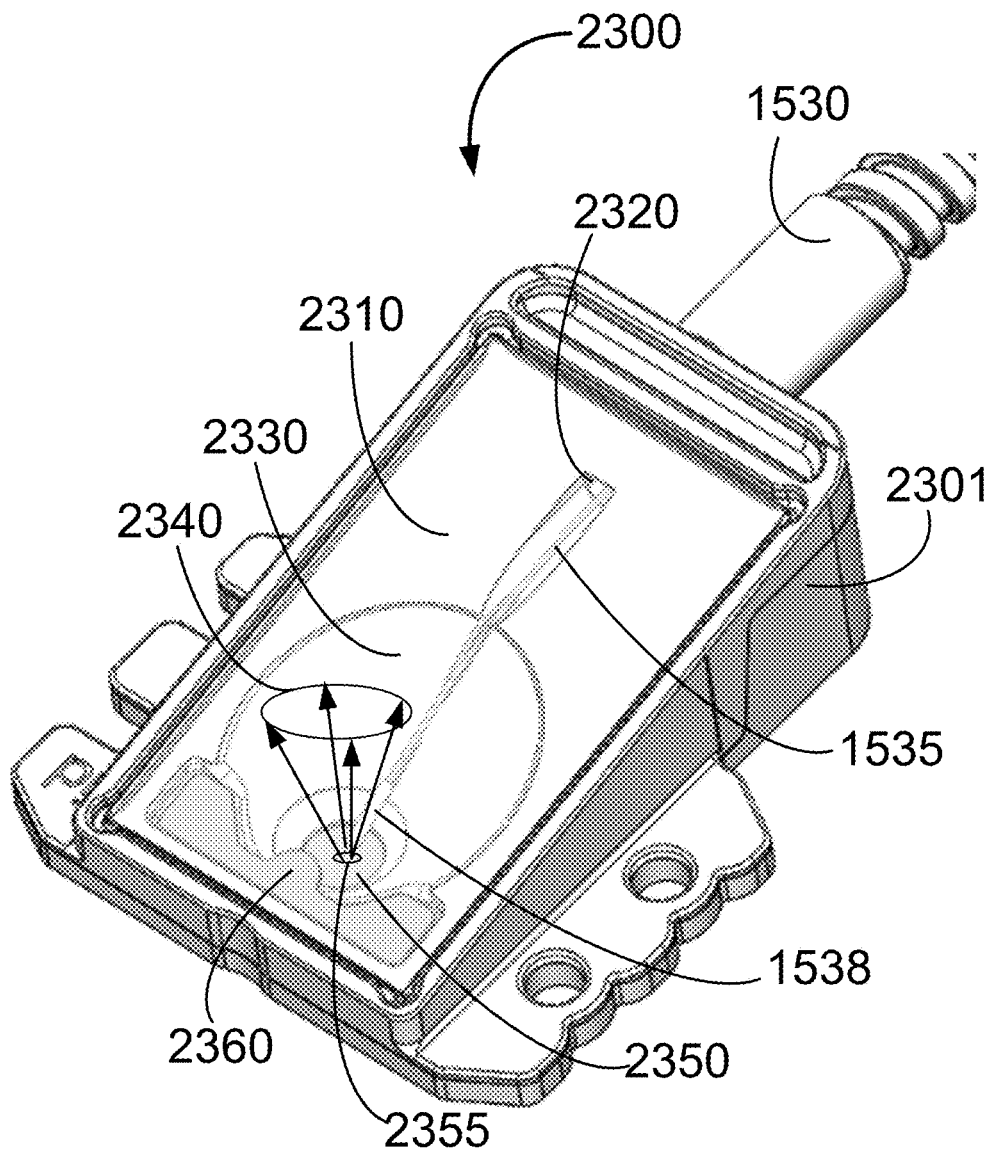
FIG. 19 is a perspective view of the light head member of FIG. 11 according to the embodiment of the present invention.

FIG. 19 is a perspective view of the light head member of FIG. 11 according to an embodiment of the present invention. This diagram is merely an example, which should not unduly limit the scope of the claims. One of ordinary skill in the art would recognize many variations, alternatives, and modifications. As shown, a perspective view of the light head member 2300 includes a semi-open metal case 2301 with a slopped body 2310. A second end of the fiber assembly 1530 is configured to have the optical fiber 1535 to pass through an input port 2320 and be bended in parallel with the slopped body 2310. The slopped body 2310 further includes a reflecting semi-cone 2330 formed at a lower part where the optical fiber 1535 ended with a fiber head 1538 for guiding the laser beam into a surface of phosphor material 2350 with an angle. Optionally, the reflecting semi-cone 2330 is coated with a highly reflective material for white light.

In the embodiment, the phosphor material 2350 is disposed at a bottom region of the reflecting semi-cone 2330. The angle of the laser beam guided by the fiber head 1538 is relative to the surface of the phosphor material 2350. Optionally, the angle of the laser beam hitting the surface of phosphor can be set in a range from 30 degrees to 35 degrees. As the laser beam with blue emission is directed from the fiber head 1538 into a small spot 2355 in the surface of the phosphor material 2350, it excited the phosphor material 2350 to convert the received blue emission to a phosphor-excited emission with a longer wavelength (for example, a violet emission). Optionally, the spot size on the surface of the phosphor material 2350 is confined within 500 μm and even down to 50 μm. A mixing of the phosphor-excited emission with the blue emission of the laser beam forms a white light beam 2340 exiting (or substantially reflected by) upwards from the reflecting semi-cone 2330.

Optionally, the phosphor material is mounted on a heatsink to conduct heat quickly away from the excited phosphor material when it is illuminated by a high-power laser emission. Optionally, a glass window material is placed overlying the slopped body and allow the white light beam to pass through to serve as a white light source. Optionally, the white light source is configured to produce substantially pure white light with strong luminance of flux in 250, 500, 1000, 3000, and 10,000 cd/mm$^2$.

Figure 20:
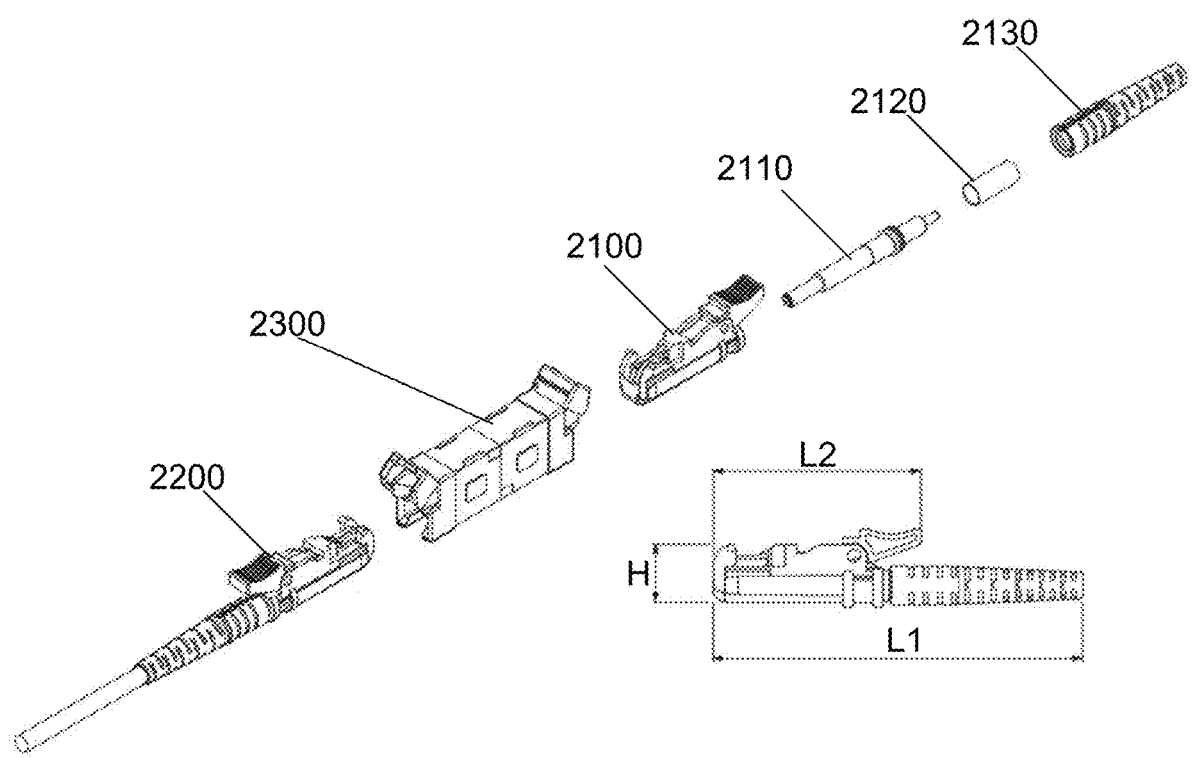
FIG. 20 shows an exemplary diagram of a fiber coupling joint made by mechanical butt coupler according to an embodiment of the present invention

In an embodiment, the fiber assembly 1530 integrated in the fiber-delivered laser induced white light system 1500 (see FIG. 11) can be made to be detachable so that applications of the system can be more flexible for maintenance. For example, a portion of failed parts can be easily replaced without disrupting the whole system. Optionally, referring to FIG. 11, the system 1500 can be provided with a detachable fiber termination adaptor (FTA) at an input port of the fiber assembly 1530 coupled with the main laser package 1510. Optionally, any place in the middle section of the fiber assembly 1530 can be selected for forming a fiber coupling joint using either mechanical fiber-to-fiber coupling mechanism or optical recoupling mechanism. FIG. 20 shows an exemplary diagram of a fiber coupling joint made by mechanical butt coupler according to an embodiment of the present invention. As shown, each of two attachable sections of the fiber assembly 1530 are respectively terminated with two connectors 2100 and 2200. Optionally, the connector 2100 is characterized by a total length L1 including a connector length L2 plus a boot 2130 and a connector size H. Each connector (2100) is coupled with the optical fiber (not explicitly shown) via a ferrule structure 2110 with one end being inserted into the connector 2100 with alignment to minimize fiber core offset, with eye-damaging prevention, and with dust protection. Another end of the ferrule is coupled first with a sleeve member 2120 before inserted into a bend-protection boot 2130. Two connectors 2100 and 2200 are mated together when they are respectively inserted into two entries of a mating adaptor 2010. The location of the coupling joint can be easily implemented into existing product.

In another embodiment, the fiber connector sets for forming the coupling joint can be made with lenses for optical recoupling. In this case, free-space optical elements are used for ensuring good optical coupling with substantially free of mechanical misalignment. Optionally, the optical-recoupling set includes window(s) for conveniently cleaning.

In yet another embodiment, referring to FIG. 11, the system 1500 can be provided with a detachable fiber termination adaptor (FTA) at an output port of the fiber assembly 1530 coupled with the light head member 1520. This option is substantially achieved like the FTA at the input port.

Figure 21:
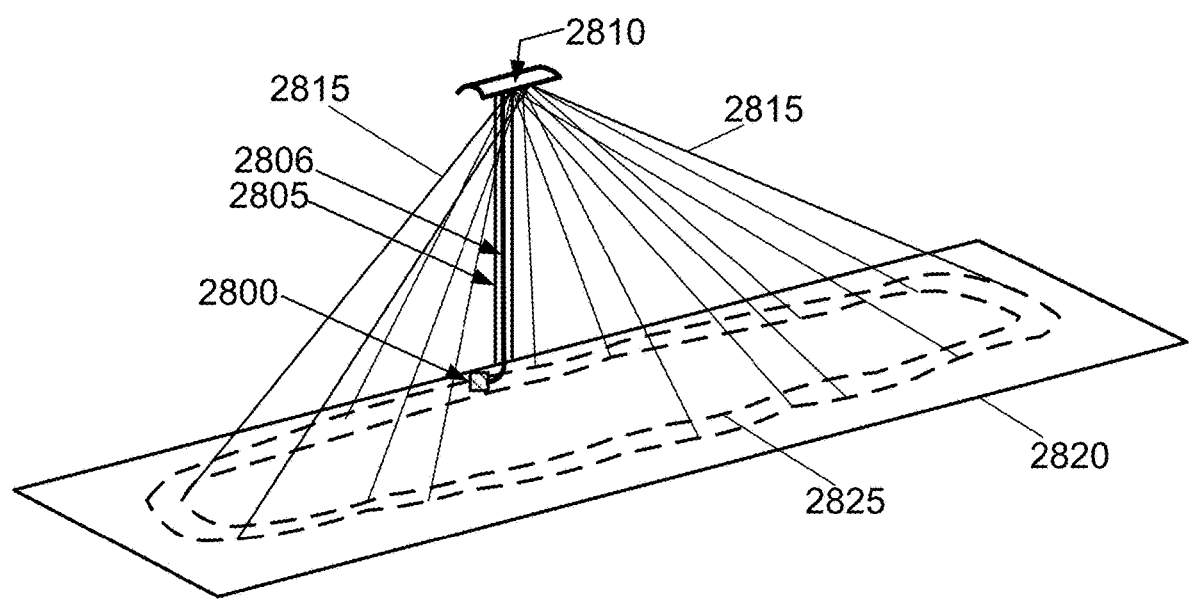
FIG. 21 is a schematic diagram of a fiber-delivered white light source for street pole light application according to an embodiment of the present invention.

FIG. 21 shows an application of a fiber-delivered white light source for street lighting according to an embodiment of the present invention. This diagram is merely an example, which should not unduly limit the scope of the claims. One of ordinary skill in the art would recognize many variations, alternatives, and modifications. As shown, the fiber-delivered white light source for street lighting includes a laser diode bank 2800 (containing one or more gallium and nitrogen containing laser diode chips) remotely disposed in a utility box or buried underground. A laser beam, substantially in blue emission in an embodiment, is delivered via an optical fiber 2806 from a bottom of a street light pole 2805 to its top where the phosphor member 2810 is set up. In the embodiment, the phosphor member 2810 is configured to receive the incident laser beam delivered by the optical fiber and generate a white light beam. Optionally, the white light beam is shaped by one or more optic elements to become wide angled beams 2815. Provided a certain height of the street light pole 2805, the wide-angled beams 2815 resulted a spread illumination region 2825 in an elongated shape along the street 2820. The wide spread angle of the illuminated region of such street light with 100× higher luminance allows 3-5× reduction in numbers of street poles for the whole street light system. Additionally, since the laser diode bank is remotely disposed on or under the ground, no lift would be needed to change the bulb. This would make replacement or maintenance cost of the light system much lower. It would also make the street light pole less expensive since it would not need to support the heavyweight of all the electronics and lights.

In an alternative embodiment, similar fiber-delivered white light source can be developed for bridge lighting wherein the laser diode bank 2800 can be disposed at two ends of the bridge on shoreline for easy access while each of all lighting elements disposed on bridge can be configured with a light head member containing a phosphor member 2810 to receive the lase electromagnetic radiation delivered by a waveguide transport element such as the optical fiber 2806 from the laser diode bank 2800. Multiple fibers can be used to respectively deliver laser from the laser diode bank 2800 to multiple different light head members. The laser delivered by the optical fiber reaches a surface of a phosphor member in each light head member to generate a phosphor emission for producing a white light emission for illumination. Optionally, optics design allows the spread illumination region 2825 corresponding to each phosphor member 2810 to be respectively configured based on the bridge dimension and curvature to achieve best illumination or decoration effects with the most economic arrangement of positions, angles, heights of the light head member containing the phosphor member 2810.

In yet another embodiment, similar white light sources can be developed for application of tunnel lighting, downhole lighting, stadium lighting, and many other special lighting applications that can take advantages of remotely delivering ultra strong visible lighting via the fiber-delivered white light source.

In some embodiments the fiber delivered white light source could be used for data transmission from the light source to devices configured to receive the signal. For example, the laser based light source could be used for Li-Fi and visible light communication (VLC) applications to transmit at high data rates of greater than 1 Gb/s, greater than 5 Gb/s, greater than 10 Gb/s. greater than 50 Gb/s, or greater than 100 Gb/s. Such high data rates enable by used of the visible light spectrum with laser diodes could enable new capability for applications such as the internet of things (TOT), smart lighting, vehicle to vehicle communication, mobile machine communication, street lighting to vehicle communication, and many more. Additionally, the fiber delivered white light sources could be applied to LIDAR applications.

While the above is a full description of the specific embodiments, various modifications, alternative constructions and equivalents may be used. As an example, the packaged device can include any combination of elements described above, as well as outside of the present specification. Although the embodiments above have been described in terms of a laser diode, the methods and device structures can also be applied to other stimulated light emitting devices. Therefore, the above description and illustrations should not be taken as limiting the scope of the present invention which is defined by the appended claims.

What is claimed is:

1. A method of using an apparatus for remotely delivering white light, the method comprising:

in the apparatus comprising:
- at least one laser diode device;
- a package member with electrical feedthroughs configured to couple power from a driver to the at least one laser diode device; the package member comprising a support member, the at least one laser diode device configured to the support member and driven by the driver to emit a beam of laser electromagnetic radiation characterized by a first wavelength ranging from 395 nm to 490 nm;
- a waveguide assembly having a first end section coupled to the package member to receive the laser electromagnetic radiation and a waveguide transport member to deliver the laser electromagnetic radiation through a length to exit a second end section with a propagation direction, a beam diameter, and a divergence;
- a phosphor member disposed in a light head member and configured with a surface to receive the laser electromagnetic radiation exited from the second end section; the phosphor member providing a wavelength conversion of at least a fraction of the laser electromagnetic radiation of the first wavelength to a phosphor emission of a second wavelength, wherein the second wavelength is longer than the first wavelength; and
- a mechanical fixture in the light head member configured to support the phosphor member and the second end section of the waveguide assembly with an angle of incidence in a range from 5 degrees to 90 degrees between the primary propagation direction of the laser electromagnetic radiation and a direction parallel to the surface of the phosphor member and to form an excitation spot of the incident laser electromagnetic radiation on the surface of the phosphor member; the excitation spot being characterized by a diameter ranging from 25 µm to 5 mm; and
- generating a substantially white light emission characterized by a mixture of the laser electromagnetic radiation of the first wavelength and the phosphor emission of the second wavelength from the excitation spot.

2. The method of claim 1, wherein the at least one laser diode device comprises multiple LD chips respectively configured as chip-on-submount forms coupled with one or more optical coupling elements to obtain a combined beam of the laser electromagnetic radiation with an aggregated output power of less than 1 W, or about 1 W to about 6 W, or about 6 W to about 12 W, or about 12 W to 30 W, or greater than 30 W.

3. The method of claim 1, wherein the waveguide transport member comprises an optical fiber, including a single mode fiber (SMF) or a multi-mode fiber (MMF), with core diameters ranging from about 1 µm to 10 µm, about 10 µm to 50 µm, about 50 µm to 150 µm, about 150 µm to 500 µm, about 500 µm to 1 mm, or greater than 1 mm.

4. The method of claim 3, wherein the optical fiber comprises a detachable joint, the detachable joint being configured with a pair of mechanical fiber connectors or free-space optical couplers.

5. The method of claim 1, wherein the mechanical fixture comprises a sloped body to at least support the second end section of the waveguide assembly to make the angle of incidence between the primary propagation direction of the laser electromagnetic radiation and the direction parallel the surface of the phosphor member to be one from 20 degrees to 50 degrees, or one from 30 degrees to 40 degrees.

6. The method of claim 1, wherein the excitation spot of the incident laser electromagnetic radiation exiting the second section of the waveguide assembly is formed on the surface of the phosphor member in a range from 50 µm to 500 µm.

7. The method of claim 1, wherein the at least one laser diode device comprises a chip-on-submount laser diode (LD) chip held in a sub-package, the LD chip having a gallium and nitrogen containing emitting region operating in one wavelength selected from 395 nm to 425 nm wavelength range and 425 nm to 490 nm wavelength range.

8. The method of claim 7, wherein the sub-package further comprises a collimation lens supported on a support member for collimating the beam of laser electromagnetic radiation.

9. The method of claim 8, wherein the sub-package further comprises a focus lens coupled to an output port from inside for coupling the beam of laser electromagnetic radiation with about 60% or greater efficiency.

10. The method of claim 9, wherein the sub-package further comprises a beam splitter disposed on the support member with an angle of about 45 degrees relative to a beam direction between the collimation lens and the focus lens, the beam splitter comprises a first surface reflecting a small portion of the laser beam and passing a major portion of the laser beam, and a second surface for splitting the major portion of the laser beam to a first portion guided to a first direction toward the focus lens and a second portion being directed to a second direction deviated from the first direction.

11. The method of claim 10, wherein the sub-package further comprises at least a photodiode to detect yellow spectrum for monitoring the second portion of the laser beam with the blue emission being substantially filtered or both a first photodiode characterized to detect the blue emission of the reflected small portion of the laser beam for sensing laser safety and a second photodiode characterized to detect the yellow spectrum, wherein the at least one laser diode device can be shut off if unsafe state is detected.

12. The method of claim 1, wherein the phosphor member comprises a ceramic yttrium aluminum garnet (YAG) doped with Ce or a single crystal YAG doped with Ce or a powdered YAG comprising a binder material; wherein the phosphor member has an optical conversion efficiency of greater than 50 lumen per optical watt, greater than 100 lumen per optical watt, greater than 200 lumen per optical watt, or greater than 300 lumen per optical watt.

13. The method of claim 1, wherein the package member further comprises an electronic board having a connector coupled with the electrical feedthrough and connected to multiple sockets for plugging the sub-package for providing power and control signals from the driver to the at least one laser diode device therein.

14. The method of claim 1, wherein the white light emission outputted from the light head member comprises a luminance of 100 to 500 cd/mm$^2$, 500 to 1000 cd/mm$^2$, 1000 to 2000 cd/mm$^2$, 2000 to 5000 cd/mm$^2$, and greater than 5000 cd/mm$_2$.

* * * * *